(12) United States Patent
Kobayashi et al.

(10) Patent No.: US 10,490,142 B2
(45) Date of Patent: Nov. 26, 2019

(54) SEMICONDUCTOR DEVICE, DISPLAY DEVICE, AND ELECTRONIC DEVICE

(71) Applicant: Semiconductor Energy Laboratory Co., Ltd., Atsugi-shi, Kanagawa-ken (JP)

(72) Inventors: Hidetomo Kobayashi, Kanagawa (JP); Roh Yamamoto, Kanagawa (JP); Kei Takahashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 338 days.

(21) Appl. No.: 15/409,834

(22) Filed: Jan. 19, 2017

(65) Prior Publication Data

US 2017/0221429 A1 Aug. 3, 2017

(30) Foreign Application Priority Data

Jan. 29, 2016 (JP) ................................ 2016-014992

(51) Int. Cl.
*G09G 3/36* (2006.01)
*H01L 29/786* (2006.01)
*H01L 29/66* (2006.01)
*G11C 27/02* (2006.01)
*H01L 27/12* (2006.01)

(52) U.S. Cl.
CPC ............. *G09G 3/36* (2013.01); *G09G 3/3688* (2013.01); *G11C 27/024* (2013.01); *H01L 27/1225* (2013.01); *H01L 29/66969* (2013.01); *H01L 29/7869* (2013.01); *H01L 29/78648* (2013.01); *H01L 29/78696* (2013.01); *G09G 2310/0291* (2013.01); *G09G 2310/0294* (2013.01)

(58) Field of Classification Search
CPC ............. G09G 3/36; G09G 2310/0294; G09G 2330/021; G11C 27/02; H01L 27/1207; H01L 29/66969; H01L 29/7869; H05K 5/0017
See application file for complete search history.

(56) References Cited

U.S. PATENT DOCUMENTS 5,001,539 A 3/1991 Inoue et al.
5,739,816 A * 4/1998 Kobayashi ........... G09G 3/3648
345/101

(Continued)

*Primary Examiner* — Lunyi Lao
*Assistant Examiner* — Jarurat Suteerawongsa
(74) *Attorney, Agent, or Firm* — Fish & Richardson P.C.

(57) ABSTRACT

Objects are to provide a semiconductor device with a novel structure, to provide a semiconductor device with low power consumption, and to provide a semiconductor device with a small chip area. A digital-analog converter and a frame memory are included. The frame memory includes a sample-and-hold circuit, a correction circuit, and a source follower circuit. The sample-and-hold circuit retains the analog voltage output from the digital-analog converter. The correction circuit corrects the analog voltage retained in the sample-and-hold circuit. The source-follower circuit outputs the corrected analog voltage. The sample-and-hold-circuit, the correction circuit, and the source follower circuit each comprise a first transistor. The first transistor comprises an oxide semiconductor layer in a semiconductor layer.

14 Claims, 38 Drawing Sheets

(56) References Cited

U.S. PATENT DOCUMENTS

| | | | |
|---|---|---|---|
| 5,744,986 A * | 4/1998 | Yamada | G09G 3/3688 327/93 |
| 6,160,534 A * | 12/2000 | Katakura | G09G 3/2011 345/100 |
| 6,628,261 B1 * | 9/2003 | Sato | G09G 3/3685 345/100 |
| 7,859,510 B2 | 12/2010 | Umezaki | |
| 8,400,817 B2 | 3/2013 | Yamazaki et al. | |
| 8,411,480 B2 | 4/2013 | Nagatsuka et al. | |
| 8,472,231 B2 | 6/2013 | Takemura | |
| 8,634,228 B2 | 1/2014 | Matsuzaki et al. | |
| 9,508,276 B2 | 11/2016 | Hirakata et al. | |
| 2004/0125681 A1 | 7/2004 | Yamaoka et al. | |
| 2006/0114210 A1 | 6/2006 | Chen et al. | |
| 2007/0008776 A1 | 1/2007 | Scheuerlein | |
| 2008/0037358 A1 | 2/2008 | Yabuuchi et al. | |
| 2008/0186266 A1 | 8/2008 | Takahashi | |
| 2010/0254179 A1 | 10/2010 | Kim | |
| 2011/0121286 A1 | 5/2011 | Yamazaki et al. | |
| 2011/0128777 A1 | 6/2011 | Yamazaki et al. | |
| 2011/0157254 A1 | 6/2011 | Yamazaki et al. | |
| 2014/0312346 A1 * | 10/2014 | Yamazaki | H01L 21/8221 257/43 |
| 2018/0174647 A1 | 6/2018 | Takahashi et al. | |

\* cited by examiner

SEMICONDUCTOR DEVICE, DISPLAY DEVICE, AND ELECTRONIC DEVICE

BACKGROUND OF THE INVENTION

1. Field of the Invention

One embodiment of the present invention relates to a semiconductor device, a display panel, and an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

A source driver integrated circuit (IC) in which a frame memory and a source driver are included (for example, see Patent Document 1) has been known. Static random access memory (SRAM) is generally used for the frame memory.

REFERENCE

Patent Document

[Patent Document 1] United States Published Patent Application No. 2008/0186266

SUMMARY OF THE INVENTION

By including the frame memory in the source driver IC, transmitting/receiving data to/from a host can be reduced and thus the source driver IC can reduce power consumption. However, data stored in SRAM is digital data. Therefore, the source driver IC cannot reduce the power consumed by converting digital data to analog data.

Furthermore, as the number of pixels increases, the amount of data retained in SRAM also increases. To deal with the increase in the amount of data, miniaturization of transistors that constitute SRAM has progressed to reduce the cell areas. However, transistor miniaturization causes the increase in leakage current. As a result, power consumption is increased in a source driver IC embedded with a frame memory using SRAM.

Furthermore, SRAM has a large number of transistors and a large cell area. Therefore, the source driver IC including the frame memory with the use of SRAM causes problems such as an increase in a chip area.

In view of the above, an object of one embodiment of the present invention is to provide a novel semiconductor device that has a structure different from that of an existing semiconductor device functioning as a source driver IC, a novel display panel, and a novel electronic device. Another object of one embodiment of the present invention is to provide a semiconductor device or the like with a novel structure, in which power consumption is reduced. Alternatively, an object of one embodiment of the present invention is to provide a semiconductor device or the like with a novel structure in which a chip area is reduced.

Note that the objects of one embodiment of the present invention are not limited to the above objects. The objects described above do not disturb the existence of other objects. The other objects are objects that are not described above and will be described below. The other objects will be apparent from and can be derived from the description of the specification, the drawings, and the like by those skilled in the art. One embodiment of the present invention is to achieve at least one of the aforementioned objects and the other objects.

One embodiment of the present invention is a digital-analog converter and a frame memory. The frame memory includes a sample-and-hold circuit, a correction circuit, and a source follower circuit. The correction circuit is configured to correct the analog voltage retained in the sample-and-hold circuit. The source follower is configured to output the corrected analog voltage. The sample-and-hold-circuit, the correction circuit, and the source follower circuit each include a first transistor. The first transistor includes an oxide semiconductor layer in the semiconductor layer.

One embodiment of the present invention is a digital-analog converter, a frame memory, and a buffer circuit. The frame memory includes a sample-and-hold circuit, a correction circuit, and a source follower circuit. The correction circuit is configured to correct the analog voltage retained in the sample-and-hold circuit. The source follower is configured to output the corrected analog voltage to the buffer circuit. The sample-and-hold-circuit, the correction circuit, and the source follower circuit each include a first transistor. The first transistor includes an oxide semiconductor layer in the semiconductor layer.

One embodiment of the present invention is a digital-analog converter, a frame memory, and a buffer circuit. The frame memory includes a sample-and-hold circuit, a correction circuit, and a source follower circuit. The correction circuit is configured to correct the analog voltage retained in the sample-and-hold circuit. The source follower is configured to output the corrected analog voltage to the buffer circuit. The sample-and-hold-circuit, the correction circuit, and the source follower circuit each include a first transistor. Each of the digital analog converter and the buffer circuit includes a second transistor. The first transistor includes an oxide semiconductor layer in the semiconductor layer. The second transistor includes silicon in the semiconductor layer.

In the semiconductor device of one embodiment of the present invention, a layer including the first transistor is preferably placed above a layer including the second transistor.

Note that other embodiments of the present invention will be described in the following embodiments with reference to the drawings.

One embodiment of the present invention can provide a novel semiconductor device that has a structure different from that of an existing semiconductor device functioning as a source driver IC, a novel display panel, and a novel electronic device. Another embodiment of the present invention can provide a semiconductor device or the like with a novel structure, in which power consumption is reduced. Another embodiment of the present invention can provide a semiconductor device or the like with a novel structure in which a chip area is reduced.

Note that the effects of one embodiment of the present invention are not limited to the above effects. The effects described above do not disturb the existence of other effects. The other effects are effects that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

DETAILED DESCRIPTION OF THE INVENTION

Figure 1:
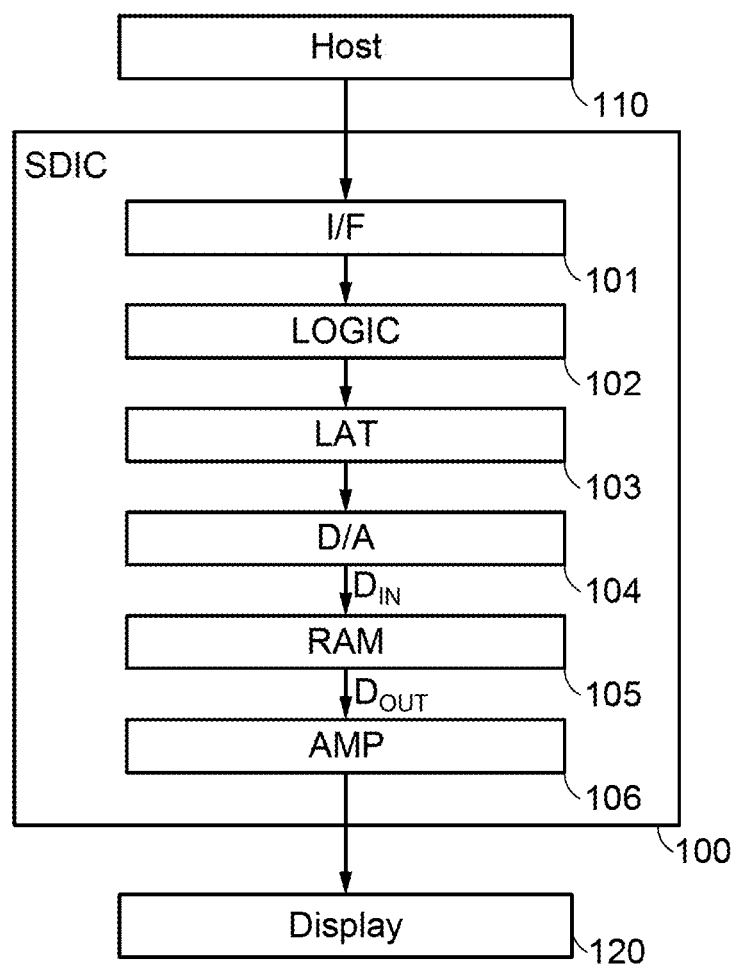
FIG. 1 illustrates an example of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Furthermore, in this specification and the like, a "first" component in one embodiment can be omitted in other embodiments or claims.

The same elements or elements having similar functions, elements formed using the same material, elements formed at the same time, or the like in the drawings are denoted by the same reference numerals in some cases, and the description thereof is not repeated in some cases.

(Embodiment 1)

In this embodiment, an example of a semiconductor device functioning as a source driver IC will be described.

FIG. 1 is an example of a block diagram that schematically illustrates a configuration of the semiconductor device.

In FIG. 1, a semiconductor device 100 (shown as SDIC) includes an interface 101 (shown as I/F), a logic circuit 102 (shown as LOGIC), a latch circuit 103 (shown as LAT), a digital-analog converter 104 (shown as D/A), a frame memory 105 (shown as RAM), and a buffer circuit 106 (shown as AMP).

In FIG. 1, a digital signal output from a host processor 110 (shown as Host) is input to the semiconductor device 100. A data signal, which is an analog signal, is output to a display device 120 (shown as Display) from the semiconductor device 100.

The interface 101 has a function of decoding the digital signal input from the host processor 110.

The logic circuit 102 has a function of arithmetically processing the digital signal, a function of distributing the digital signal to the latch circuit 103 by a shift register, or the like.

The latch circuit 103 has a function of retaining the digital signal, which is an image signal to be output to pixels of the display device.

The digital-analog converter 104 has a function of converting the digital signal into an analog signal and outputting the analog signal. The analog signal is an input signal $D_{IN}$ of the frame memory 105.

The buffer circuit 106 has a function of increasing the current supply capability of the input analog signal and outputting the resulting signal. The analog signal input to the buffer circuit 106 is an output signal $D_{OUT}$ of the frame memory 105. The analog signal whose current supply capability is improved in the buffer circuit 106 is output to the display device 120.

The frame memory 105 has a function of retaining the input signal $D_{IN}$, which is an analog signal. The frame memory 105 has a function of outputting the retained analog signal as the output signal $D_{OUT}$ to the buffer circuit 106.

A memory cell included in the frame memory 105 includes a transistor including an oxide semiconductor in a channel formation region (hereinafter, such a transistor is referred to as an OS transistor). The OS transistor has a low off-state current which flows in an off state. Therefore, the frame memory 105 including the OS transistor can retain charge corresponding to the analog signal. Furthermore, the analog signal corresponding to the charge can be output.

Figure 2:
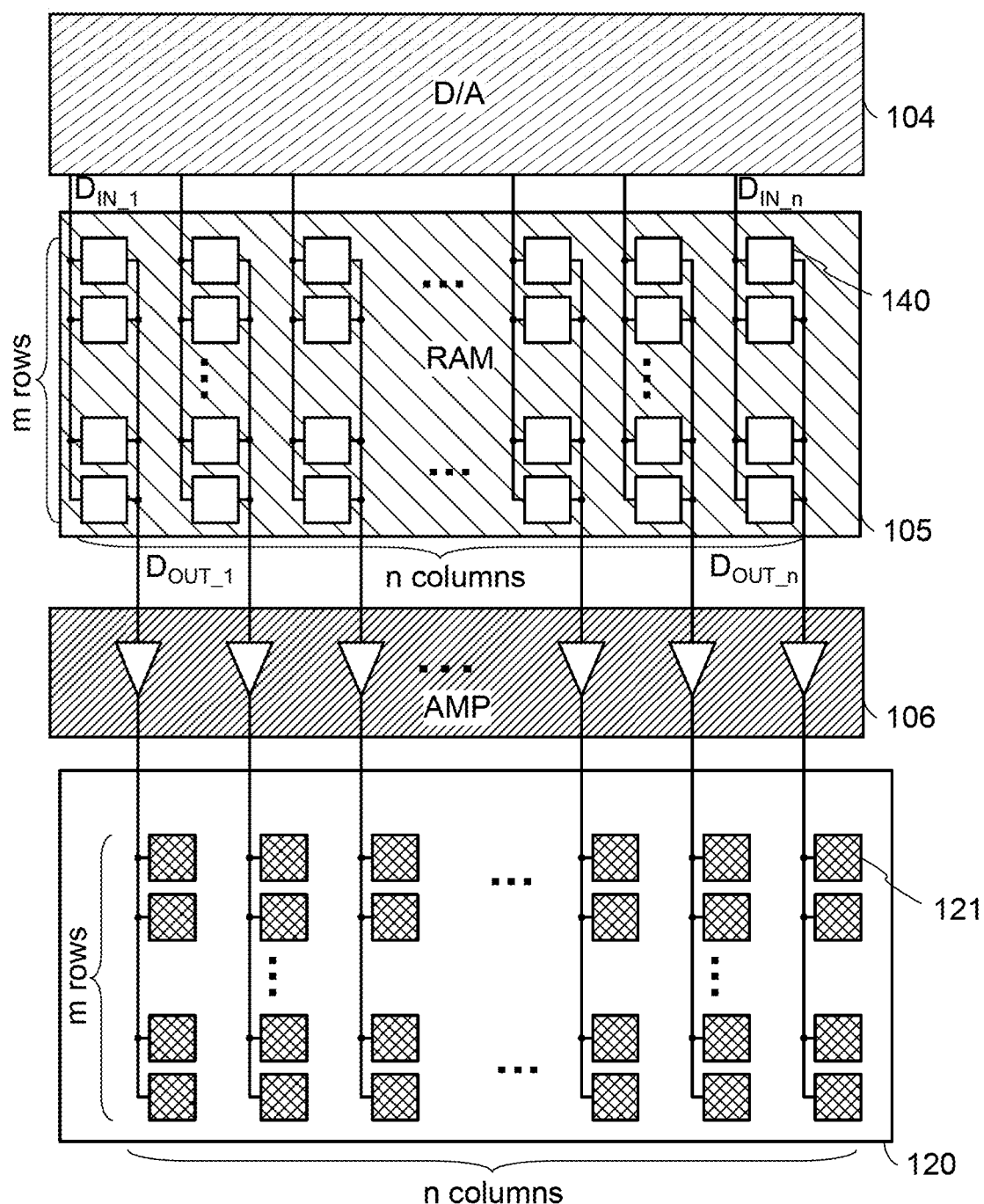
FIG. 2 illustrates an example of a semiconductor device.

FIG. 2 is a block diagram of the digital-analog converter 104, the frame memory 105, and the buffer circuit 106 of the semiconductor device 100, and the display device 120 in FIG. 1.

In FIG. 2, the display device 120 includes a plurality of pixels 121. FIG. 2 shows an example of the pixels 121 arranged in m rows and n columns (m and n are natural numbers).

In FIG. 2, the frame memory 105 includes a plurality of memory cells 140. FIG. 2 shows an example of the memory cells 140 arranged in m rows and n columns (m and n are natural numbers). Note that the number of the memory cells 140 is the same as that of the pixels 121.

Note that it is effective to arrange a greater number of the memory cells 140 than the number of the pixels 121. With this structure, an analog signal corresponding to a data signal supplied to each pixel can be retained in the frame memory 105.

In the frame memory 105 in FIG. 2, input signals $D_{IN\_1}$ to $D_{IN\_n}$, which are output signals of the digital-analog converter 104, are input to the respective lines. In the frame memory 105 in FIG. 2, output signals $D_{OUT\_1}$ to $D_{OUT\_n}$, which are input signals of the buffer circuit 106, are output to the respective lines of the display device 120.

The digital-analog converter 104 and the buffer circuit 106 in FIG. 2 are required to operate at high speed. Thus, a transistor including silicon in a channel formation region (hereinafter, a Si transistor) is preferably included in a channel formation region. In contrast, the frame memory 105 illustrated in FIG. 2, as described above, includes the OS transistor to retain charge corresponding to the analog signal.

Figure 3:
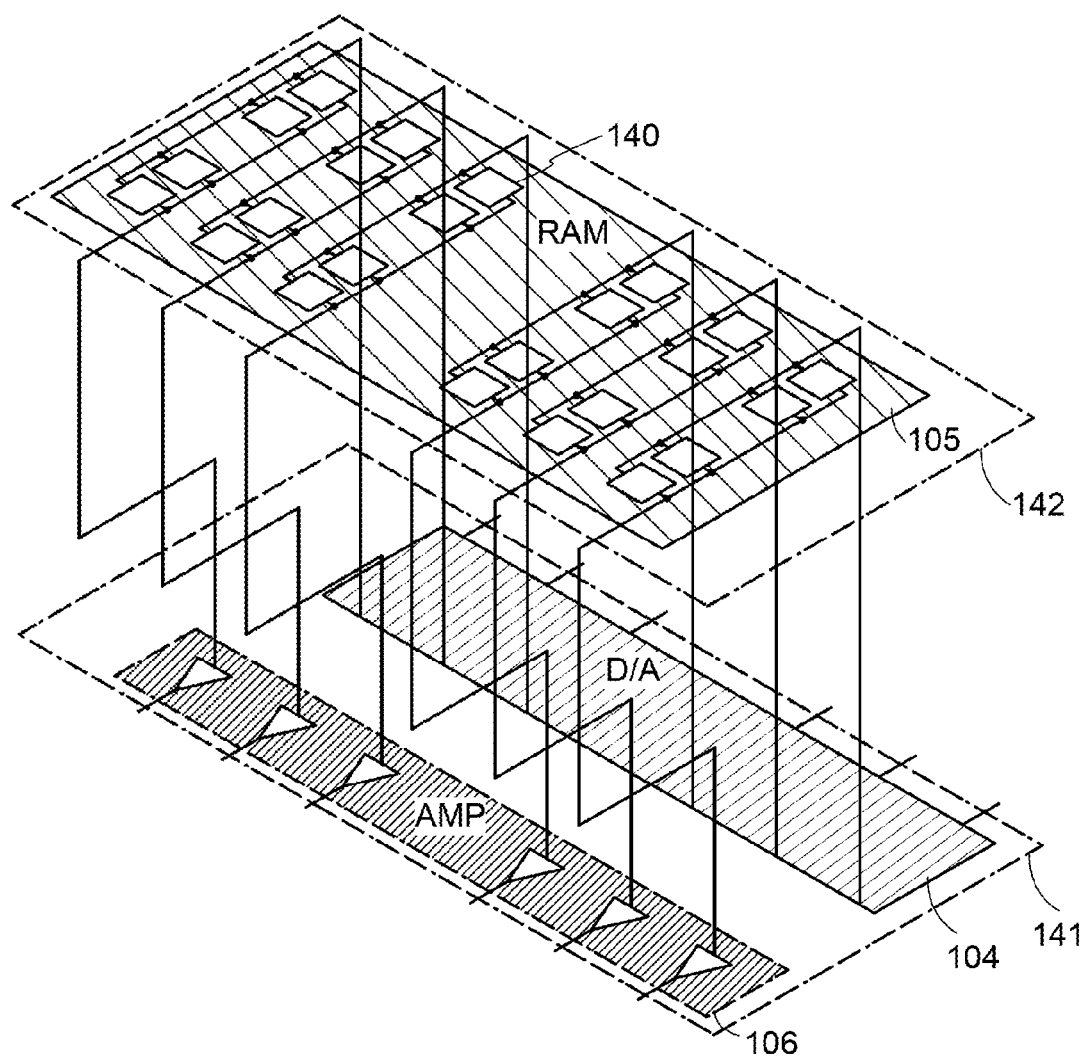
FIG. 3 illustrates an example of a semiconductor device.

Therefore, it is possible that the digital-analog converter 104 and the buffer circuit 106 are provided in a layer and the frame memory 105 is provided in another layer. FIG. 3 is a schematic block diagram of the digital-analog converter 104 and the buffer circuit 106, and the frame memory 105 provided in different layers.

As shown in FIG. 3, the digital-analog converter 104 and the buffer circuit 106 are provided in a first layer 141. Furthermore, the frame memory 105 is provided in a second layer 142, which is the upper layer of the first layer 141. With this structure, it is possible that in the semiconductor device 100, which functions as a source driver IC, the OS transistor included in the frame memory 105 is provided over the Si transistor included in a circuit other than the frame memory 105, for example, the digital-analog converter 104 and the buffer circuit 106.

It is necessary that the number of the memory cells 140 of the frame memory 105 is determined in accordance with the number of pixels 121 of the display device 120. Thus, the circuit area occupied by the frame memory 105 increases. As described above, with the structure in which the frame memory 105 including the OS transistor is provided over a circuit other than the frame memory 105, the circuit area occupied by the frame memory 105 is not increased; thus, the increase in the circuit area can be suppressed.

Figure 4:
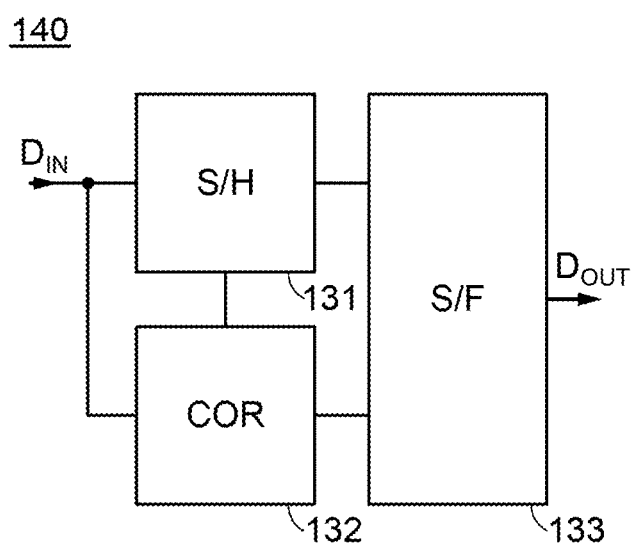
FIG. 4 illustrate an example of a semiconductor device.

FIG. 4 is a block diagram of the memory cell 140 of the frame memory 105 in FIG. 2. The memory cell 140 illustrated in FIG. 4 includes a sample-and-hold circuit 131 (shown as S/H), a correction circuit 132 (shown as COR), and a source follower circuit 133 (shown as S/F). The input signal $D_{IN}$ is supplied to the sample-and-hold circuit 131 and the correction circuit 132. The output signal $D_{OUT}$ is output from the source follower circuit 133.

Figure 5A:
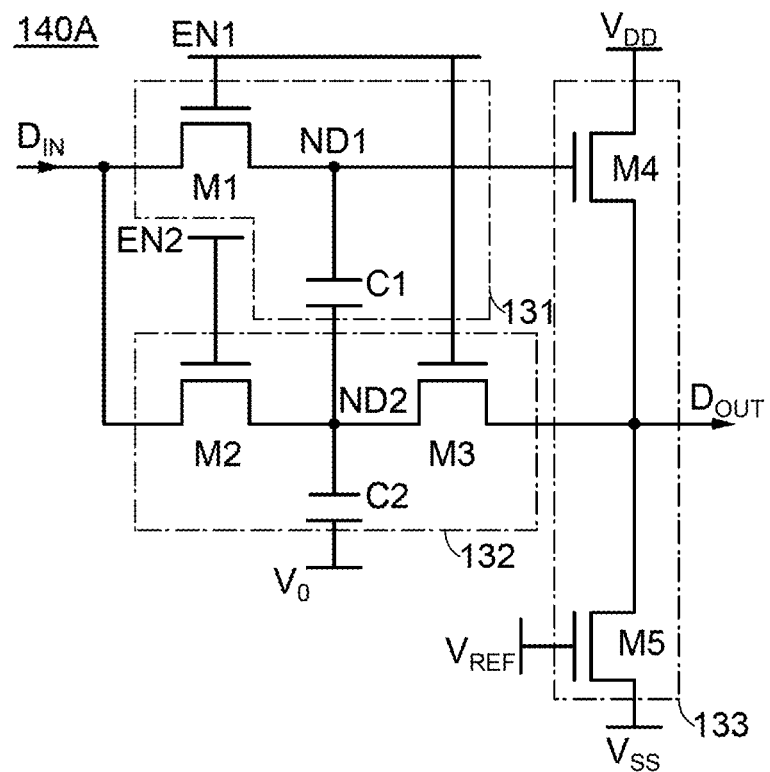
FIGS. 5A and 5B illustrate an example of a semiconductor device and an operation of the semiconductor device.

FIG. 5A shows an example of a specific circuit configuration of the memory cell 140 in FIG. 4.

A memory cell 140A illustrated in FIG. 5A includes transistors M1 to M5 and capacitors C1 and C2. All the transistors M1 to M5 are n-channel transistors in the following description. Gates of the transistors M1 and M3 are connected to a wiring for supplying a control signal EN1. A gate of the transistor M2 is connected to a wiring for supplying a control signal EN2. One electrode of the capacitor C1 is referred to as a node ND1 in FIG. 5A. One electrode of the capacitor C2 is referred to as a node ND2 in FIG. 5A. A gate of a transistor M5 is supplied with a reference voltage $V_{REF}$. A current flowing through the transistor M5 is made constant by the reference voltage $V_{REF}$. A voltage $V_{DD}$ is applied to either one of a source and a drain of the transistor M4. A voltage $V_{SS}$ is applied to either one of a source and a drain of the transistor M5. Note that the voltage $V_{DD}$ is higher than the voltage $V_{SS}$. The other electrode of the capacitor C2 is supplied with a voltage $V_0$. The voltage $V_0$ is preferably a fixed voltage, for example, a ground voltage (GND).

Figure 5B:
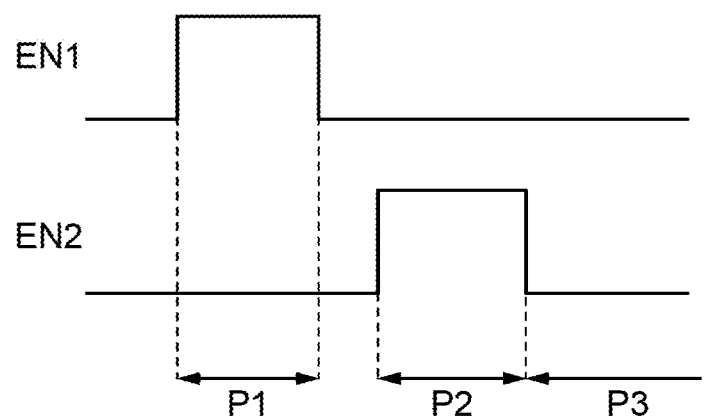
Figure 6A:
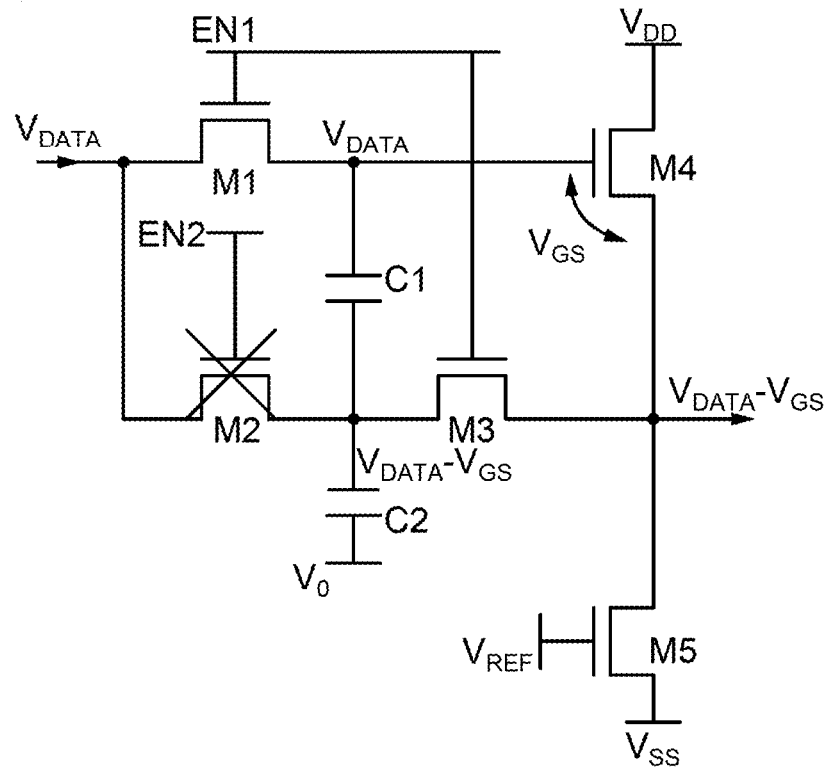
FIGS. 6A and 6B illustrate an example of an operation of a semiconductor device.
Figure 6B:
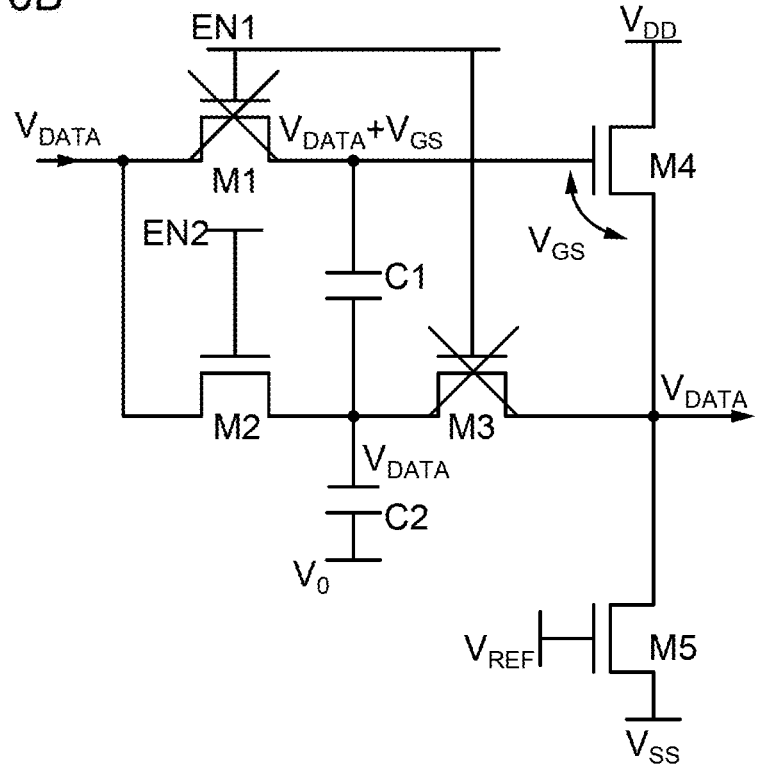
Figure 7:
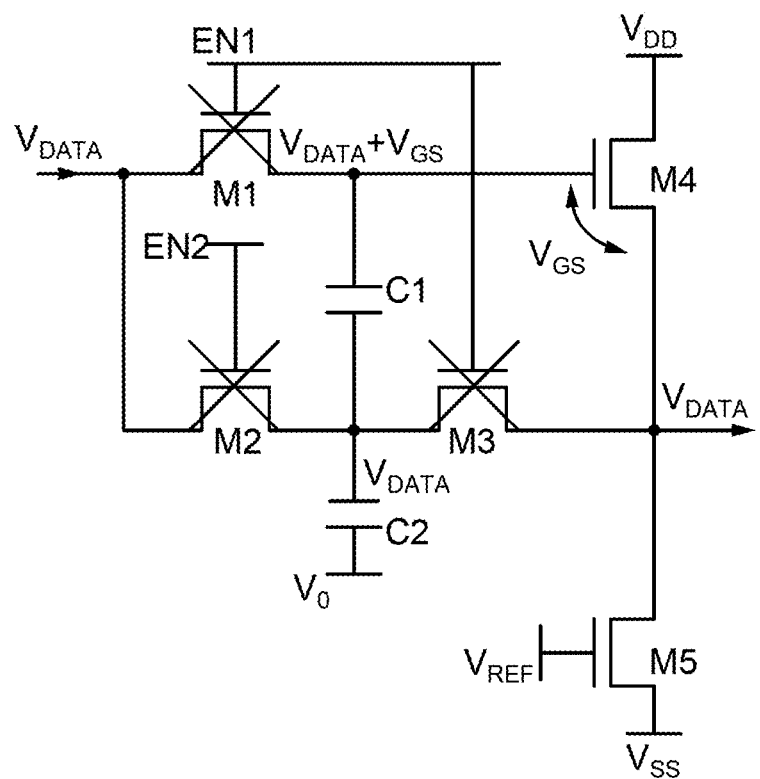
FIG. 7 illustrates an example of an operation of a semiconductor device.

FIG. 5B is a timing chart showing an operation of the circuit of FIG. 5A. FIG. 5B illustrates signal waveforms of the control signals EN1 and EN2. Furthermore, FIGS. 6A and 6B, and FIG. 7 illustrate voltage of each of the transistors M1 to M5 and the nodes ND1 and ND2 in periods P1 to P3 in the timing chart in FIG. 5B.

In the first period P1, the control signal EN1 is set at a high level and the control signal EN2 is set at a low level. Here, the states of each of the transistors are illustrated in FIG. 6A. The transistors M1 and M3 are brought into an on state. The transistor M2 is brought into an off state. Transistors in an off state are represented by a cross in FIG. 6A.

The transistor M1 is turned on, so that the voltage of the node ND1 becomes a voltage $V_{DATA}$ which is the input signal $D_{IN}$.

The current flowing in the transistor M5 flows through the transistors M4 and M5. As the voltage between a gate and a source of the transistor M4 (also referred to as a gate-source voltage), a voltage for making the above-described current flow is applied. FIG. 6A illustrates the gate-source voltage of the transistor M4 as $V_{GS}$. Here, a voltage of the output signal $D_{OUT}$ becomes $(V_{DATA}-V_{GS})$. The transistor M3 is in an on state and thus, a voltage of the node ND2 becomes $(V_{DATA}-V_{GS})$.

In the second period P2, the control signal EN1 is set at a low level and the control signal EN2 is set at a high level. Here, the states of each transistors at that time are illustrated in FIG. 6B. The transistor M2 is brought into an on state. The transistors M1 and M3 are brought into an off state. Transistors in an off state are represented by a cross in FIG. 6B.

The transistor M2 is turned on, so that the voltage of the node ND2 changes from the voltage ($V_{DATA}-V_{GS}$) to the voltage $V_{DATA}$. Here, the transistor M1 is in an off state and thus, the node ND1 is in an electrically floating state. Therefore, the voltage of the node ND1 increases in accordance with the change of the voltage of the node ND2 from the voltage ($V_{DATA}-V_{GS}$) to the voltage $V_{DATA}$. The voltage of the ND1 is increased to a voltage ($V_{DATA}+V_{GS}$) when the capacitance component of the capacitor C1 is sufficiently larger than that of the node ND1. The voltage of the output signal $D_{OUT}$ becomes a voltage $V_{DATA}$ and thus, the voltage can be corrected to a voltage $V_{DATA}$ of the input signal $D_{IN}$ because the $V_{GS}$ of the transistor M4 does not change.

In the third period P3, the control signal EN1 is kept at a low level and the control signal EN2 is set at a low level. Here, the states of each transistors at that time are illustrated in FIG. 7. The transistors M1 to M3 are brought into an off state. Transistors in an off state are represented by a cross in FIG. 7.

The transistors M1 to M3 are in an off state, so that voltages of the nodes ND1 and ND2 are retained at the voltage ($V_{DATA}+V_{GS}$) and the voltage $V_{DATA}$, respectively. The voltage of the output signal $D_{OUT}$ becomes the voltage $V_{DATA}$ and thus, the voltage corrected to the voltage $V_{DATA}$ of the input signal $D_{IN}$ can keep being output because the $V_{GS}$ of the transistor M4 does not change.

As described above, the memory cell included in the frame memory 105 includes the OS transistor. In other words, the transistors M1 to M5 are OS transistors. The OS transistor has a low off-state current which flows in an off state. Therefore, the transistors M1 to M3 are brought into an off state and thus, voltages of the node ND1 and the node ND2 can be kept at the voltage ($V_{DATA}+V_{GS}$) and the voltage $V_{DATA}$, respectively. Furthermore, the voltage $V_{DATA}$, which is an analog signal corresponding to the voltages, can be output.

Figure 8A:
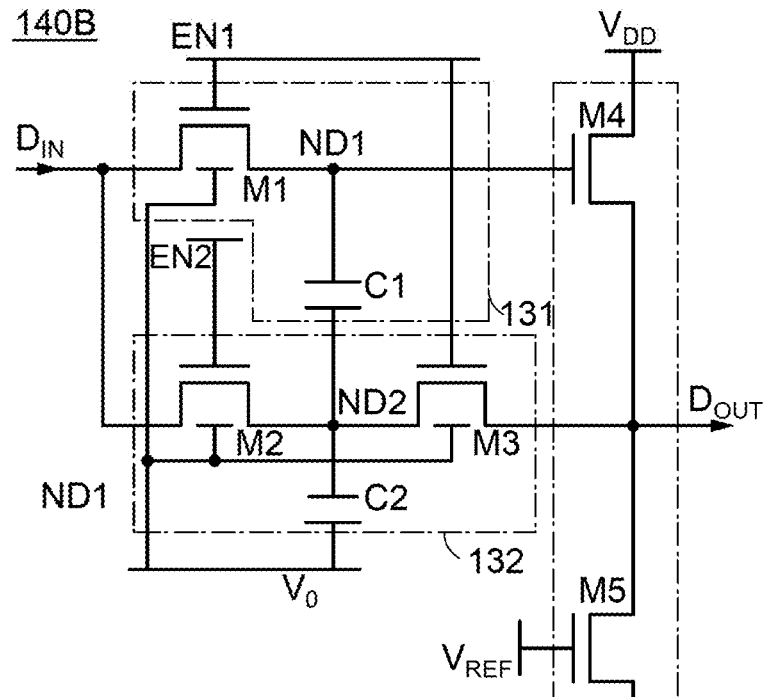
FIGS. 8A and 8B illustrate an example of a semiconductor device.

Instead of the memory cell 140A illustrated in FIG. 5A, a memory cell 140B illustrated in FIG. 8A can be used. FIG. 8A illustrates a configuration in which a backgate electrode for controlling a threshold voltage is included in each of the transistors M1 to M3, which retain the voltages of the nodes ND1 and ND2. The threshold voltage of each of the transistors M1 to M3 can be controlled by supplying a fixed voltage, for example, a voltage $V_0$ to the backgate electrode of each of the transistors M1 to M3. By controlling the threshold voltage, for example, by applying a voltage for shifting the threshold voltage in a positive direction to the backgate electrode, the off-current can more surely be reduced.

Figure 8B:
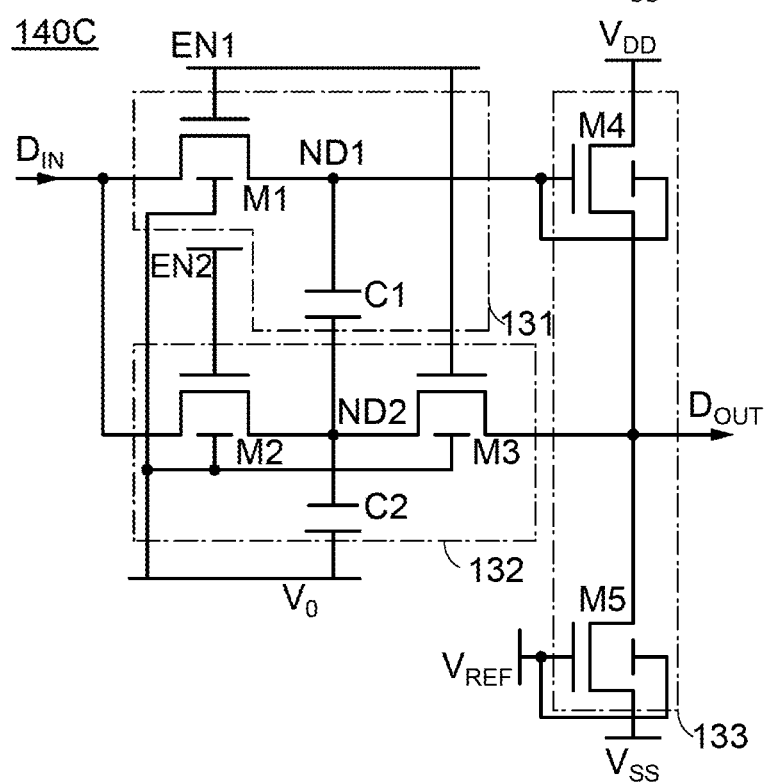

As another example, a memory cell 140C illustrated in FIG. 8B has a configuration including a backgate electrode in each of the transistors M4 and M5 supplying a constant current. By supplying the same voltages as those of the gate electrodes to the backgate electrodes of the transistors M4 and M5, electric fields are applied from both above and below the channel formation regions and thus, the amount of current flowing through the transistors M4 and M5 can be increased without increasing the size of the transistors M4 and M5.

Figure 9:
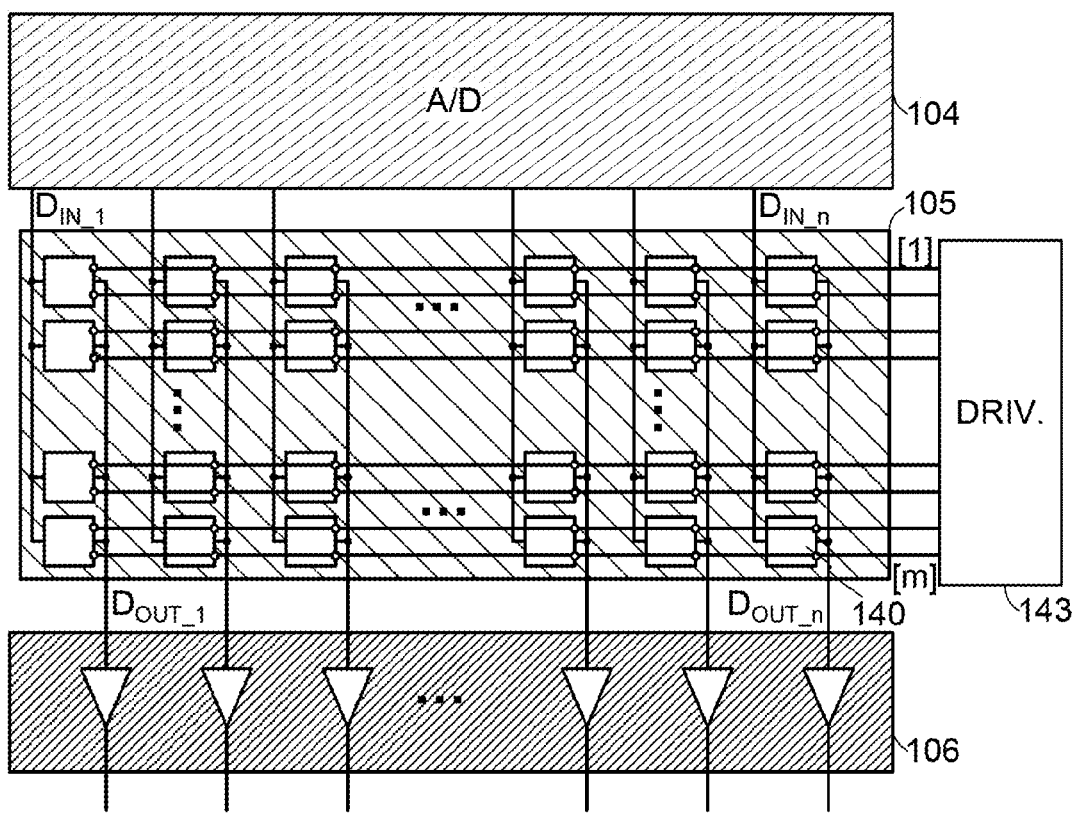
FIG. 9 illustrates an example of a semiconductor device.

FIG. 9 is a diagram formed by adding a driver circuit 143 for controlling the operation of the frame memory 105 to a block diagram of the semiconductor device 100 in FIG. 2. Note that the display device 120 is omitted in FIG. 9.

The operation of the memory cells 140 is controlled row by row from the row [1] to [m] by the driving circuit 143. The driving circuit 143 includes, for example, a shift register. Writing, retaining, and reading of the data signal can be controlled row by row by the driving circuit 143 in a manner similar to a gate driver controlling the pixels of the display device 120.

Figure 10:
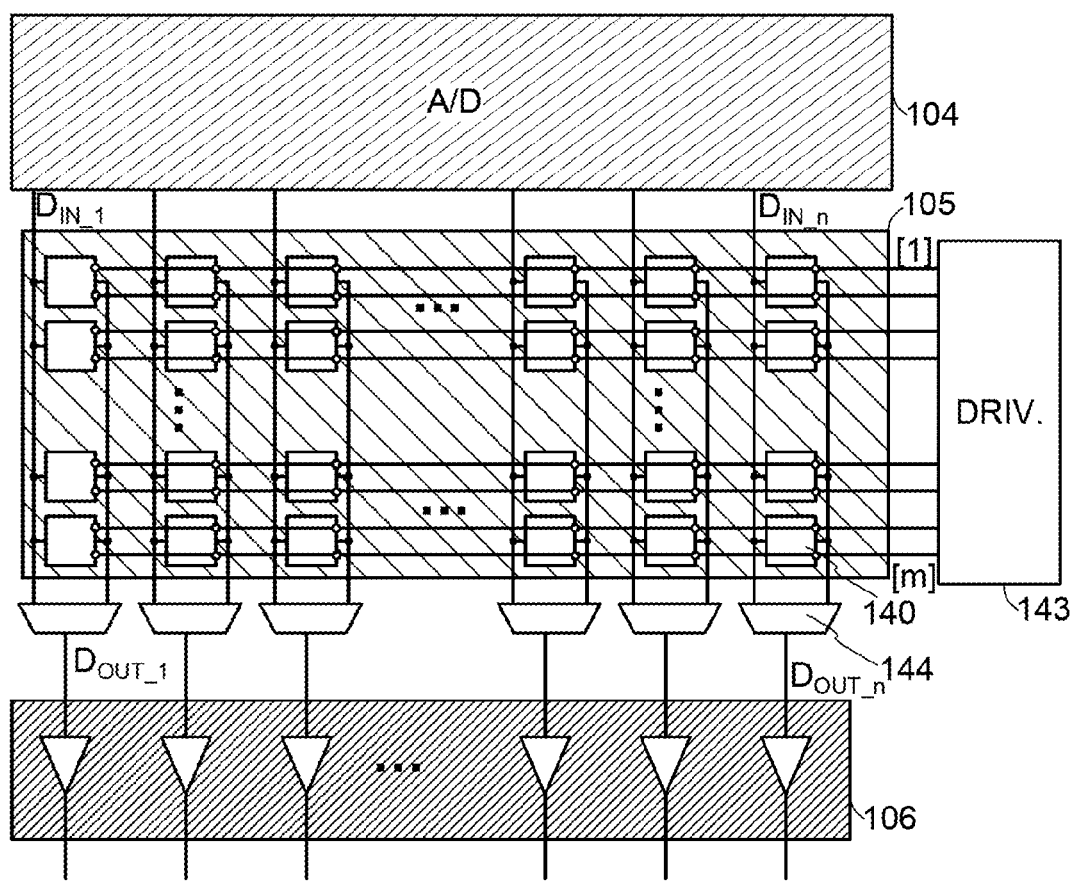
FIG. 10 illustrates an example of a semiconductor device.

The data signal output from the digital-analog converter 104 is directly output to the display device 120 in the case where the data signal retained in the frame memory 105 is different from the image displayed in the successive frames. Therefore, as illustrated in FIG. 10, switching circuits 144 are preferably provided between the frame memory 105 and the buffer circuit 106.

The switching circuits 144 perform switching such that the data signal output from the digital-analog converter 104 is output to the buffer circuit 106 in the case where images displayed are different in successive frames and the data signal output from the frame memory 105 is output to the buffer circuit 106 in the case where images displayed are the same in successive frames. Therefore, by providing the switching circuits 144, power necessary for an operation of the interface 101, the logic circuit 102, the latch circuit 103, and the digital-analog converter 104 can be reduced, which leads to a reduction in power consumption in the semiconductor device 100.

Figure 11A:
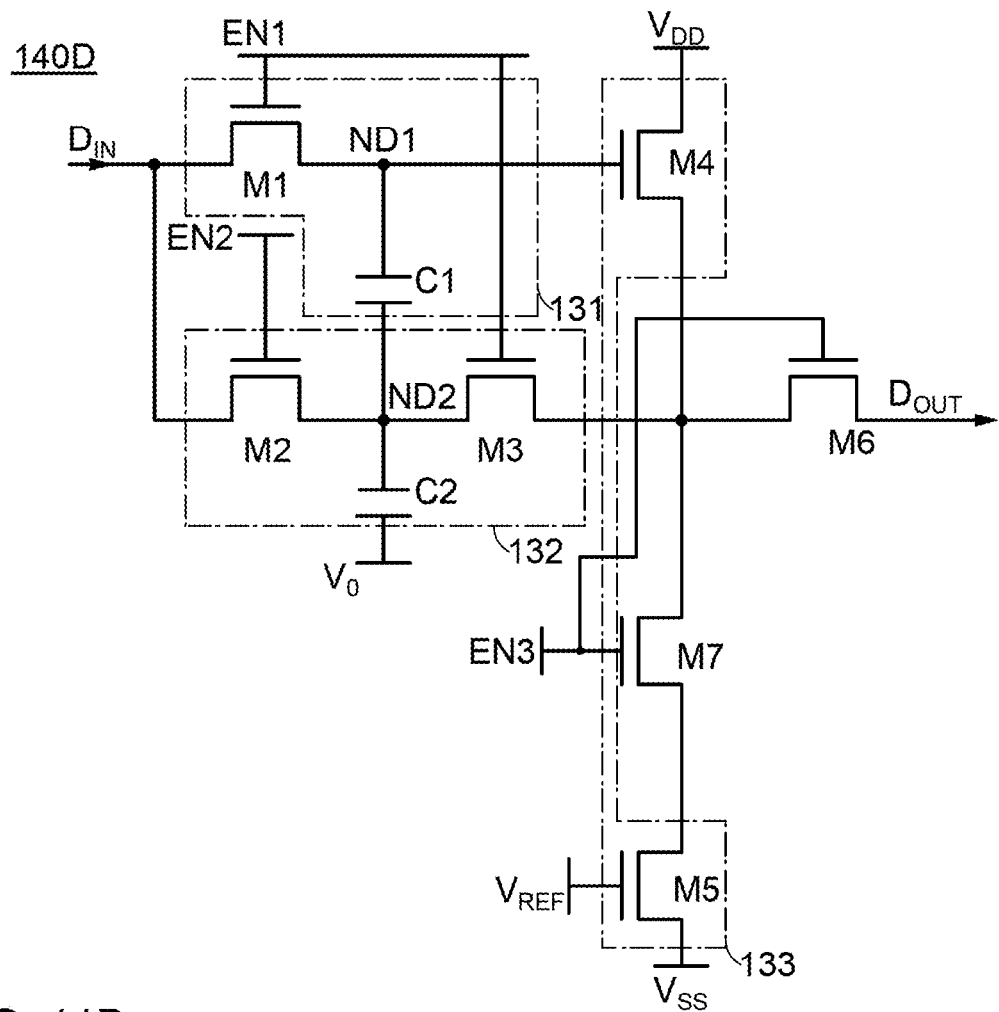
FIGS. 11A and 11B illustrate an example of a semiconductor device and an operation of the semiconductor device.

A circuit configuration of a memory cell in the case where the data signal output from the frame memory 105 is stopped is illustrated in FIG. 11A. A memory cell 140D illustrated in FIG. 11A corresponds to a configuration where transistors M6 and M7 are added to the circuit configuration of the memory cell 140A illustrated in FIG. 5A. The transistors M6 and M7 are n-channel transistors here, like the transistors M1 to M5.

Gates of the transistors M6 and M7 are connected to a wiring for supplying a control signal EN3. The transistors M6 and M7 are arranged on a path where a current of the source follower circuit 133 flows.

Figure 11B:
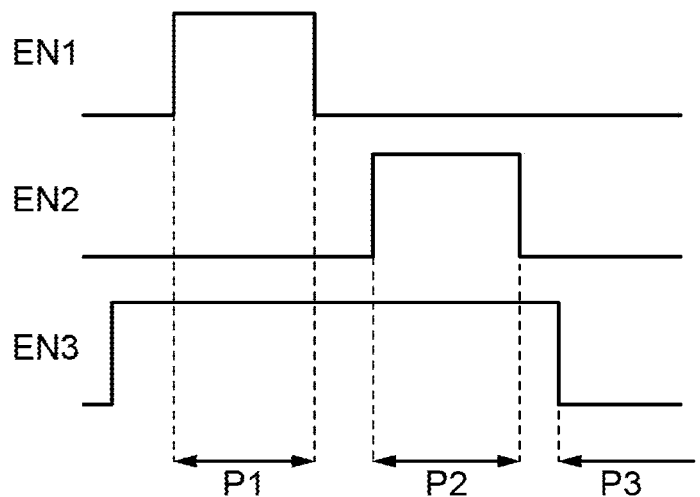

FIG. 11B is a timing chart showing an operation of the circuit of FIG. 11A. FIG. 11B illustrates signal waveforms of the control signal EN1, the control signal EN2, and the control signal EN3.

The operation in periods P1 to P3 in FIG. 11B is basically similar to the operation in FIG. 5B. Specifically, in the periods P1 and P2, the control signal EN3 is set at a high level and the same operation as the operation in FIG. 5B is performed. In the period P3 other than the periods P1 and P2, the control signal EN3 is set at a low level and the transistors M6 and M7 on the path of the source follower circuit 133 where current flows are controlled to be in an off state.

As described above, the memory cell included in the frame memory 105 includes the OS transistor. That is, the transistors M1 to M7 are OS transistors. The OS transistor has a low off-state current which flows in an off state. Therefore, the transistors M1 to M3 are brought into an off state and thus, the voltages of the node ND1 and the node ND2 may be kept at the voltage ($V_{DATA}+V_{GS}$) and the voltage $V_{DATA}$, respectively. Furthermore, the voltage $V_{DATA}$, which is an analog signal corresponding to the voltages of the node ND1 and the node ND2 can be output.

Figure 12:
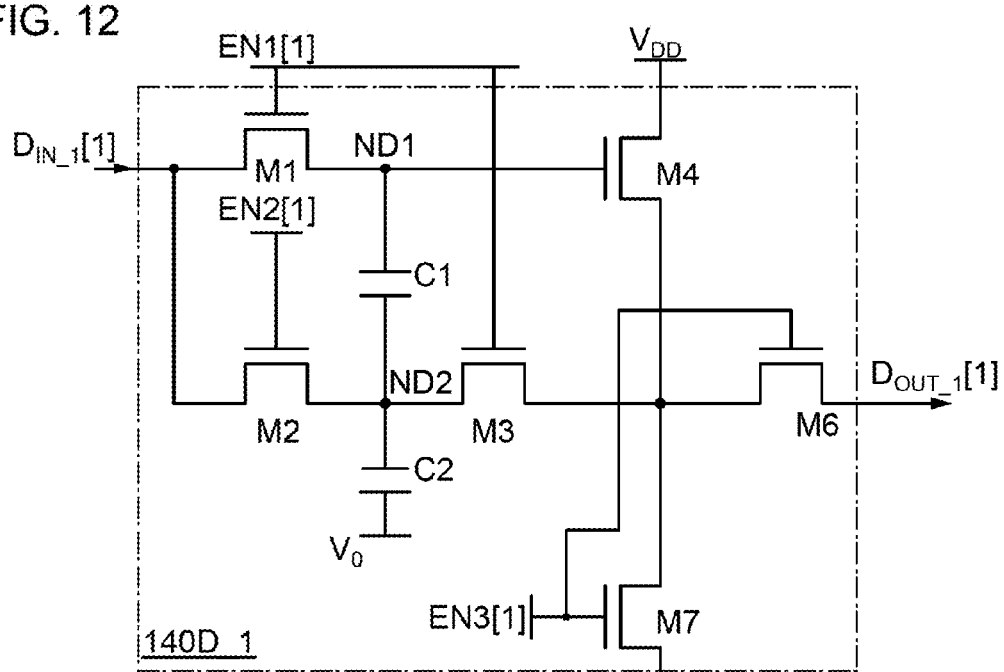
FIG. 12 illustrates an example of a semiconductor device.
Figure 12:
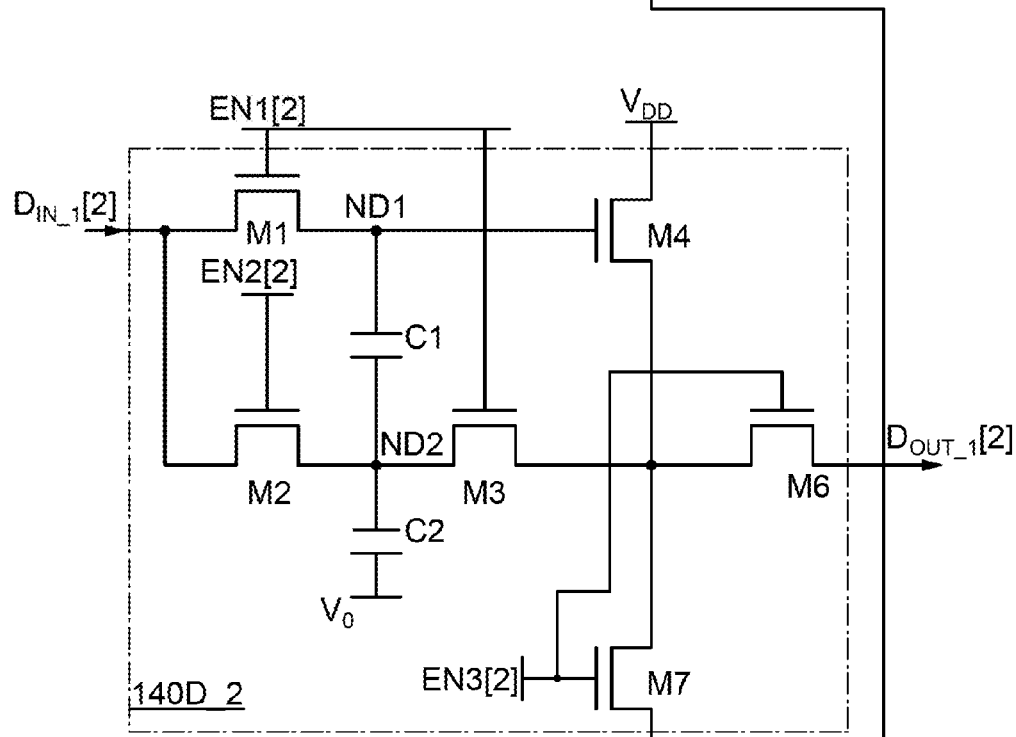
Figure 12:
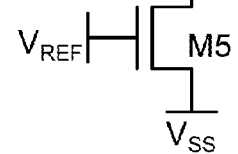

Note that the transistor M5 can be shared by the memory cells 140D in the same column, which have the configuration in FIG. 11A. FIG. 12 illustrates a circuit configuration in which the transistor M5 is shared by memory cells 140D_1 and 140D_2 in the same column.

Note that the memory cell 140D_1 receives an input signal $D_{IN\_1}[1]$ and performs retention and performs output of an output signal $D_{OUT\_1}[1]$ corresponding to the first column of the memory cell. The memory cell 140D_2 performs input and retention of an input signal $D_{IN\_1}[2]$ and output of an output signal $D_{OUT\_1}[2]$ corresponding to the second column of the memory cell. Control signals EN1[1], EN2[1], and EN3[1] are signals that control the operation of the memory cell 140D_1. Control signals EN1[2], EN2[2], and EN3[2] are signals that control the operation of the memory cell 140D_2.

Figure 13:
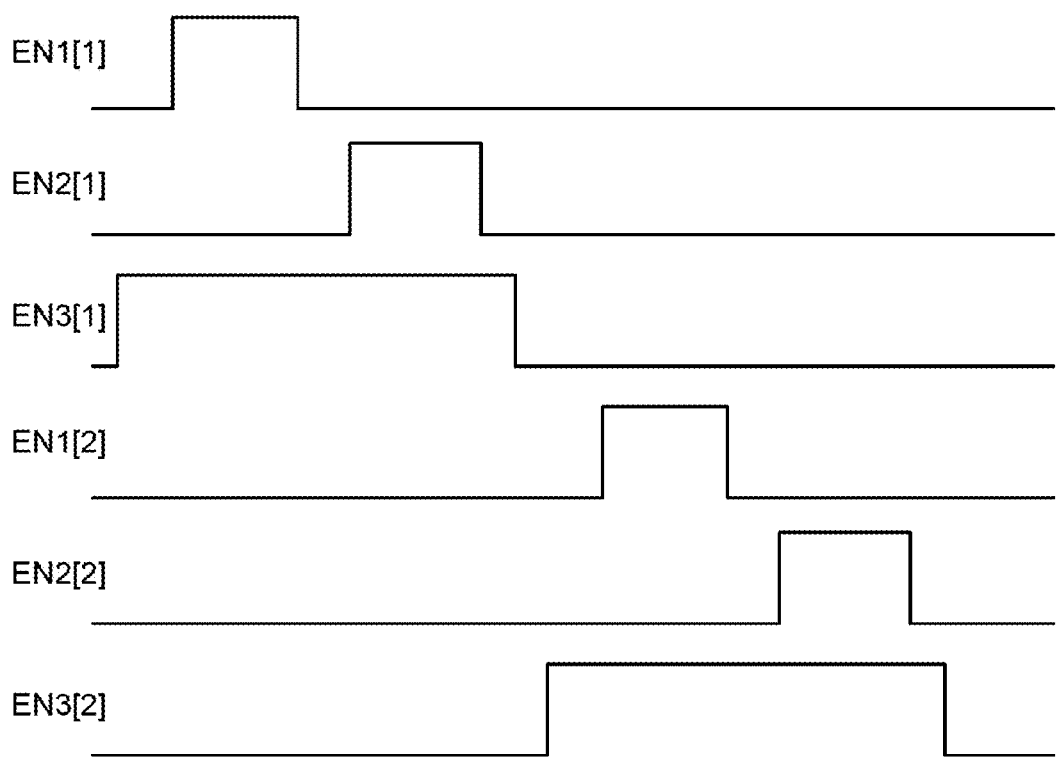
FIG. 13 illustrates an example of an operation of a semiconductor device.

FIG. 13 is a timing chart showing an operation of the circuit configuration of FIG. 11A. FIG. 13 illustrates signal waveforms of the control signals EN1[1], EN 2[1], and EN3[1] and the control signals EN1[2], EN 2[2], and EN3[2].

Figure 14A:
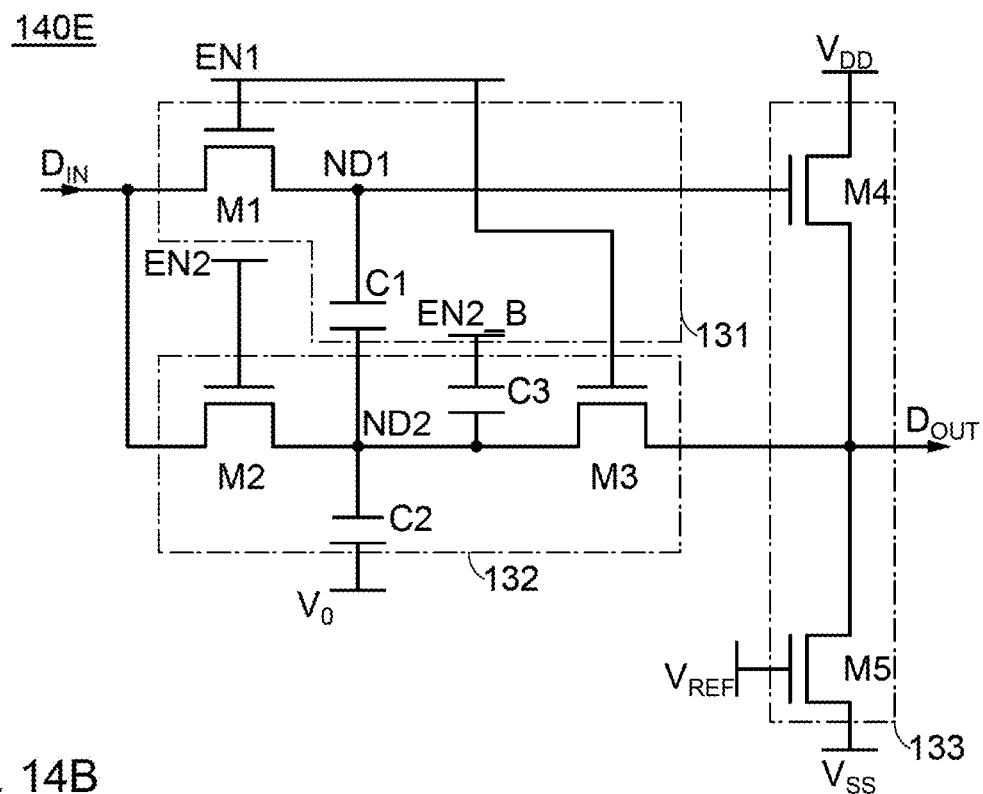
FIGS. 14A and 14B illustrate an example of a semiconductor device and an operation of the semiconductor device.

Instead of the memory cell 140A illustrated in FIG. 5A, a memory cell 140E illustrated in FIG. 14A can be used. FIG. 14A illustrates a structure in which one electrode of the capacitor C3 is connected to the node ND2. The other electrode of the capacitor C3 is connected to a wiring for supplying a control signal EN2_B. The control signal EN2_B is an inverted signal of the control signal EN2.

Figure 14B:
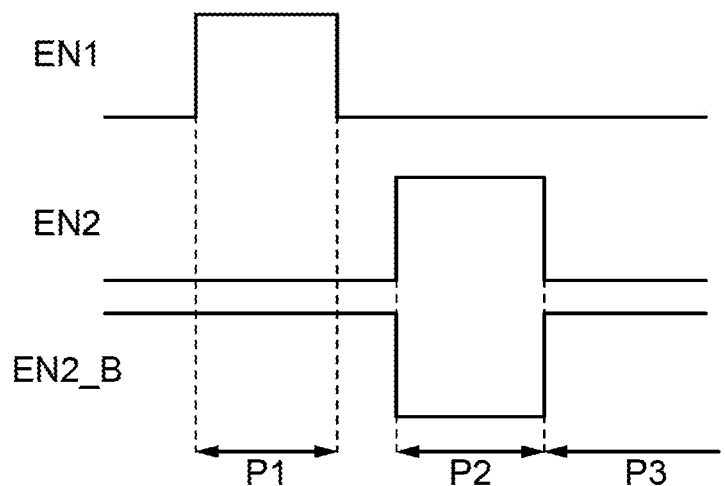

FIG. 14B is a timing chart that illustrates an operation of the circuit configuration of FIG. 14A. FIG. 14B illustrates signal waves of the control signals EN1, EN 2, and EN2_B.

The configurations illustrated in FIGS. 14A and 14B can prevent a decrease in the voltage due to parasitic capacitance of the node ND2 and the transistor M2 when the control signal EN2 is set at a low level from a high level in a second period P2. Specifically, when the control signal EN2_B is set at a high level from a low level in the second period P2, the voltage of the node ND2 is increased by the voltage decrease. Thus, the voltage of the node ND1, which is in an electrically floating state, can easily increase to the voltage (VDATA+VGS).

Figure 15:
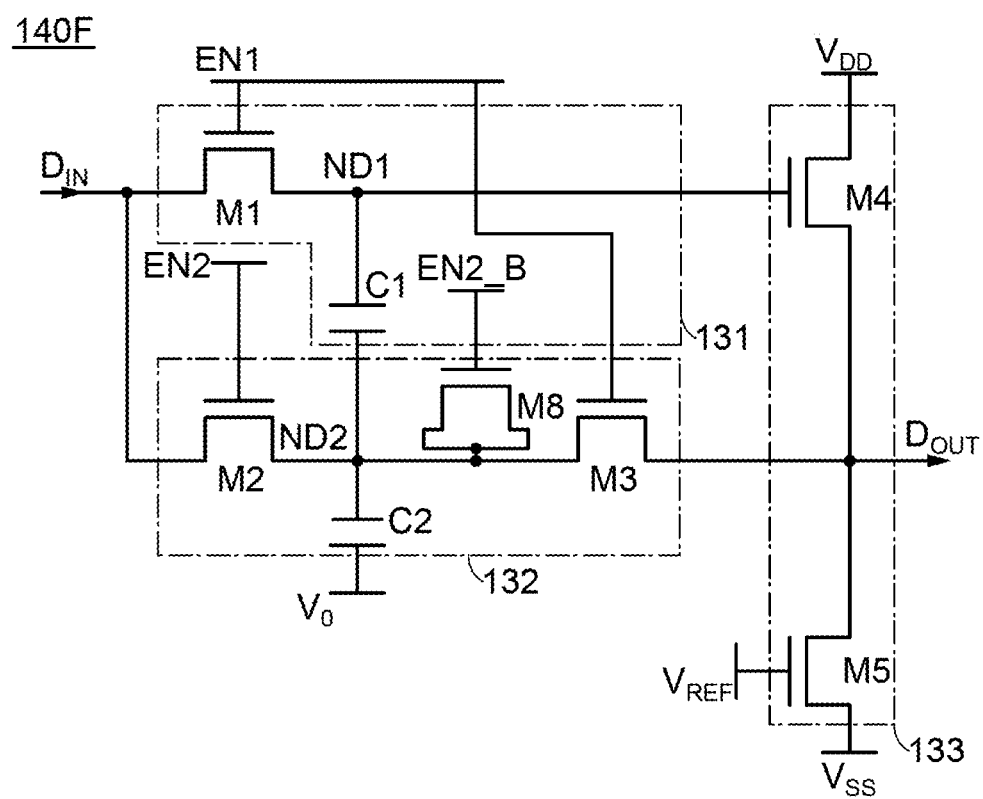
FIG. 15 illustrates an example of a semiconductor device.

As another configuration, a memory cell 140F of FIG. 15 has a gate capacitance of a transistor M8 instead of the capacitor C3 in the circuit configuration of FIG. 14A.

Figure 16:
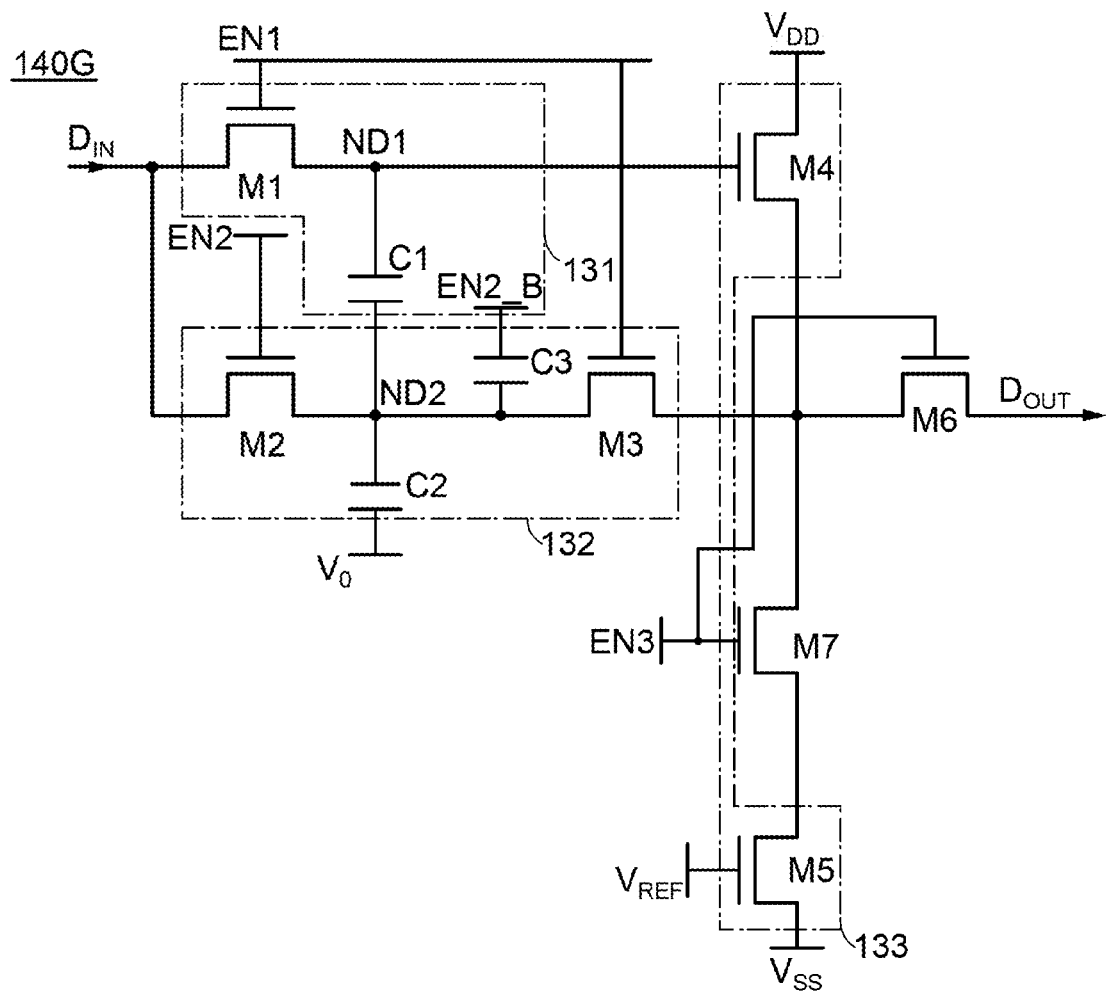
FIG. 16 illustrates an example of a semiconductor device.

Furthermore, as another configuration, a memory cell 140G of FIG. 16 has a circuit configuration in which the structure added to the structure of FIG. 14A is applied to the circuit configuration of FIG. 11A.

Figure 17:
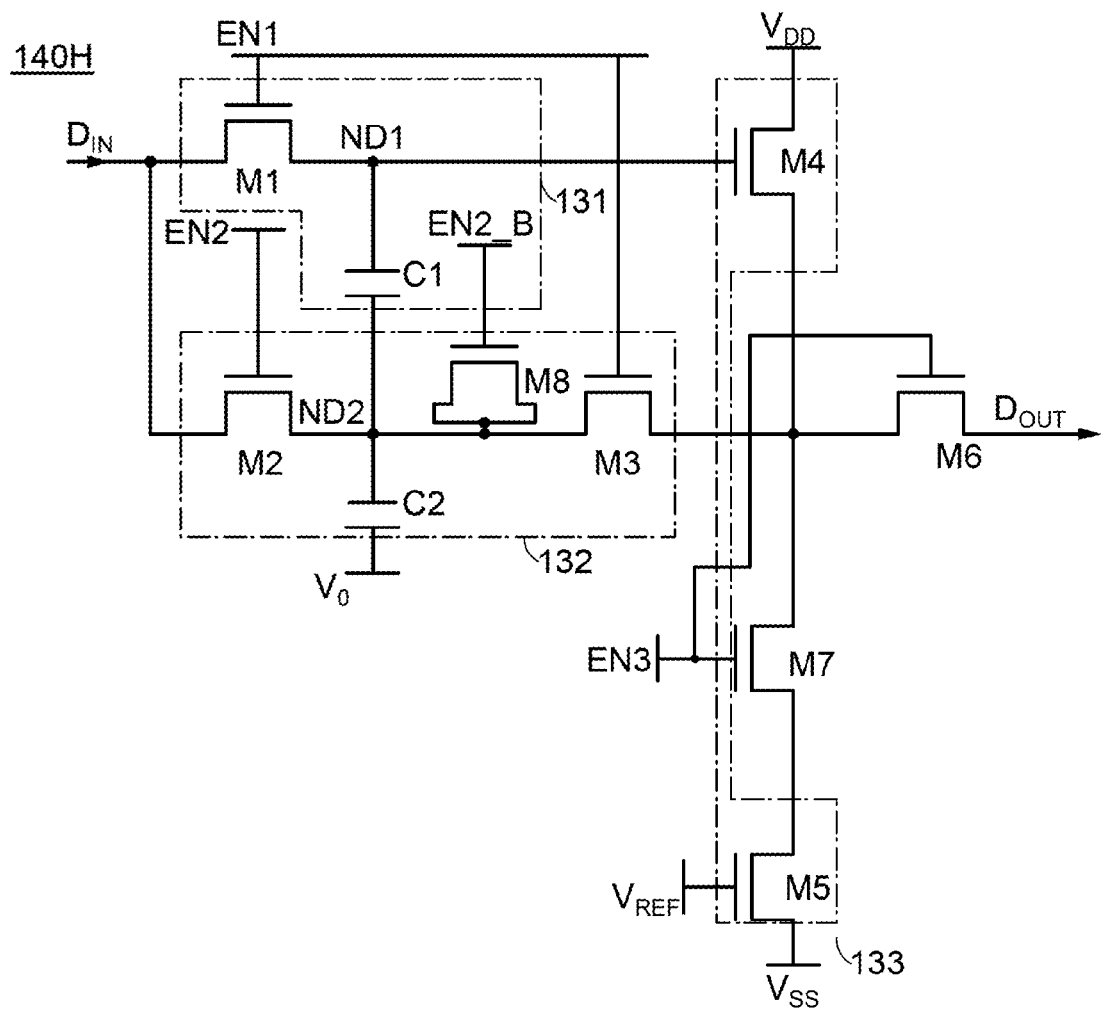
FIG. 17 illustrates an example of a semiconductor device.

Furthermore, as another configuration, a memory cell 140H of FIG. 17 has a circuit configuration in which the structure added to the structure of FIG. 15 is applied to the circuit configuration of FIG. 11A.

As described above, according to one embodiment of the present invention, a semiconductor device with low power consumption can be provided. Furthermore, the semiconductor device can have a reduced chip area.

(Embodiment 2)

This embodiment will describe the semiconductor device that is explained in Embodiment 1 and functions as a source driver IC, a display device operated by the semiconductor device, and their variation examples.

Figure 18:
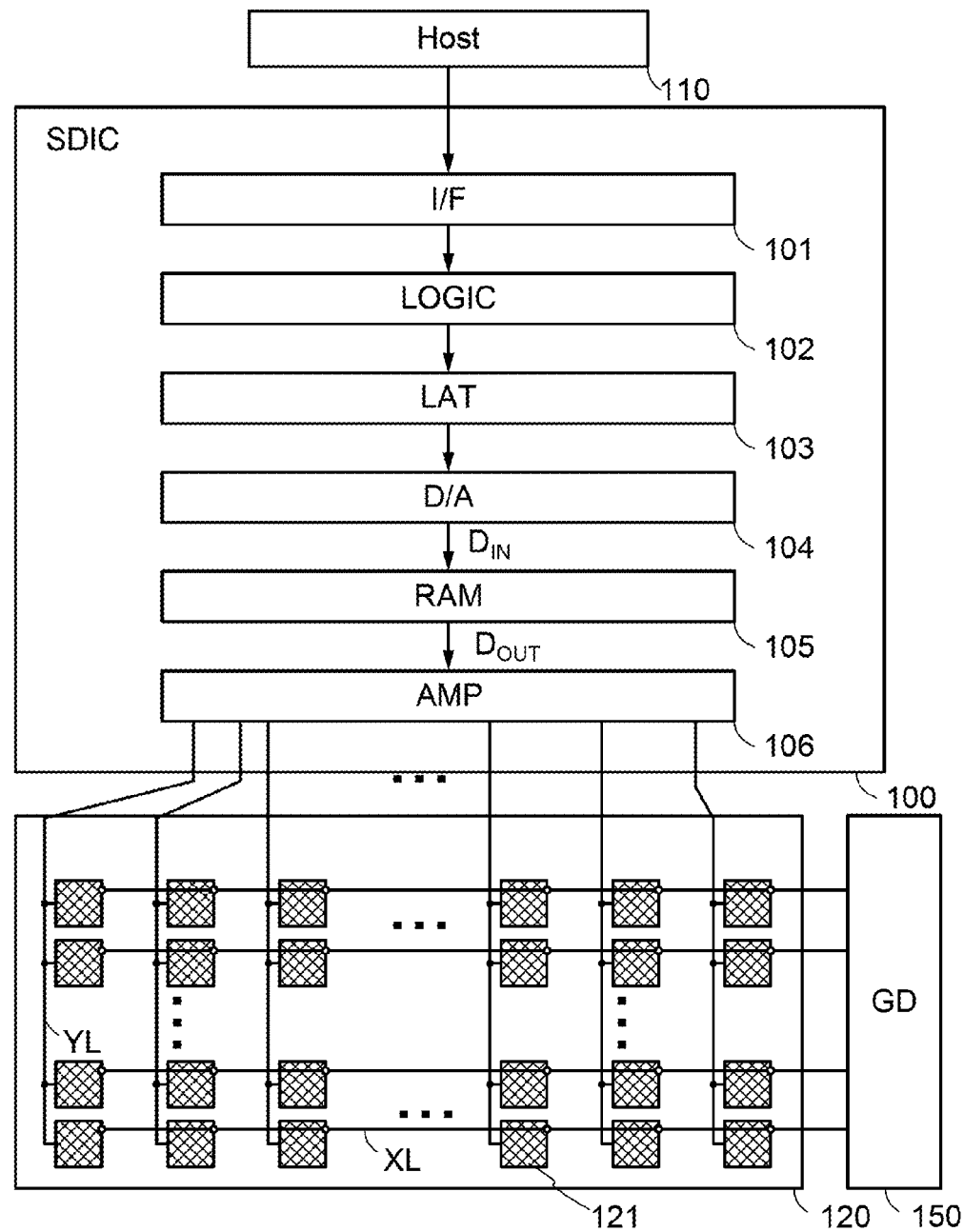
FIG. 18 illustrates an example of a display panel.

A block diagram in FIG. 18 illustrates the semiconductor device 100, the host processor 110, a game driver 150 (shown as GD), and the display device 120. FIG. 18 also illustrates a plurality of scan lines XL, a plurality of signal lines YL, and pixels 121 in the display device 120. The semiconductor device 100 has a structure similar to that shown in FIG. 1 of Embodiment 1.

The gate driver 150 has a function of supplying scan signals to the scan lines XL. The semiconductor device 100 serving as a source driver IC has a function of supplying data signals, which are analog signals, to the signal lines YL.

In the display device 120, the scan lines XL and the signal lines YL are provided to be substantially orthogonal. The pixels 121 are provided at the intersections of the scan lines XL and the signal lines YL. For color display, the pixels 121 corresponding to the respective colors of red, green, and blue (RGB) are arranged in sequence. Note that the pixels of RGB can be arranged in a stripe pattern, a mosaic pattern, a delta pattern, or the like as appropriate. Without limitation to RGB, a pixel corresponding to white, yellow, or the like can be added for color display.

Figure 19:
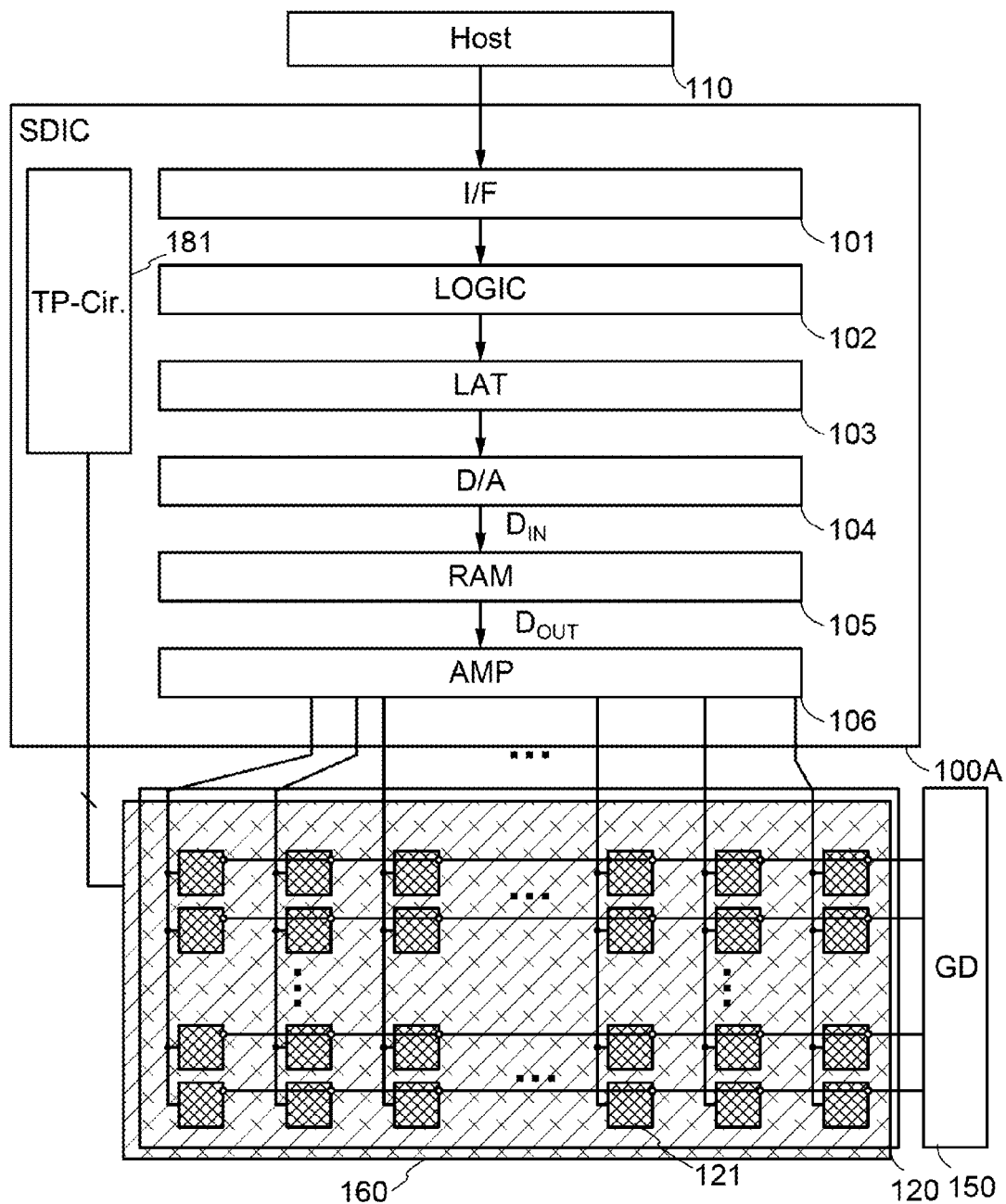
FIG. 19 illustrates an example of a display panel.

In the case of adding a touch sensor function to the display device 120, a touch sensor 160 is added as in a semiconductor device 100A illustrated in FIG. 19. Note that it is possible to obtain an in-cell touch panel by combining the touch sensor 160 and the display device 120. A signal obtained by the touch sensor 160 can be processed by a semiconductor device 100A that includes a touch sensor driver circuit 181 in addition to the components of the semiconductor device 100. In the structure of FIG. 19, controlling driving of the touch sensor and driving of the display device at different timings enables the reduction in malfunction of the touch sensor due to noise.

Figure 20:
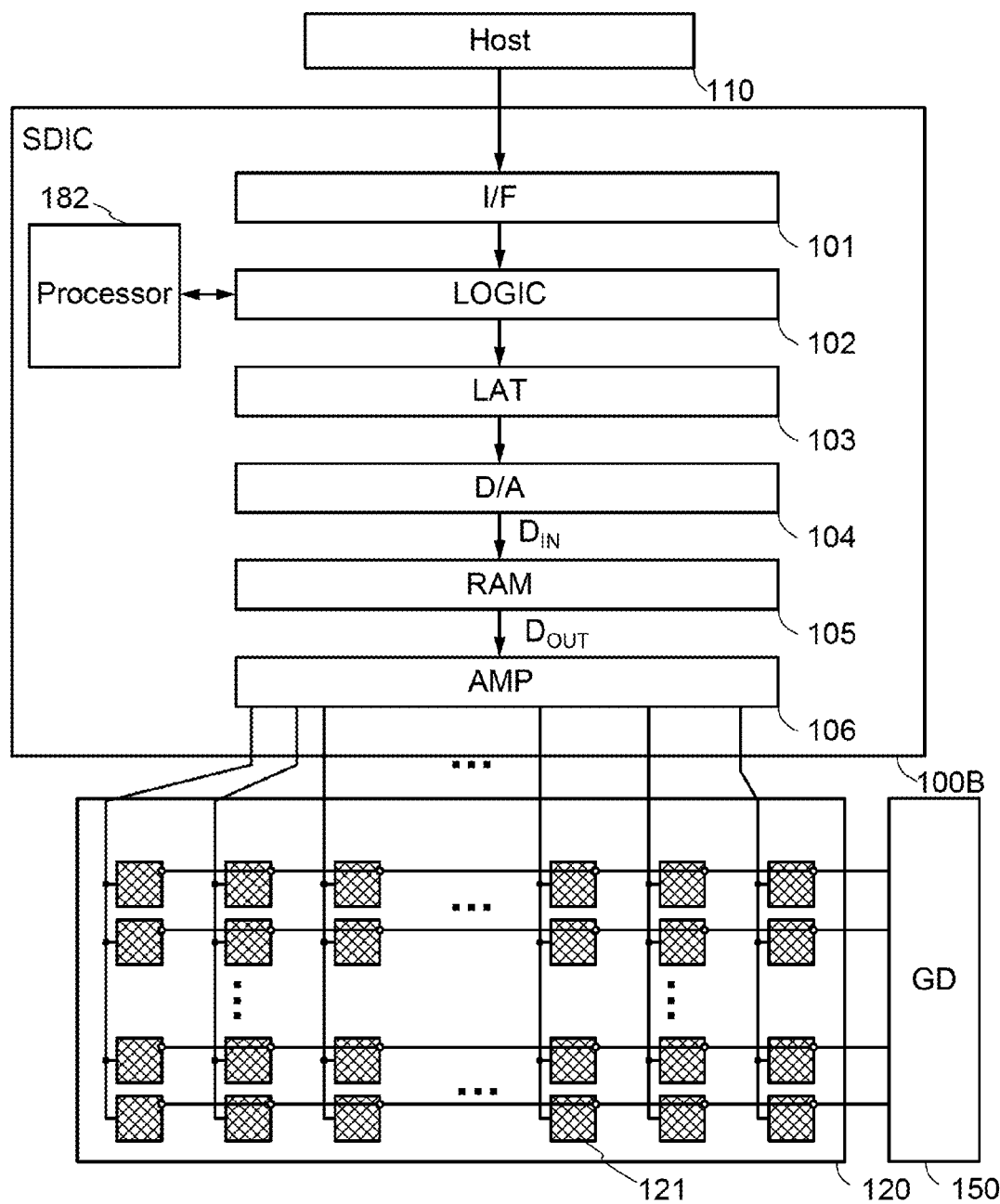
FIG. 20 illustrates an example of a display panel.

A semiconductor device 100B in a block diagram of FIG. 20 includes an arithmetic device 182. The arithmetic device 182 has a function of performing arithmetic processing on data. As an example of arithmetic processing, the arithmetic device 182 can execute image rotation processing, control for turning on or off a backlight, super-resolution processing, or the like. The semiconductor device 100 to which the arithmetic device 182 is added achieves higher performance.

Figure 21A:
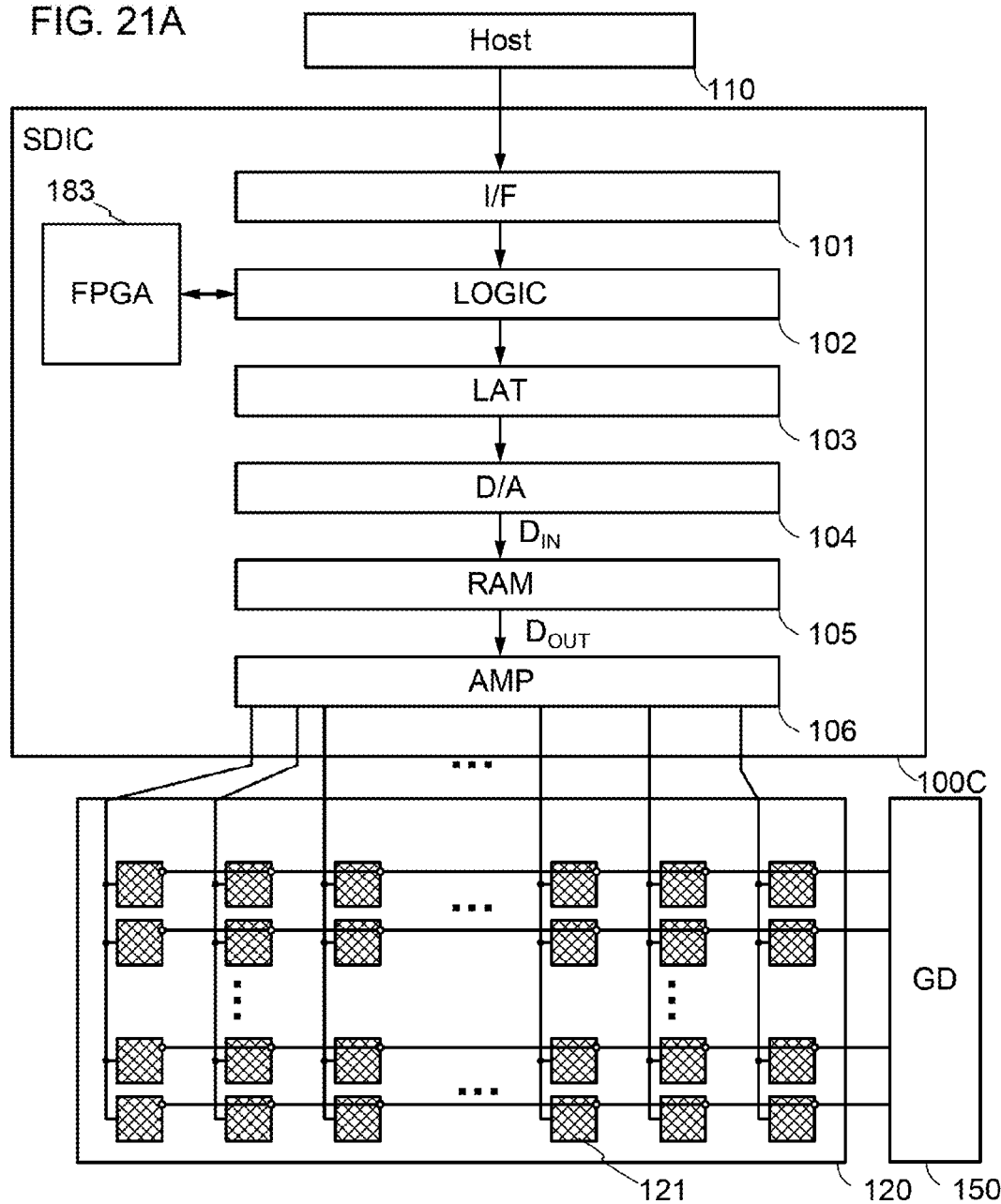
FIGS. 21A to 21C illustrate an example of a display panel.

A semiconductor device 100C in a block diagram of FIG. 21A includes an FPGA 183. The FPGA 183 has a function of performing arithmetic processing on data. As an example of arithmetic processing, like the arithmetic device 182, the FPGA 183 can execute image rotation processing, control for turning on or off a backlight, super-resolution processing, or the like.

Figure 21B:
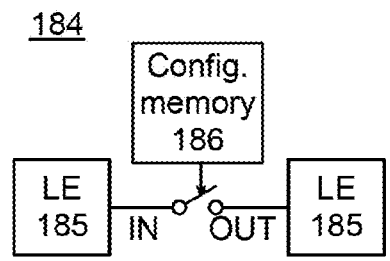
Figure 21C:
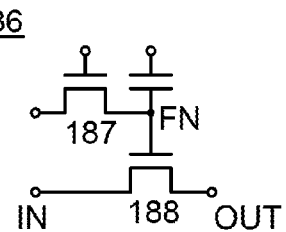

FIG. 21B is a block diagram illustrating a configuration memory that stores configuration data. For example, the on/off state of a switch 184, which controls a connection of logic elements 185, is controlled by a configuration memory 186. In FIG. 21C, an example of a circuit configuration which can be used for the configuration memory 186 is illustrated. The configuration memory 186 includes transistors 187 and 188 and charge corresponding to the configuration data at a floating node FN is retained. The function of the switch 184 is achieved by switching the on/off state of the transistor 188 in accordance with the voltage of the floating node FN. The circuit configuration of FIG. 21C can be similar to that of the memory cell 140 described in Embodiment 1, in which case it is useful to use a transistor containing an oxide semiconductor as the transistor 187. With this structure, the configuration memory 186 of the FPGA 183 can be fabricated through the same process as the memory cell 140.

Figure 22A:
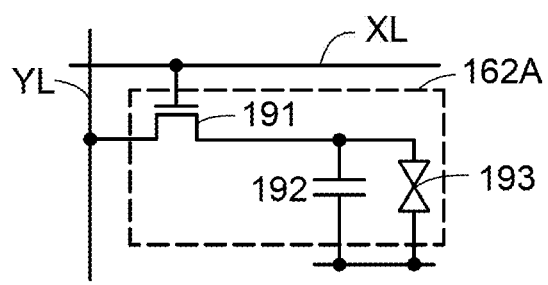
FIGS. 22A and 22B each illustrate an example of a display panel.
Figure 22B:
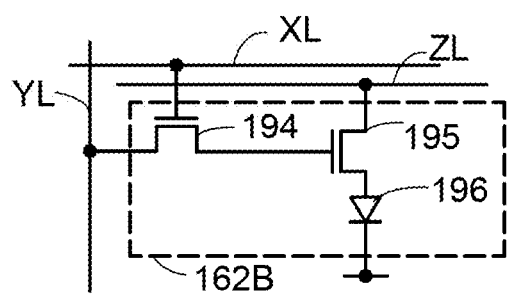

FIGS. 22A and 22B illustrate configuration examples of the pixel 121.

A pixel 162A in FIG. 22A is an example of a pixel included in a liquid crystal display device. The pixel 162A includes a transistor 191, a capacitor 192, and a liquid crystal element 193.

The transistor 191 serves as a switching element for controlling the connection between the liquid crystal element 193 and the signal line YL. The on/off state of the transistor 191 is controlled by a scan voltage input to its gate via the scan line XL.

The capacitor 192 is, for example, an element formed by stacking conductive layers.

The liquid crystal element 193 includes a common electrode, a pixel electrode, and a liquid crystal layer, for example. Alignment of a liquid crystal material of the liquid crystal layer is changed by the action of an electric field generated between the common electrode and the pixel electrode.

A pixel 162B in FIG. 22B is an example of a pixel included in an EL display device and includes a transistor 194, a transistor 195, and an EL element 196. Note that in FIG. 22B, a current supply line ZL in addition to the scan line XL and the signal line YL is illustrated. The current supply line ZL is a wiring for supplying current to the EL element 196.

The transistor 194 serves as a switching element for controlling the connection between a gate of the transistor 195 and the signal line YL. The on state of the transistor 194 is controlled by a scan voltage input to its gate through the scan line XL.

The transistor 195 has a function of controlling current flowing between the current supply line ZL and the EL element 196, in accordance with voltage applied to the gate of the transistor 195.

The EL element 196 is, for example, an element including a light-emitting layer provided between electrodes. The luminance of the EL element 196 can be controlled by the amount of current that flows in the light-emitting layer.
(Embodiment 3)

In this embodiment, an example of a cross-sectional structure of a semiconductor device in one embodiment of the present invention will be described with reference to FIGS. 23 to 35.

The semiconductor device described in the above embodiments can be fabricated by stacking a layer including a transistor using silicon and the like (Si transistor), a layer including a transistor using oxide semiconductor (OS transistor), and a wiring layer.

<Layer Structure of Semiconductor Device>

Figure 23:
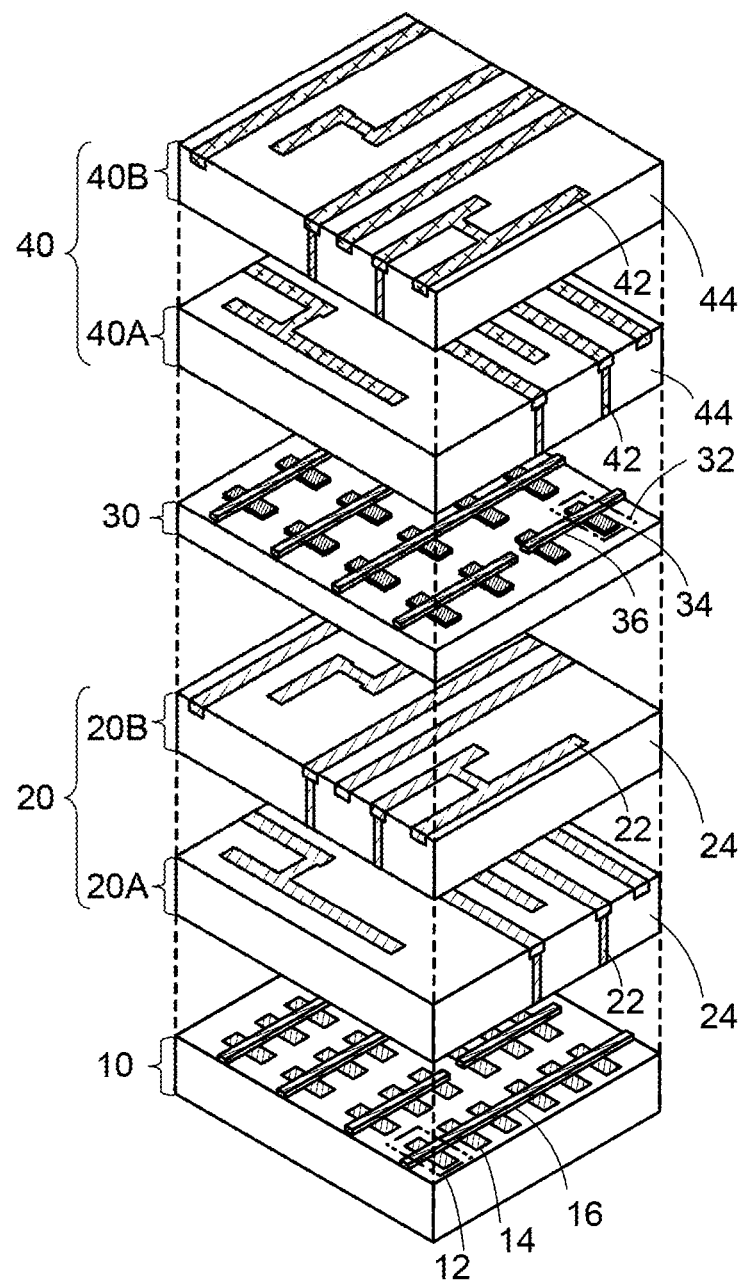
FIG. 23 illustrates an example of a schematic cross-sectional diagram.

A schematic view of a layer structure of the semiconductor device is illustrated in FIG. 23. A transistor layer 10, a wiring layer 20, a transistor layer 30, and a wiring layer 40 are stacked in this order. The wiring layer 20 shown as an example includes wiring layers 20A and 20B. Furthermore, the wiring layer 40 includes a plurality of wiring layers 40A and 40B. In the wiring layer 20 and/or the wiring layer 40, a capacitor can be formed such that an insulator is sandwiched between conductors.

The transistor layer 10 includes a plurality of transistors 12. The transistor 12 includes a semiconductor layer 14 and a gate electrode 16. Although a layer processed into an island shape is shown as the semiconductor layer 14, the semiconductor layer 14 may be a semiconductor layer obtained by element isolation from a semiconductor substrate. Although a gate electrode for a top-gate transistor is shown as the gate electrode 16, the gate electrode 16 may be a gate electrode for a bottom-gate, a double-gate, or a dual-gate transistor, for example.

Each of the wiring layers 20A and 20B includes a wiring 22 that is embedded in an opening provided in an insulating layer 24. The wiring 22 functions as a wiring for connecting elements such as transistors.

The transistor layer 30 includes a plurality of transistors 32. The transistor 32 includes a semiconductor layer 34 and a gate electrode 36. Although a layer processed into an island shape is shown as the semiconductor layer 34, the semiconductor layer 34 may be a semiconductor layer obtained by element isolation from a semiconductor substrate. Although a gate electrode for a top-gate transistor is shown as the gate electrode 36, the gate electrode 36 may be a gate electrode for a bottom-gate, a double-gate, or a dual-gate transistor, for example.

Each of the wiring layers 40A and 40B includes a wiring 42 that is embedded in an opening provided in an insulating layer 44. The wiring 42 functions as a wiring for connecting elements such as transistors.

The semiconductor layer 14 is formed using a semiconductor material different from that for the semiconductor layer 34. For example, given that the transistor 12 is a Si transistor and the transistor 32 is an OS transistor, the semiconductor material for the semiconductor layer 14 is silicon and that for the semiconductor layer 34 is an oxide semiconductor.

[Structure Example]

Figure 24A:
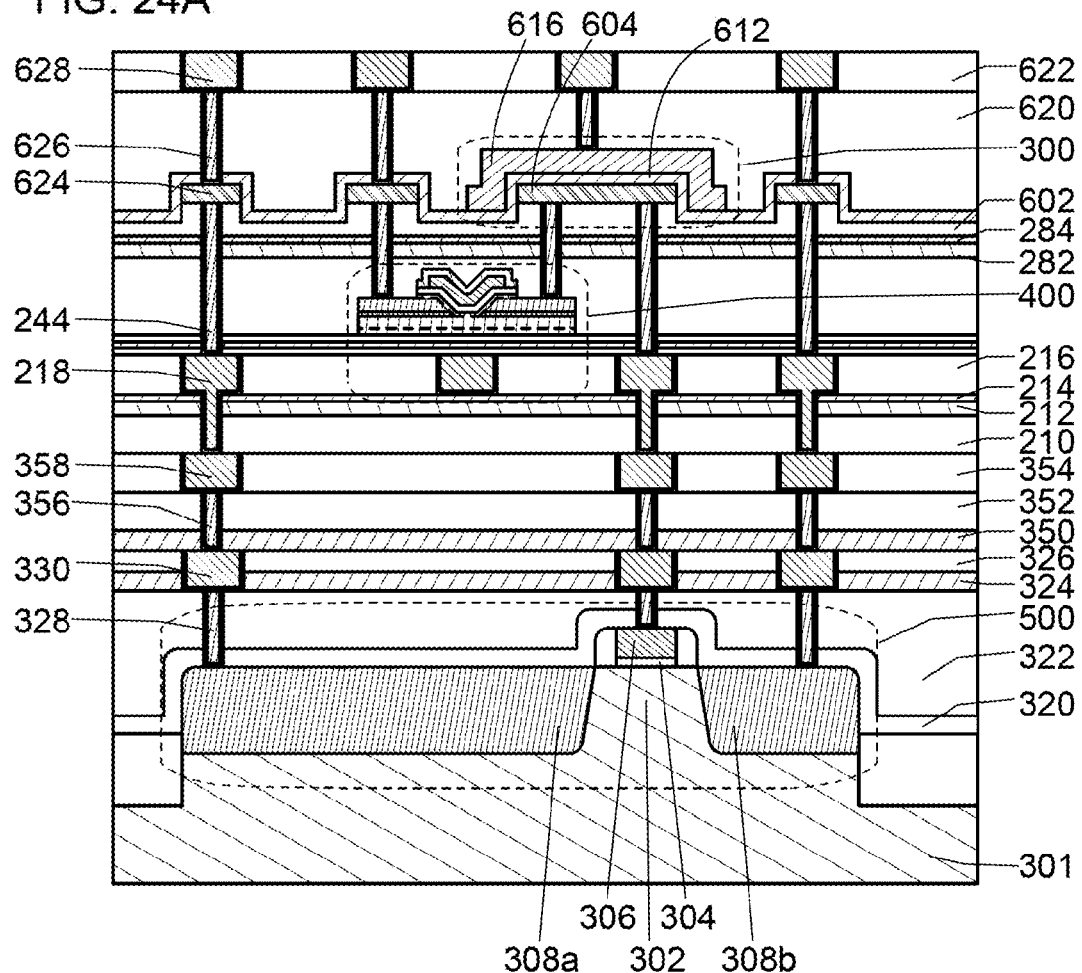
FIGS. 24A and 24B illustrate examples of schematic cross-sectional diagrams.
Figure 24B:
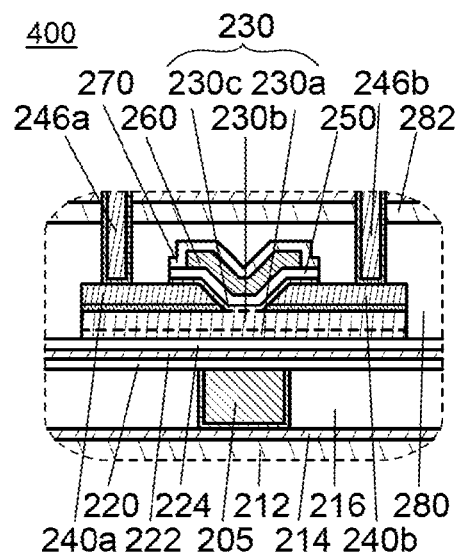

FIG. 24A illustrates an example of a cross-sectional view of the semiconductor device. FIG. 24B is an enlarged view of part of the structure in FIG. 24A.

The semiconductor device illustrated in FIG. 24A includes a capacitor 300, a transistor 400, and a transistor 500.

The capacitor 300 is provided over an insulator 602 and includes a conductor 604, an insulator 612, and a conductor 616.

The conductor 604 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. When the conductor 604 is formed concurrently with another component such as a plug or a wiring, a low-resistance metal material such as copper (Cu) or aluminum (Al) can be used.

The insulator 612 is provided to cover a side surface and a top surface of the conductor 604. The insulator 612 has a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

The conductor 616 is provided to cover the side surface and the top surface of the conductor 604 with the insulator 612 positioned therebetween.

Note that the conductor 616 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. When the conductor 616 is formed concurrently with another component such as a conductor, a low-resistance metal material such as copper (Cu) or aluminum (Al) can be used.

With the structure where the conductor 616 included in the capacitor 300 covers the side surfaces and the top surface of the conductor 604 with the insulator 612 positioned therebetween, the capacitance per projected area of the capacitor 300 can be increased. Thus, the semiconductor device can be reduced in area, highly integrated, and miniaturized.

The transistor 500 is provided over a substrate 301 and includes a conductor 306, an insulator 304, a semiconductor region 302 that is part of the substrate 301, and low-resistance regions 308a and 308b functioning as a source region and a drain region.

The transistor 500 is either a p-channel transistor or an n-channel transistor.

A channel formation region of the semiconductor region 302, a region around the channel formation region, the low-resistance regions 308a and 308b serving as the source region and the drain region, and the like contain preferably a semiconductor such as a silicon-based semiconductor, more preferably single crystal silicon. Alternatively, they may contain a material containing germanium (Ge), silicon germanium (SiGe), gallium arsenide (GaAs), gallium aluminum arsenide (GaAlAs), or the like. They may contain silicon whose effective mass is controlled by applying stress to the crystal lattice and thereby changing the lattice spacing. Alternatively, the transistor 500 may be a high-electron-mobility transistor (HEMT) using GaAs and GaAlAs, or the like.

The low-resistance regions 308a and 308b contain an element that imparts n-type conductivity (e.g., arsenic or phosphorus) or an element that imparts p-type conductivity (e.g., as boron) in addition to a semiconductor material used for the semiconductor region 302.

The conductor 306 functioning as a gate electrode can be formed using a semiconductor material such as silicon containing an element that imparts n-type conductivity (e.g., arsenic or phosphorus) or an element that imparts p-type conductivity (e.g., boron), or a conductive material such as a metal material, an alloy material, or a metal oxide material.

Note that the threshold voltage can be adjusted by setting the work function with a material of the conductor. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

In the transistor 500 illustrated in FIG. 24A, the semiconductor region 302 (part of the substrate 301) in which a channel is formed includes a protruding portion. Furthermore, the conductor 306 is provided to cover a side surface and a top surface of the semiconductor region 302 with the insulator 304 therebetween. Note that the conductor 306 may be formed using a material for adjusting a work function. The transistor 500 with such a structure is also referred to as a FIN transistor because it utilizes the protruding portion of the semiconductor substrate. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

Note that the transistor 500 illustrated in FIG. 24A is just an example; without limitation to the structure shown in FIG. 24A, an appropriate transistor can be used in accordance with a circuit configuration or a driving method. For example, a planar transistor 500A illustrated in FIG. 25A may be used.

An insulator 320, an insulator 322, an insulator 324, and an insulator 326 are sequentially stacked and cover the transistor 500.

The insulator 322 functions as a planarization film for eliminating a level difference caused by the transistor 500 or the like underlying the insulator 322. A top surface of the insulator 322 may be planarized by planarization treatment using a chemical mechanical polishing (CMP) method or the like to increase the level of planarity.

The insulator 324 functions as a barrier film that prevents hydrogen or impurities from diffusing from the substrate 301, the transistor 500, or the like into a region where the transistor 400 is formed. For example, the insulator 324 can be formed using nitride such as silicon nitride.

A conductor 328, a conductor 330, and the like that are electrically connected to the capacitor 300 or the transistor 400 are embedded in the insulator 320, the insulator 322, the insulator 324, and the insulator 326. The conductor 328 and the conductor 330 each function as a plug or a wiring. Note that a plurality of conductors functioning as plugs or wirings are collectively denoted by the same reference numeral in some cases, as described later. Furthermore, in this specification and the like, a wiring and a plug electrically connected to the wiring may be a single component. That is, there are cases where part of a conductor functions as a wiring and where part of a conductor functions as a plug.

For each of the plugs and wirings (e.g., the conductor 328 and the conductor 330), a single-layer structure or a stacked-layer structure using a conductive material such as a metal material, an alloy material, or a metal oxide material can be used. It is preferable to use a high-melting-point material that has both heat resistance and conductivity, such as tungsten or molybdenum, and it is particularly preferable to use tungsten. It is particularly preferable to use a low-resistance conductive material such as aluminum or copper. The use of the above material can reduce the wiring resistance.

A wiring layer may be provided over the insulator 326 and the conductor 330. For example, an insulator 350, an insulator 352, and an insulator 354 are sequentially stacked in FIG. 24A. A conductor 356 and a conductor 358 are embedded in the insulator 350, the insulator 352, and the insulator 354. The conductor 356 and the conductor 358 each function as a plug or a wiring.

Note that for example, the insulator 350 is preferably formed using an insulator with a barrier property with respect to hydrogen, like the insulator 324. The conductor 356 and the conductor 358 are preferably formed using a conductor with a barrier property with respect to hydrogen. The conductor with a barrier property with respect to hydrogen is formed in an opening in the insulator 350 with a barrier property with respect to hydrogen. This structure can separate the transistor 500 and the transistor 400 by the barrier layer, and thus can prevent diffusion of hydrogen from the transistor 500 to the transistor 400.

As the conductor with a barrier property with respect to hydrogen, tantalum nitride can be used, for example. Stacking tantalum nitride and tungsten, which has high conductivity, can prevent diffusion of hydrogen from the transistor 500 while the conductivity of a wiring is ensured.

The transistor 400 is provided over the insulator 354. FIG. 24B is an enlarged view of the transistor 400. Note that the transistor 400 illustrated in FIG. 24B is just an example; without limitation to the structure shown in FIG. 24B, an appropriate transistor can be used in accordance with a circuit configuration or a driving method.

The transistor 400 is a transistor in which a channel is formed in a semiconductor layer containing an oxide semiconductor. The off-state current of the transistor 400 is low; thus, using the transistor 400 in a frame memory of a semiconductor device enables stored data to be retained for a long time.

An insulator 210, an insulator 212, an insulator 214, and an insulator 216 are sequentially stacked over the insulator 354. A conductor 218, a conductor 205, and the like are embedded in the insulator 210, the insulator 212, the insulator 214, and the insulator 216. The conductor 218 functions as a plug or a wiring that is electrically connected to the capacitor 300 or the transistor 500. The conductor 205 functions as a gate electrode of the transistor 400.

A material with a barrier property with respect to oxygen or hydrogen is preferably used for any of the insulators 210, 212, 214, and 216. In particular, in the case of using an oxide semiconductor in the transistor 400, the reliability of the transistor 400 can be increased when an insulator including an oxygen excess region is provided as an interlayer film or the like around the transistor 400. Accordingly, in order to diffuse oxygen from the interlayer film around the transistor 400 to the transistor 400 efficiently, layers with barrier properties with respect to hydrogen and oxygen are preferably provided such that the transistor 400 and the interlayer film are sandwiched therebetween.

For example, aluminum oxide, hafnium oxide, or tantalum oxide is preferably used for the barrier layers. Stacking the barrier layers achieves the function of diffusing oxygen more reliably.

An insulator 220, an insulator 222, and an insulator 224 are sequentially stacked over the insulator 216. Part of a conductor 244 is embedded in the insulator 220, the insulator 222, and the insulator 224. Note that the conductor 218 functions as a plug or a wiring that is electrically connected to the capacitor 300 or the transistor 500.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). When such an insulator containing excess oxygen is provided in contact with an oxide 230 in which a channel region of the transistor 400 is formed, oxygen vacancies in the oxide can be filled. Note that the insulators 220 and 224 are not necessarily formed of the same material.

The insulator 222 preferably has a single-layer structure or a stacked-layer structure using an insulator containing silicon oxide, silicon oxynitride, silicon nitride oxide, aluminum oxide, hafnium oxide, tantalum oxide, zirconium oxide, lead zirconate titanate (PZT), strontium titanate (SrTiO$_3$), (Ba,Sr)TiO$_3$ (BST), or the like. Aluminum oxide, bismuth oxide, germanium oxide, niobium oxide, silicon oxide, titanium oxide, tungsten oxide, yttrium oxide, or zirconium oxide, for example, may be added to the insulator. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material and may be formed of different materials.

When the insulator 222 containing a high-k material is provided between the insulator 220 and the insulator 224, electrons can be trapped in the insulator 222 under specific conditions, resulting in higher threshold voltage. In other words, the insulator 222 is negatively charged in some cases.

For example, when the insulator 220 and the insulator 224 are formed using silicon oxide and the insulator 222 is formed using a material having a lot of electron trap states (e.g., hafnium oxide, aluminum oxide, or tantalum oxide), electrons move from the oxide 230 toward the conductor 205 under the following conditions: the potential of the conductor 205 is kept higher than the potential of a source electrode and a drain electrode for 10 milliseconds or longer, typically 1 minute or longer at temperatures higher than the operating temperature or the storage temperature of the semiconductor device (e.g., at temperatures ranging from 125° C. to 450° C., typically from 150° C. to 300° C.). At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and the threshold voltage can be controlled accordingly. The transistor 400 having this structure is a normally-off transistor, which is in a non-conduction state (also referred to as off state) even when the gate voltage is 0 V.

The treatment for trapping the electrons can be performed in the manufacturing process of the transistor. For example, the treatment can be performed at any step before factory shipment, such as after the formation of a conductor connected to a source conductor or a drain conductor of the transistor, after a wafer process, after a wafer-dicing step, or after packaging.

The insulator 222 is preferably formed using a material with a barrier property with respect to oxygen or hydrogen. The use of such a material can prevent release of oxygen from the oxide 230 and entry of impurities such as hydrogen from the outside.

An oxide 230a, an oxide 230b, and an oxide 230c are formed using a metal oxide such as an In-M-Zn oxide (M is Al, Ga, Y, or Sn). An In—Ga oxide or In—Zn oxide may be used as the oxide 230. Hereinafter the oxide 230a, the oxide 230b, and the oxide 230c may be collectively referred to as the oxide 230.

The oxide 230 according to the present invention is described below.

An oxide used as the oxide 230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide contains indium, an element M, and zinc is considered. The element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M.

First, preferred ranges of the atomic ratio of indium, the element M, and zinc contained in an oxide according to the present invention are described with reference to FIGS. 26A to 26C. Note that the proportion of oxygen atoms is not shown in FIGS. 26A to 26C. The terms of the atomic ratio of indium, the element M, and zinc contained in the oxide are denoted by [In], [M], and [Zn], respectively.

Figure 26A:
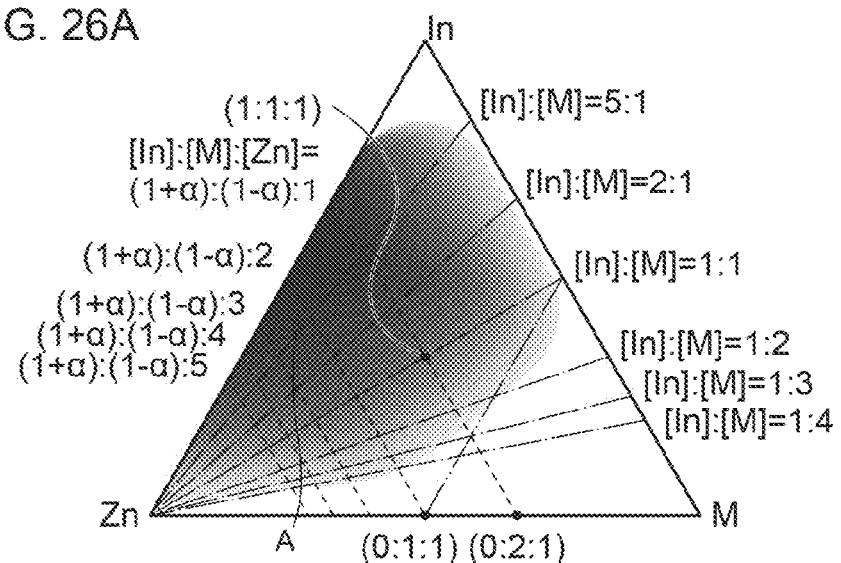
FIGS. 26A to 26C each illustrate an atomic ratio range of an oxide semiconductor.
Figure 26B:
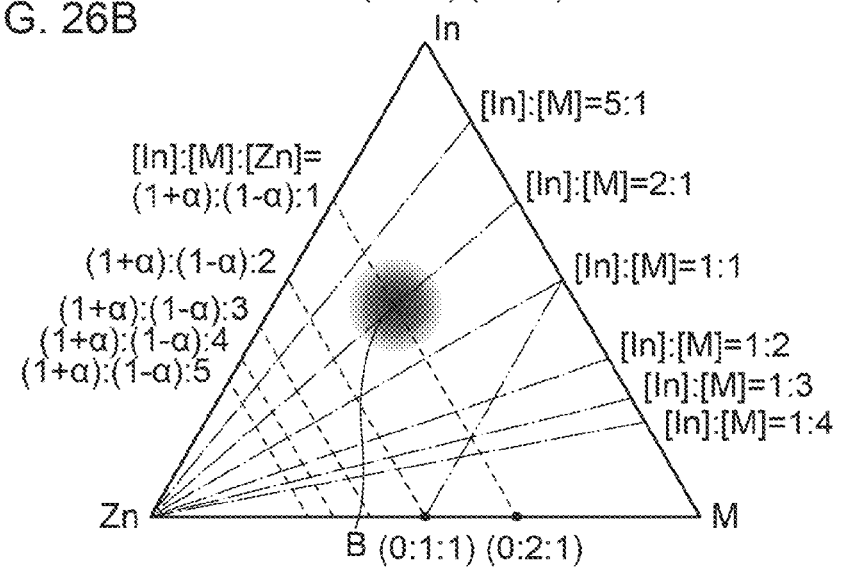
Figure 26C:
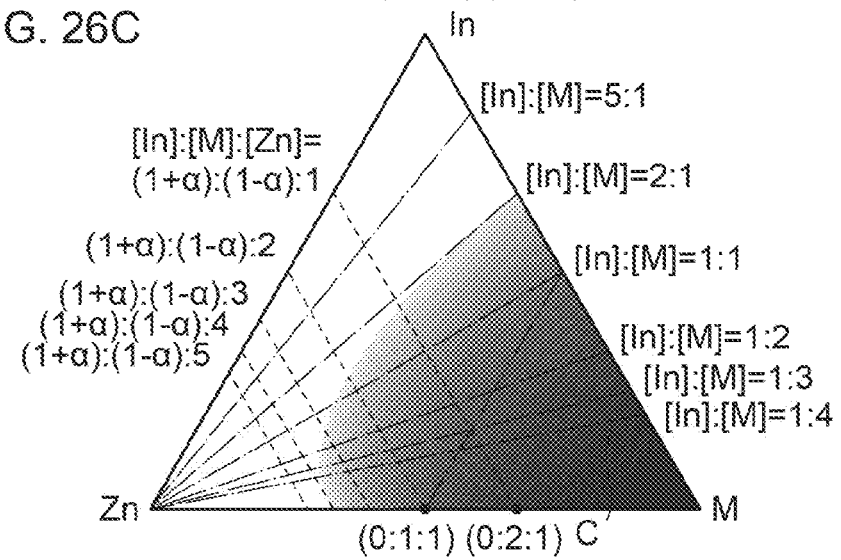

In FIGS. 26A to 26C, broken lines indicate a line where the atomic ratio [In]:[M]:[Zn] is $(1+\alpha):(1-\alpha):1$ (where $-1 \le \alpha \le 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+a):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta \ge 0$), a line where the atomic ratio [In]:[M]:[Zn] is $1:2:\beta$, a line where the atomic ratio [In]:[M]:[Zn] is $1:3:\beta$, a line where the atomic ratio [In]:

[M]:[Zn] is 1:4:β, a line where the atomic ratio [In]:[M]:[Zn] is 2:1:β, and a line where the atomic ratio [In]:[M]:[Zn] is 5:1:β.

A dashed double-dotted line indicates a line where the atomic ratio [In]:[M]:[Zn] is (1+γ):2:(1−γ), where −1≤γ≤1. An oxide with the atomic ratio [In]:[M]:[Zn] of 0:2:1 or around 0:2:1 in FIGS. 26A to 26C tends to have a spinel crystal structure.

FIGS. 26A and 26B illustrate examples of the preferred ranges of the atomic ratio of indium, the element M, and zinc contained in an oxide of one embodiment of the present invention.

Figure 27:
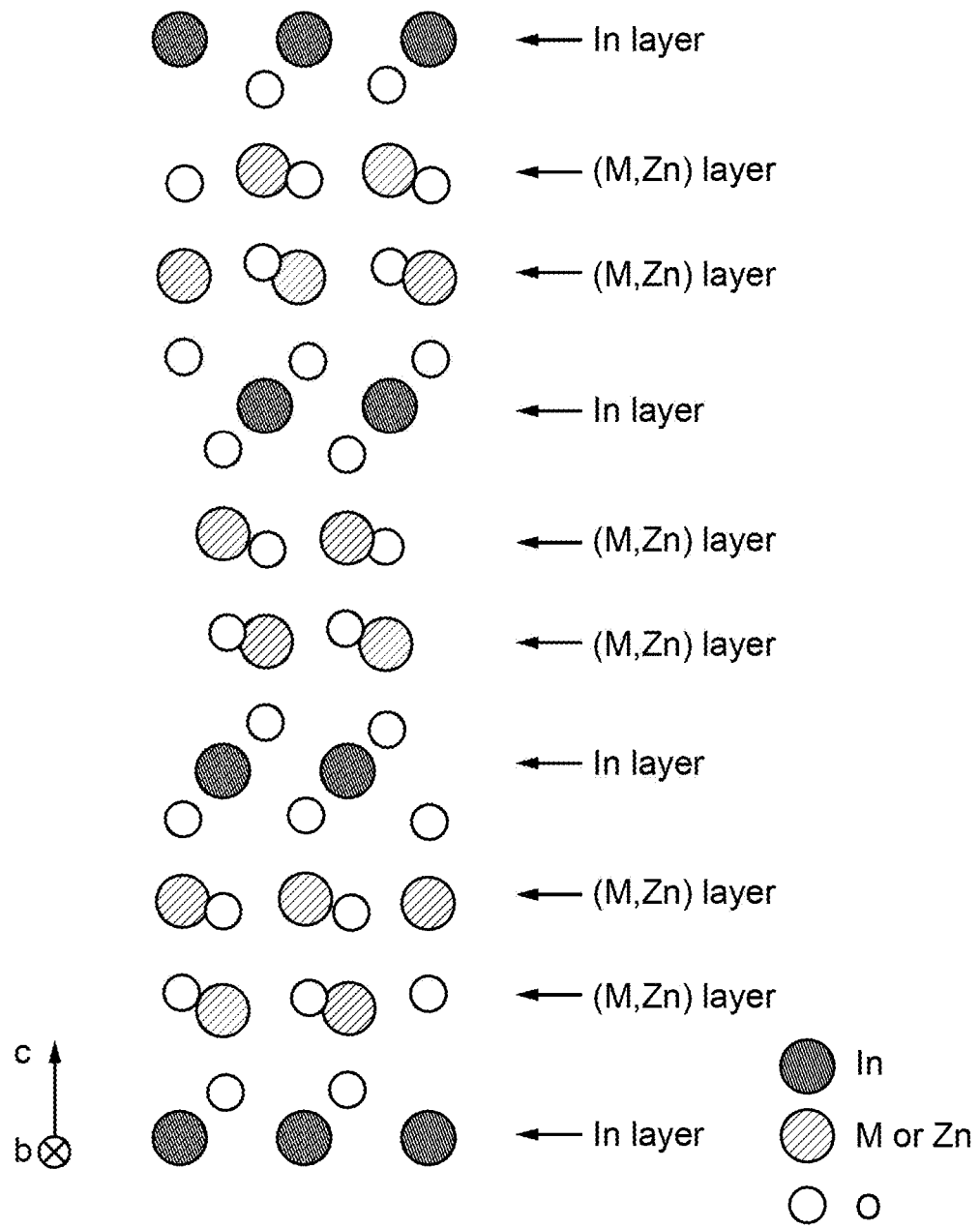
FIG. 27 illustrates an InMZnO$_4$ crystal.

FIG. 27 illustrates an example of the crystal structure of InMZnO$_4$ with an atomic ratio [In]:[M]:[Zn] of 1:1:1. The crystal structure illustrated in FIG. 27 is InMZnO$_4$ observed from a direction parallel to the b-axis. Note that a metal element in a layer that contains the element M, Zn, and oxygen (hereinafter this layer is referred to as "(M,Zn) layer") in FIG. 27 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as layered structure) and includes two (M,Zn) layers that contain the element M, zinc, and oxygen with respect to one layer that contains indium and oxygen (hereinafter referred to as In layer), as illustrated in FIG. 27.

Indium and the element M can be replaced with each other. Accordingly, when the element M in the (M,Zn) layer is replaced by indium, the layer can also be referred to as (In,M,Zn) layer. In that case, a layered structure that includes two (In,M,Zn) layers with respect to one In layer is obtained.

An oxide with an atomic ratio [In]:[M]:[Zn] of 1:1:2 has a layered structure that includes three (M,Zn) layers with respect to one In layer. In other words, if [Zn] is larger than [In] and [M], the proportion of the (M,Zn) layer to the In layer becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of [In]:[M]:[Zn]=1:1:1.5, the oxide may have a mix of a layered structure including one In layer for every two (M,Zn) layers and a layered structure including one In layer for every three (M,Zn) layers.

For example, when the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] around 0:2:1, two phases of a spinel crystal structure and a layered crystal structure are likely to exist. In addition, with an atomic ratio [In]:[M]:[Zn] around 1:0:0, two phases of a bixbyite crystal structure and a layered crystal structure are likely to exist. In the case where a plurality of phases exist in the oxide, a grain boundary might be formed between different crystal structures.

In addition, the oxide with a higher content of indium can have high carrier mobility (electron mobility). This is because in an oxide containing indium, the element M, and zinc, the s orbital of heavy metal mainly contributes to carrier transfer, and a higher indium content in the oxide enlarges a region where the s orbitals of indium atoms overlap; therefore, an oxide with a high indium content has higher carrier mobility than an oxide with a low indium content.

In contrast, when the indium content and the zinc content in an oxide become lower, the carrier mobility becomes lower. Thus, with an atomic ratio [In]:[M]:[Zn] of 0:1:0 or around 0:1:0 (e.g., a region C in FIG. 26C), insulation performance becomes better.

Accordingly, an oxide in one embodiment of the present invention preferably has an atomic ratio represented by a region A in FIG. 26A. With this atomic ratio, a layered structure with high carrier mobility and a few grain boundaries is easily obtained.

A region B in FIG. 26B represents an atomic ratio [In]:[M]:[Zn] of 4:2:3 to 4:2:4.1 and the vicinity thereof. The vicinity includes an atomic ratio [In]:[M]:[Zn] of 5:3:4, for example. An oxide with an atomic ratio represented by the region B is an excellent oxide that has particularly high crystallinity and high carrier mobility.

Note that a condition where an oxide has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described.

When the oxide is used for a transistor, carrier scattering or the like at a grain boundary can be reduced; thus, the transistor can have high field-effect mobility. Moreover, the transistor can have high reliability.

An oxide with a low carrier density is preferably used for a transistor. For example, an oxide whose carrier density is lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$ is used.

A highly purified intrinsic or substantially highly purified intrinsic oxide has few carrier generation sources and thus can have a low carrier density. A highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide with a high density of trap states has unstable electrical characteristics in some cases.

In view of the above, to obtain stable electrical characteristics of a transistor, it is effective to reduce the concentration of impurities in the oxide. To reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

Here, the influence of impurities in the oxide is described.

When silicon or carbon, which is a Group 14 element, is contained in the oxide, defect states are formed in the oxide. Thus, the concentration of silicon or carbon in the oxide and around an interface with the oxide (the concentration obtained by secondary ion mass spectrometry (SIMS)) is set lower than or equal to $2 \times 10^{18}$ atoms/cm$^3$, preferably lower than or equal to $2 \times 10^{17}$ atoms/cm$^3$.

When the oxide contains alkali metal or alkaline earth metal, defect states are formed and carriers are generated in some cases. Thus, a transistor using an oxide that contains alkali metal or alkaline earth metal is likely to have normally-on characteristics. Accordingly, it is preferable to reduce the concentration of alkali metal or alkaline earth metal in the oxide. Specifically, the concentration of alkali metal or alkaline earth metal in the oxide measured by SIMS is set lower than or equal to $1\times10^{18}$ atoms/cm$^3$, preferably lower than or equal to $2\times10^{16}$ atoms/cm$^3$.

When the oxide contains nitrogen, the oxide easily becomes n-type by generation of electrons serving as carriers and an increase of carrier density. Thus, a transistor in which an oxide containing nitrogen is used as a semiconductor is likely to have normally-on characteristics. For this reason, nitrogen in the oxide is preferably reduced as much as possible. For example, the nitrogen concentration in the oxide measured by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide that contains hydrogen is likely to have normally-on characteristics. Accordingly, it is preferred that hydrogen in the oxide be reduced as much as possible. Specifically, the hydrogen concentration in the oxide measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide with sufficiently reduced impurity concentration is used for a channel region in a transistor, the transistor can have stable electrical characteristics.

Figure 28A:
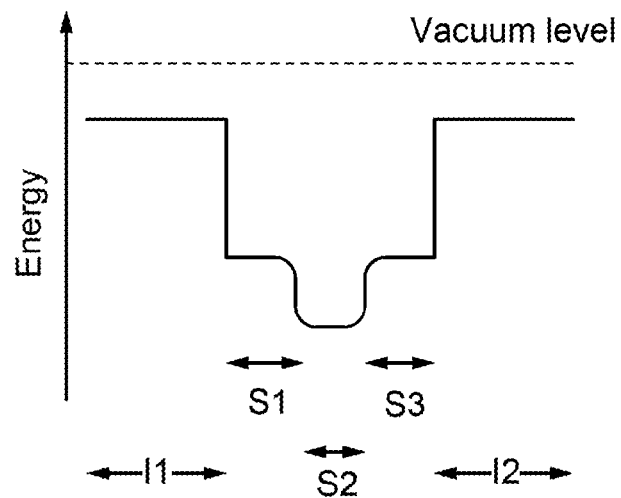
FIGS. 28A to 28C are each a band diagram of a layered structure including an oxide semiconductor.
Figure 28B:
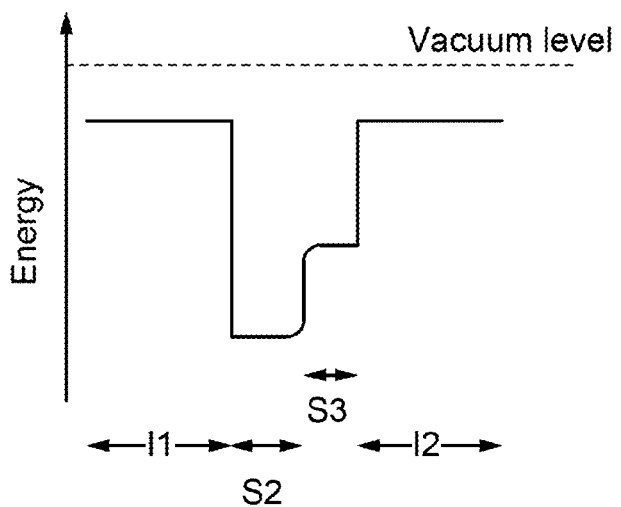
Figure 28C:
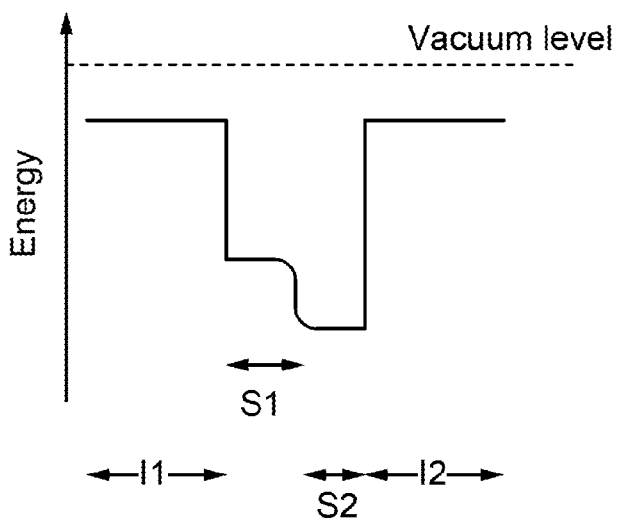

Next, the case where the oxide has a two-layer structure or a three-layer structure will be described. With reference to FIGS. 28A to 28C, the description is made on a band diagram of a layered structure of an oxide S1, an oxide S2, and an oxide S3 and insulators that are in contact with the layered structure of an oxide S1, an oxide S2, and an oxide S3; a layered structure of the oxide S1 and the oxide S2 and insulators that are in contact with the layered structure of the oxide S1 and the oxide S2; and a band diagram of a layered structure of the oxide S2 and the oxide S3 and insulators that are in contact with a layered structure of the oxide S2 and the oxide S3.

FIG. 28A is an example of a band diagram of a layered structure including an insulator I1, the oxide S1, the oxide S2, the oxide S3, and an insulator I2 in the thickness direction. FIG. 28B is an example of a band diagram of a layered structure including the insulator I1, the oxide S2, the oxide S3, and the insulator I2 in the thickness direction. FIG. 28C is an example of a band diagram of a layered structure including the insulator I1, the oxide S1, the oxide S2, and the insulator I2 in the thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in the energy level of the conduction band minimum between the oxide S2 and each of the oxides S1 and S3 is preferably greater than or equal to 0.15 eV or greater than or equal to 0.5 eV, and less than or equal to 2 eV or less than or equal to 1 eV. That is, the difference in the electron affinity between the oxide S2 and each of the oxides S1 and S3 is preferably greater than or equal to 0.15 eV or greater than or equal to 0.5 eV, and less than or equal to 2 eV or less than or equal to 1 eV.

As illustrated in FIGS. 28A to 28C, the energy level of the conduction band minimum of each of the oxides S1 to S3 is gradually varied. In other words, the energy level of the conduction band minimum is continuously varied or continuous junction is formed. To obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, when the oxide S2 is an In—Ga—Zn oxide, it is preferable to use an In—Ga—Zn oxide, a Ga—Zn oxide, gallium oxide, or the like as the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and a high on-state current can be obtained.

When an electron is trapped in a trap state, the trapped electron behaves like fixed charge; thus, the threshold voltage of a transistor is shifted in the positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. Accordingly, the oxide S2, the interface between the oxides S1 and S2, and the interface between the oxides S2 and S3 mainly function as a channel region. For example, an oxide with high insulation performance and the atomic ratio represented by the region C in FIG. 26C can be used as the oxides S1 and S3. Note that the region C in FIG. 26C represents the atomic ratio [In]:[M]:[Zn] of 0:1:0 or around 0:1:0.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

One of a conductor 240a and a conductor 240b functions as a source electrode, and the other functions as a drain electrode.

The conductor 240a and the conductor 240b are formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. For example, the conductor 240a and the conductor 240b can have any of the following structures: a single-layer structure of an aluminum film containing silicon, a two-layer structure in which a tantalum film or a tantalum nitride film is stacked, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

An insulator 250 can have a single-layer structure or a stacked-layer structure using an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), (Ba, Sr)$TiO_3$ (BST), or the like. Aluminum oxide, bismuth oxide, germanium oxide, niobium oxide, silicon oxide, titanium oxide, tungsten oxide, yttrium oxide, or zirconium oxide, for example, may be added to the insulator. The insulator may be subjected to nitriding treatment. A layer of silicon oxide, silicon oxynitride, or silicon nitride may be stacked over the insulator.

Like the insulator 224, the insulator 250 is preferably an oxide insulator that contains oxygen in excess of that in the stoichiometric composition.

Note that the insulator 250 may have a stacked-layer structure similar to that of the insulator 220, the insulator 222, and the insulator 224. When the insulator 250 contains an insulator in which a necessary amount of electrons is trapped by electron trap states, the threshold voltage of the transistor 400 can be shifted in the positive direction. The transistor 400 having this structure is a normally-off transistor, which is in a non-conduction state (also referred to as off state) even when the gate voltage is 0 V.

A conductor 260 functioning as a gate electrode can be formed using a metal selected from aluminum, chromium, copper, tantalum, titanium, molybdenum, and tungsten, an alloy containing any of these metals as its component, or an alloy containing any of these metals in combination, for example. Furthermore, one or both of manganese and zirconium may be used. A semiconductor typified by polycrystalline silicon doped with an impurity element such as phosphorus, or a silicide such as nickel silicide may be used. For example, the conductor 260 can have any of the following structures: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order. Alternatively, an alloy film or a nitride film that contains aluminum and one or more elements selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked-layer structure using the above light-transmitting conductive material and the above metal.

An insulator 280 is preferably formed using an oxide material from which oxygen is partly released due to heating.

As the oxide material from which oxygen is released due to heating, an oxide containing oxygen in excess of that in the stoichiometric composition is preferably used. Part of oxygen is released by heating from an oxide film containing oxygen more than that in the stoichiometric composition. The oxide film containing oxygen in excess of that in the stoichiometric composition is an oxide film in which the amount of released oxygen converted into oxygen atoms is greater than or equal to $1.0 \times 10^{18}$ atoms/$cm^3$, preferably greater than or equal to $3.0 \times 10^{20}$ atoms/$cm^3$ in thermal desorption spectroscopy (TDS) analysis. Note that the temperature of the film surface in the TDS analysis preferably ranges from 100° C. to 700° C. or from 100° C. to 500° C.

As such a material, a material containing silicon oxide or silicon oxynitride is preferably used, for example. Alternatively, a metal oxide can be used. Note that in this specification, silicon oxynitride refers to a material that has a higher oxygen content than a nitrogen content, and silicon nitride oxide refers to a material that has a higher nitrogen content than an oxygen content.

The insulator 280 covering the transistor 400 may function as a planarization film that covers roughness thereunder.

An insulator 270 may be provided to cover the conductor 260. When the insulator 280 is formed using an oxide material from which oxygen is released, the insulator 270 is formed using a material with a barrier property with respect to oxygen to prevent the conductor 260 from being oxidized by the released oxygen. With this structure, oxidation of the conductor 260 can be prevented, and oxygen released from the insulator 280 can be efficiently supplied to the oxide 230.

An insulator 282 and an insulator 284 are sequentially stacked over the insulator 280. The conductor 244, a conductor 246a, a conductor 246b, and the like are embedded in the insulator 280, the insulator 282, and the insulator 284. The conductor 244 functions as a plug or a wiring that is electrically connected to the capacitor 300 or the transistor 500. Each of the conductors 246a and 246b functions as a plug or a wiring that is electrically connected to the capacitor 300 or the transistor 400.

A material with a barrier property with respect to oxygen or hydrogen is preferably used for one or both of the insulator 282 and the insulator 284. Accordingly, oxygen released from the interlayer film around the transistor 400 can be efficiently diffused into the transistor 400.

The capacitor 300 is provided above the insulator 284.

The conductor 604 and a conductor 624 are provided over the insulator 602. The conductor 624 functions as a plug or a wiring that is electrically connected to the transistor 400 or the transistor 500.

The insulator 612 is provided over the conductor 604, and the conductor 616 is provided over the insulator 612. The conductor 616 covers a side surface of the conductor 604 with the insulator 612 placed therebetween. That is, a capacitance is formed also on the side surface of the conductor 604, so that the capacitance per projected area of the capacitor can be increased. Thus, the semiconductor device can be reduced in area, highly integrated, and miniaturized.

Note that the insulator 602 is provided at least in a region overlapped by the conductor 604. For example, as in a capacitor 300A illustrated in FIG. 25B, the insulator 602 may be provided only in regions overlapped by the conductor 604 or the conductor 624 so that the insulator 602 is in contact with the insulator 612.

An insulator 620 and an insulator 622 are sequentially stacked over the conductor 616. A conductor 626 and a conductor 628 are embedded in the insulator 620, the insulator 622, and the insulator 602. Each of the conductors 626 and the conductor 628 functions as a plug or a wiring that is electrically connected to the transistor 400 or the transistor 500.

The insulator 620 covering the capacitor 300 may function as a planarization film that covers roughness thereunder.

The above is the description of the structure example.

[Example of Manufacturing Method]

An example of a method for manufacturing the semiconductor device shown in the above structure example will be described below with reference to FIG. 29A to FIG. 35.

First, the substrate 301 is prepared. A semiconductor substrate is used as the substrate 301. For example, a single crystal silicon substrate (including a p-type semiconductor substrate or an n-type semiconductor substrate) or a compound semiconductor substrate containing silicon carbide or gallium nitride can be used. An SOI substrate may alternatively be used as the substrate 301. The case where a single crystal silicon is used as the substrate 301 is described below.

Next, an element isolation layer is formed in the substrate 301. The element isolation layer can be formed by a local oxidation of silicon (LOCOS) method, a shallow trench isolation (STI) method, or the like.

When a p-channel transistor and an n-channel transistor are formed on one substrate, an n-well or a p-well may be formed in part of the substrate 301. For example, a p-well may be formed by adding an impurity element that imparts p-type conductivity (e.g., boron) to an n-type substrate 301, and an n-channel transistor and a p-channel transistor may be formed on the same substrate.

Then, an insulator to be the insulator 304 is formed on the substrate 301. For example, after surface nitriding treatment, oxidizing treatment may be performed to oxidize the interface between silicon and silicon nitride, whereby a silicon oxynitride film may be formed. For example, a silicon oxynitride film is obtained by performing oxygen radical oxidation after a thermal silicon nitride film is formed on the surface of the substrate 301 at 700° C. in an NH$_3$ atmosphere.

The insulator may be formed by a sputtering method, a chemical vapor deposition (CVD) method (including a thermal CVD method, a metal organic CVD (MOCVD) method, and a plasma-enhanced CVD (PECVD) method), a molecular beam epitaxy (MBE) method, an atomic layer deposition (ALD) method, a pulsed laser deposition (PLD) method, or the like.

Then, a conductive film to be the conductor 306 is formed. It is preferred that the conductive film be formed using a metal selected from tantalum, tungsten, titanium, molybdenum, chromium, niobium, and the like, or an alloy material or a compound material containing any of the metals as its main component. Alternatively, polycrystalline silicon to which an impurity such as phosphorus is added can be used. Further alternatively, a stacked-layer structure of a film of a metal nitride and a film of any of the above metals may be used. As a metal nitride, tungsten nitride, molybdenum nitride, or titanium nitride can be used. When the metal nitride film is provided, adhesiveness of the metal film can be increased; thus, separation can be prevented. Note that the threshold voltage of the transistor 500 can be adjusted by determining a work function of the conductor 306, and therefore, a material of the conductive film is selected as appropriate in accordance with the characteristics that the transistor 500 needs to have.

The conductive film can be formed by a sputtering method, an evaporation method, a CVD method (including a thermal CVD method, an MOCVD method, and a PECVD method), or the like. A thermal CVD method, an MOCVD method, or an ALD method is preferably used to reduce plasma damage.

Next, a resist mask is formed over the conductive film by a photolithography process or the like, and an unnecessary portion of the conductive film is removed. After that, the resist mask is removed, whereby the conductor 306 is formed.

Here, a method for processing a film is described. To process a film finely, a variety of fine processing techniques can be used. For example, it is possible to use a method in which a resist mask formed by a photolithography process or the like is subjected to slimming treatment. Alternatively, it is possible that a dummy pattern is formed by a photolithography process or the like, a sidewall is formed on the dummy pattern, the dummy pattern is then removed, and a film is etched using the remaining sidewall as a resist mask. In order to achieve a high aspect ratio, anisotropic dry etching is preferably used for film etching. Alternatively, a hard mask formed of an inorganic film or a metal film may be used.

As light used to form the resist mask, it is possible to use light with the i-line (wavelength: 365 nm), the g-line (wavelength: 436 nm), or the h-line (wavelength: 405 nm) or light in which the i-line, the g-line, and the h-line are mixed. Alternatively, ultraviolet light, KrF laser light, ArF laser light, or the like can be used. Light exposure may be performed by liquid immersion exposure technique. As the light for the exposure, extreme ultraviolet (EUV) light or X-rays may be used. Moreover, an electron beam can be used instead of the light for the exposure. It is preferable to use EUV light, X-rays, or an electron beam because extremely minute processing can be performed. Note that a photomask is not needed in the case of performing exposure by scanning of a beam such as an electron beam.

An organic resin film having a function of improving the adhesion between a film to be processed and a resist film may be formed before the resist film serving as a resist mask is formed. The organic resin film can be formed by a spin coating method or the like to planarize a surface by covering a step under the film, and thus can reduce variation in thickness of the resist mask over the organic resin film. For fine processing in particular, a material serving as a film preventing reflection of light for the exposure is preferably used for the organic resin film. An example of the organic resin film having such a function includes a bottom anti-reflective coating (BARC) film. The organic resin film can be removed at the same time as the removal of the resist mask or after the removal of the resist mask.

After the conductor 306 is formed, a sidewall covering a side surface of the conductor 306 may be formed. The sidewall can be formed in such a manner that an insulator thicker than the conductor 306 is formed and subjected to anisotropic etching so that the insulator remains only on the side surface of the conductor 306.

The insulator to be the insulator 304 is etched concurrently with the formation of the sidewall, whereby the insulator 304 is formed under the conductor 306 and the sidewall. Alternatively, the insulator 304 may be formed by etching the insulator with the conductor 306 or the resist mask for processing the conductor 306 used as an etching mask after the conductor 306 is formed. In this case, the insulator 304 is formed under the conductor 306. Further alternatively, the insulator can be used as the insulator 304 without being processed by etching.

Then, an element that imparts n-type conductivity (e.g., phosphorus) or an element that imparts p-type conductivity (e.g., boron) is added to a region of the substrate 301 where the conductor 306 (and the sidewall) is not provided.

Subsequently, the insulator 320 is formed, and then heat treatment is performed to activate the aforementioned element that imparts conductivity.

The insulator 320 is formed with a single-layer structure or a stacked-layer structure using silicon oxide, silicon oxynitride, silicon nitride oxide, silicon nitride, aluminum oxide, aluminum oxynitride, aluminum nitride oxide, or aluminum nitride, for example. The insulator 320 is preferably formed using silicon nitride containing oxygen and hydrogen (SiNOH) because the amount of hydrogen released by heating can be increased. The insulator 320 can also be formed using silicon oxide with high step coverage that is formed by reacting tetraethyl orthosilicate (TEOS), silane, or the like with oxygen, nitrous oxide, or the like.

The insulator 320 can be formed by a sputtering method, a CVD method (including a thermal CVD method, an MOCVD method, and a PECVD method), an MBE method, an ALD method, or a PLD method, for example. In particular, the insulator is formed preferably by a CVD method, more preferably a PECVD method because coverage can be further improved. A thermal CVD method, an MOCVD method, or an ALD method is preferably used to reduce plasma damage.

The heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the transistor 500 is completed.

Figure 29A:
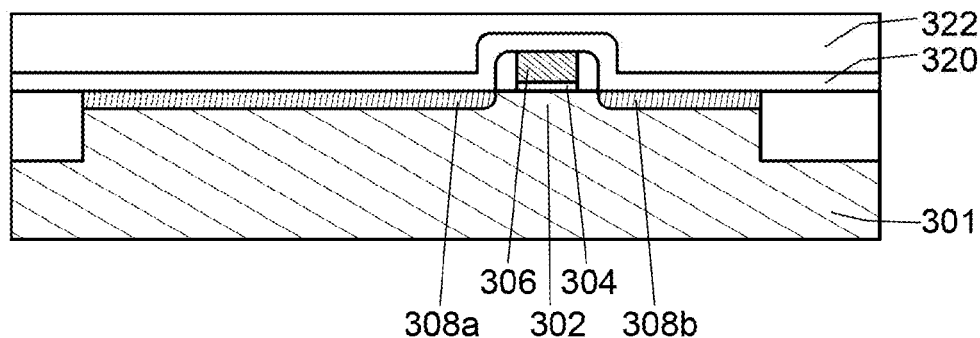
FIGS. 29A to 29D illustrate an example of a method for manufacturing a semiconductor device.

Subsequently, the insulator 322 is formed over the insulator 320. The insulator 322 can be formed using a material and a method similar to those used for forming the insulator 320. Moreover, the top surface of the insulator 322 is planarized by a CMP method or the like (FIG. 29A).

Figure 29B:
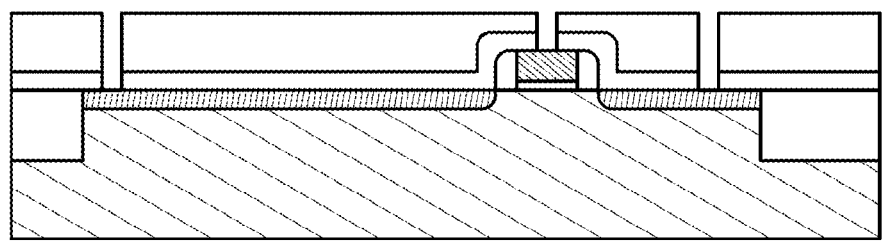
Figure 29C:
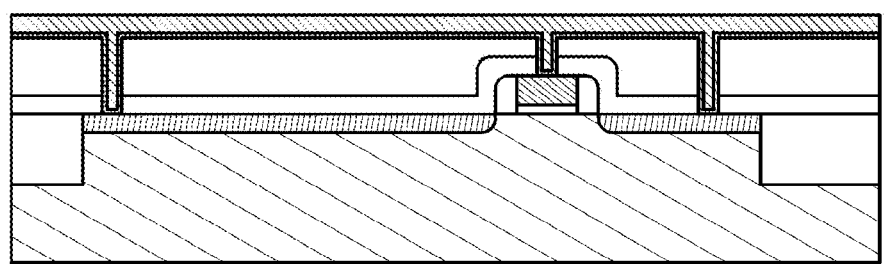

Then, openings that reach the low-resistance region 308a, the low-resistance region 308b, the conductor 306, and the like are formed in the insulator 320 and the insulator 322 (FIG. 29B). After that, a conductive film is formed to fill the openings (see FIG. 29C). The conductive film can be formed by a sputtering method, a CVD method (including a thermal CVD method, an MOCVD method, and a PECVD method), an MBE method, an ALD method, or a PLD method, for example.

Figure 29D:
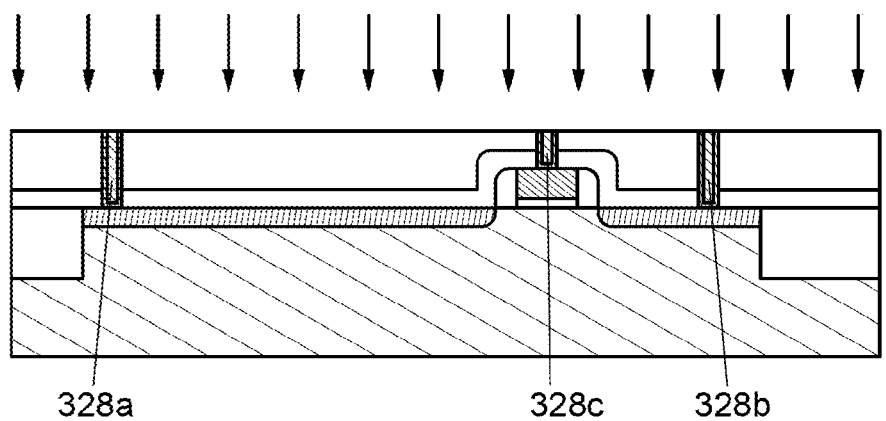

Next, planarization treatment is performed on the conductive film to expose the top surface of the insulator 322, whereby a conductor 328a, a conductor 328b, a conductor 328c, and the like are formed (FIG. 29D). Note that arrows in FIG. 29D represent CMP treatment. In the specification and the drawings, the conductor 328a, the conductor 328b, and the conductor 328c each function as a plug or a wiring and are collectively referred to as "conductor 328" in some cases. Note that in this specification, conductors functioning as a plug or a wiring are treated in a similar manner.

Figure 30A:
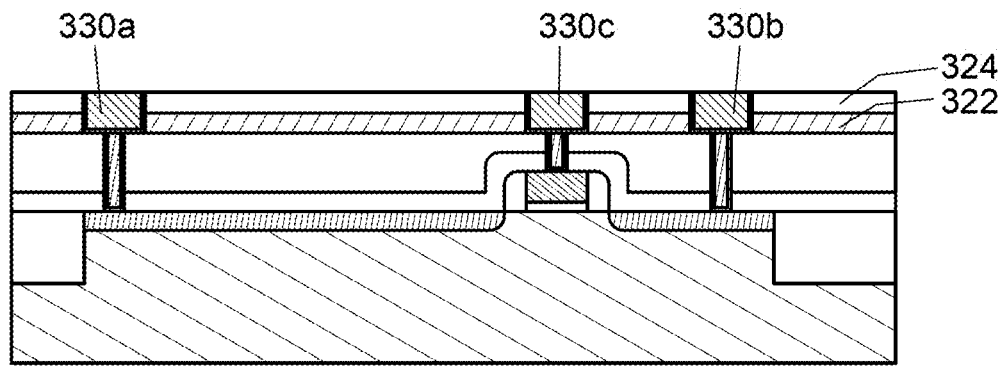
FIGS. 30A to 30C illustrate an example of a method for manufacturing a semiconductor device.

After the insulator 322 and the insulator 324 are formed over the insulator 320, a conductor 330a, a conductor 330b, and a conductor 330c are formed by a damascene process or the like (FIG. 30A). The insulator 322 and the insulator 324 can be formed using a material and a method similar to those used for forming the insulator 320. A conductive film to be the conductor 330 can be formed using a material and a method similar to those used for forming the conductor 328.

Figure 30B:
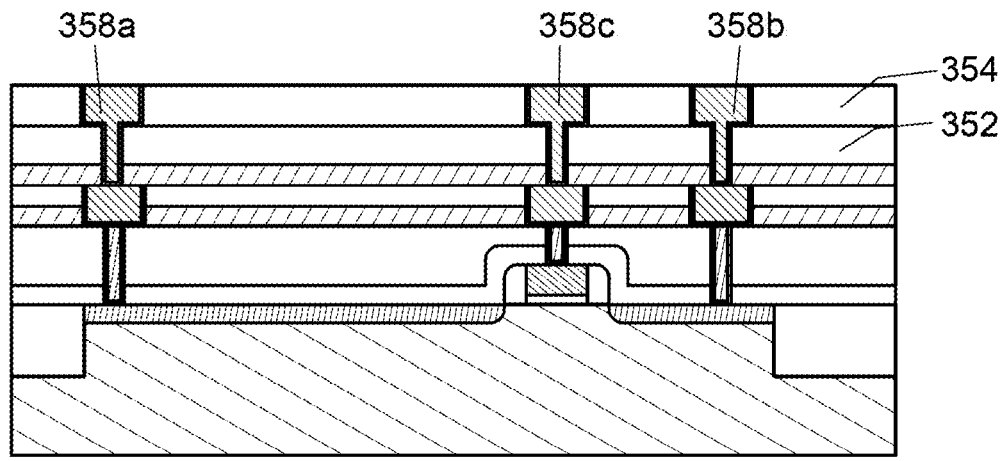

Then, the insulator 352 and the insulator 354 are formed, and after that, a conductor 358a, a conductor 358b, and a conductor 358c are formed in the insulator 352 and the insulator 354 by a dual damascene process or the like (FIG. 30B). The insulator 352 and the insulator 354 can be formed using a material and a method similar to those used for forming the insulator 320. A conductive film to be the conductor 358 can be formed using a material and a method similar to those used for forming the conductor 328.

Next, the transistor 400 is formed in the following manner. After the insulator 210 is formed, the insulator 212 and the insulator 214 that have a barrier property against hydrogen or oxygen are formed. The insulator 210 can be formed using a material and a method similar to those used for forming the insulator 320.

The insulator 212 and the insulator 214 can be formed by a sputtering method, a CVD method (including a thermal CVD method, an MOCVD method, and a PECVD method), an MBE method, an ALD method, or a PLD method, for example. In particular, when the insulator 212 or the insulator 214 is formed by an ALD method, it is possible to form a dense insulator that includes a small number of defects such as cracks or pinholes or has a uniform thickness.

Figure 30C:
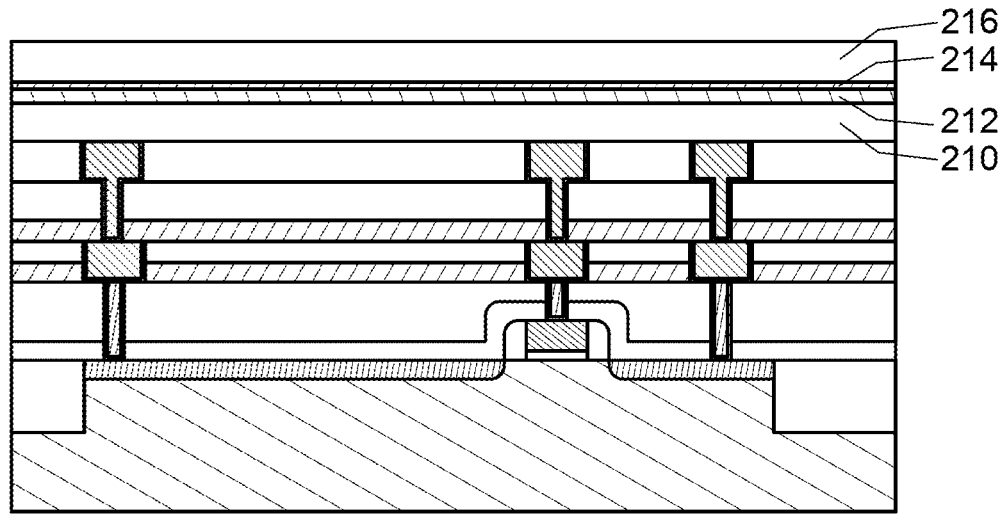

Then, the insulator 216 is formed over the insulator 214. The insulator 216 can be formed using a material and a method similar to those used for forming the insulator 210 (FIG. 30C).

Figure 31A:
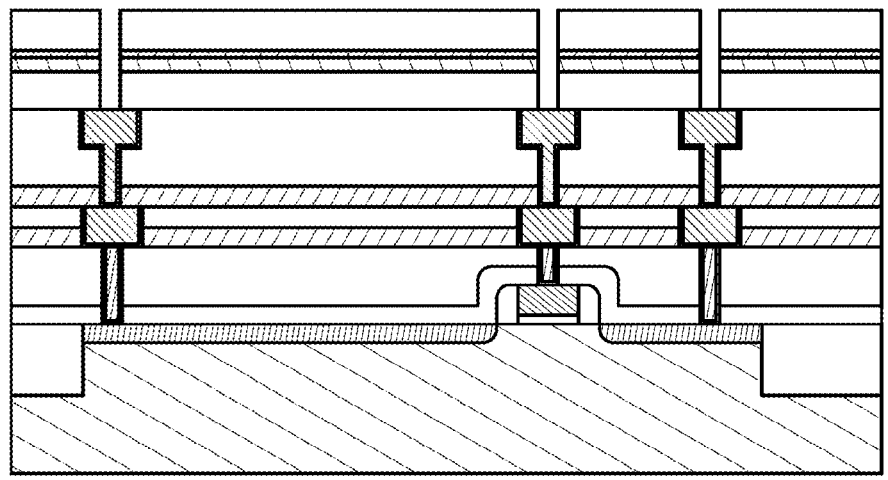
FIGS. 31A to 31C illustrate an example of a method for manufacturing a semiconductor device.

Next, openings that reach the conductor 358a, the conductor 358b, the conductor 358c, and the like are formed in the insulator 210, the insulator 212, the insulator 214, and the insulator 216 (FIG. 31A).

Figure 31B:
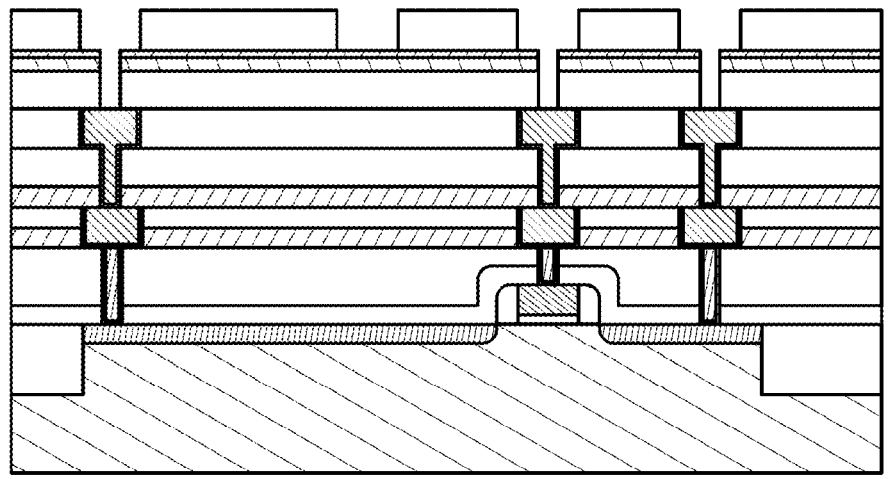

Subsequently, an opening is formed in a region of the insulator 216 where the gate electrode of the transistor 400 is to be formed. At this time, the openings that have been formed in the insulator 216 may be widened (FIG. 31B). By widening the openings formed in the insulator 216, an adequate design margin for plugs or wirings to be formed in a later step can be provided.

Figure 31C:
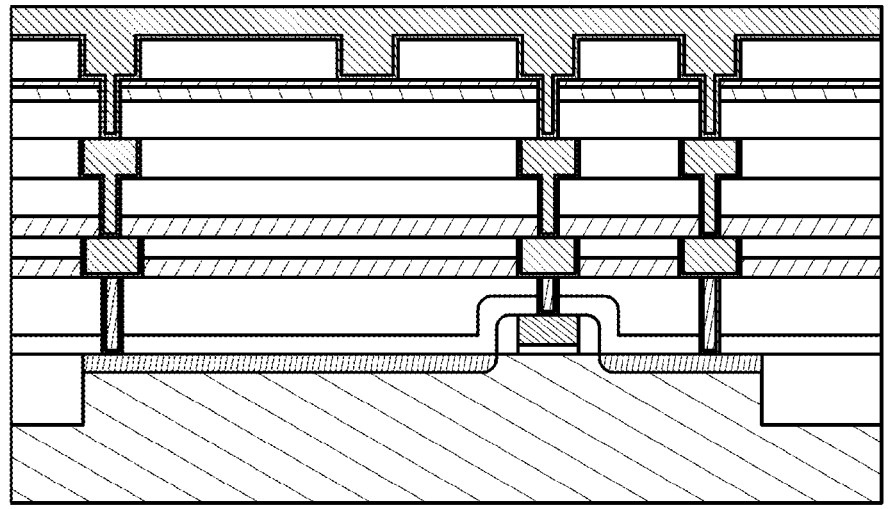
Figure 32A:
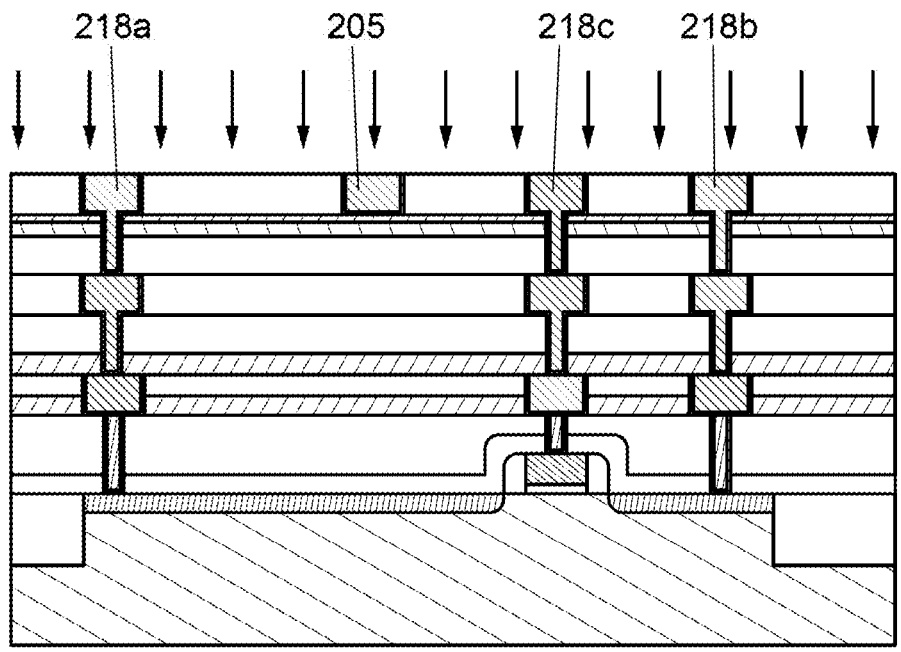
FIGS. 32A and 32B illustrate an example of a method for manufacturing a semiconductor device.

After that, a conductive film is formed to fill the openings (see FIG. 31C). The conductive film can be formed using a material and a method similar to those used for forming the conductor 328. Then, planarization treatment is performed on the conductive film to expose a top surface of the insulator 216, whereby a conductor 218a, a conductor 218b, a conductor 218c, and the conductor 205 are formed (FIG. 32A). Note that arrows in FIG. 32A represent CMP treatment.

Then, the insulator 220, the insulator 222, and the insulator 224 are formed. The insulator 220, the insulator 222, and the insulator 224 can be formed using a material and a method similar to those used for forming the insulator 210. It is particularly preferable to use a high-k material as the insulator 222.

Next, an oxide to be the oxide 230a and an oxide to be the oxide 230b are sequentially formed. The oxides are preferably formed successively without exposure to the air.

After the oxide to be the oxide 230b is formed, heat treatment is preferably performed. The heat treatment is performed at a temperature ranging from 250° C. to 650° C., preferably from 300° C. to 500° C. in an inert gas atmosphere, an atmosphere containing an oxidizing gas at 10 ppm or more, or a reduced-pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate released oxygen. The heat treatment may be performed directly after the formation of the oxide to be the oxide 230b or may be performed after the oxide to be the oxide 230b is processed into an island shape. By the heat treatment, oxygen can be supplied from the insulator formed under the oxide 230a to the oxide 230a and the oxide 230b, so that oxygen vacancies in the oxides can be reduced.

Then, a conductive film to be the conductor 240a and the conductor 240b is formed over the oxide to be the oxide 230b. Subsequently, a resist mask is formed by a method similar to that described above, and an unnecessary portion of the conductive film is removed by etching. After that, unnecessary portions of the oxides are removed by etching using the conductive film as a mask. Then, the resist mask is removed. In this manner, a stack including the island-shaped oxide 230a, the island-shaped oxide 230b, and the island-shaped conductive film can be formed.

Subsequently, a resist mask is formed over the island-shaped conductive film by a method similar to that described above, and an unnecessary portion of the conductive film is removed by etching. Next, the resist mask is removed; thus, the conductor 240a and the conductor 240b are formed.

Then, an oxide to be the oxide 230c, an insulator to be the insulator 250, and a conductive film to be the conductor 260 are sequentially formed. Next, a resist mask is formed over the conductive film by a method similar to that described above, and an unnecessary portion of the conductive film is removed by etching, whereby the conductor 260 is formed.

Then, an insulator to be the insulator 270 is formed over the insulator to be the insulator 250 and the conductor 260. The insulator to be the insulator 270 is preferably formed using a material with barrier properties against hydrogen and oxygen. Then, a resist mask is formed over the insulator by a method similar to that described above, and unnecessary portions of the insulator to be the insulator 270, the insulator to be the insulator 250, and the oxide to be the oxide 230c are removed by etching. After that, the resist mask is removed. Thus, the transistor 400 is completed.

Next, the insulator 280 is formed. The insulator 280 is preferably formed using an oxide containing oxygen in excess of that in the stoichiometric composition. After an insulator to be the insulator 280 is formed, planarization treatment using a CMP method or the like may be performed to improve the planarity of a top surface of the insulator.

To make the insulator 280 contain excess oxygen, the insulator 280 can be formed in an oxygen atmosphere, for example. Alternatively, a region containing excess oxygen may be formed by introducing oxygen into the insulator 280 that has been formed. Both the methods may be used in combination.

For example, oxygen (at least including any of oxygen radicals, oxygen atoms, and oxygen ions) is introduced into the insulator 280 that has been formed, whereby a region containing excess oxygen is formed. Oxygen can be introduced by an ion implantation method, an ion doping method, a plasma immersion ion implantation method, plasma treatment, or the like.

A gas containing oxygen can be used for the oxygen introduction treatment. Examples of a gas containing oxygen include oxygen, dinitrogen monoxide, nitrogen dioxide, carbon dioxide, and carbon monoxide. In the oxygen introduction treatment, a rare gas may be contained in the gas containing oxygen. For example, a mixed gas of carbon dioxide, hydrogen, and argon can be used.

An example of the oxygen introduction treatment is a method of stacking an oxide over the insulator 280 using a sputtering apparatus. For example, when the insulator 282 is formed in an oxygen gas atmosphere with a sputtering apparatus, oxygen can be introduced into the insulator 280 while the insulator 282 is formed.

Next, the insulator 284 is formed. The insulator 284 can be formed using a material and a method similar to those used for forming the insulator 210. The insulator 284 is preferably formed using aluminum oxide with a barrier property against oxygen or hydrogen, for example. In particular, when the insulator 284 is formed by an ALD method, it is possible to form a dense insulator that includes a small number of defects such as cracks or pinholes or has a uniform thickness.

Figure 32B:
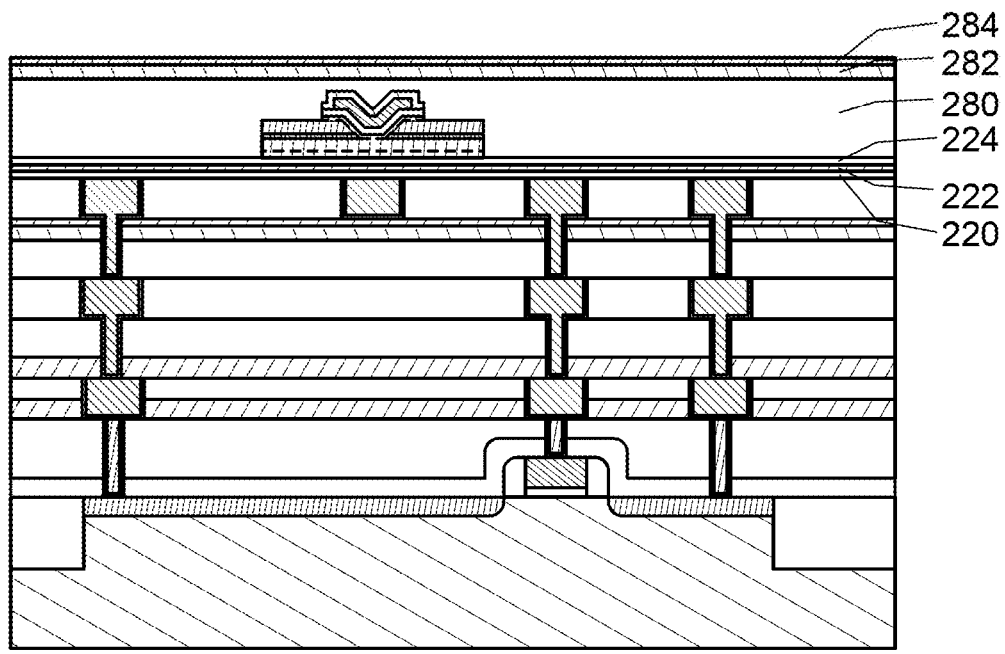

By stacking the insulator 284 having dense film quality over the insulator 282, excess oxygen introduced into the insulator 280 can be effectively sealed on the transistor 400 side (FIG. 32B).

Next, the capacitor 300 is formed in the following manner. First, the insulator 602 is formed over the insulator 284. The insulator 602 can be formed using a material and a method similar to those used for forming the insulator 210.

Then, openings that reach the conductor 218a, the conductor 218b, the conductor 218c, the conductor 240a, the conductor 240b, and the like are formed in the insulator 220, the insulator 222, the insulator 224, the insulator 280, the insulator 282, and the insulator 284.

After that, a conductive film is formed to fill the openings, and planarization treatment is performed on the conductive film to expose a top surface of the insulator 216. Thus, a conductor 244a, a conductor 244b, a conductor 244c, the conductor 246a, and the conductor 246b are formed. The conductive film can be formed using a material and a method similar to those used for forming the conductor 328.

Figure 33A:
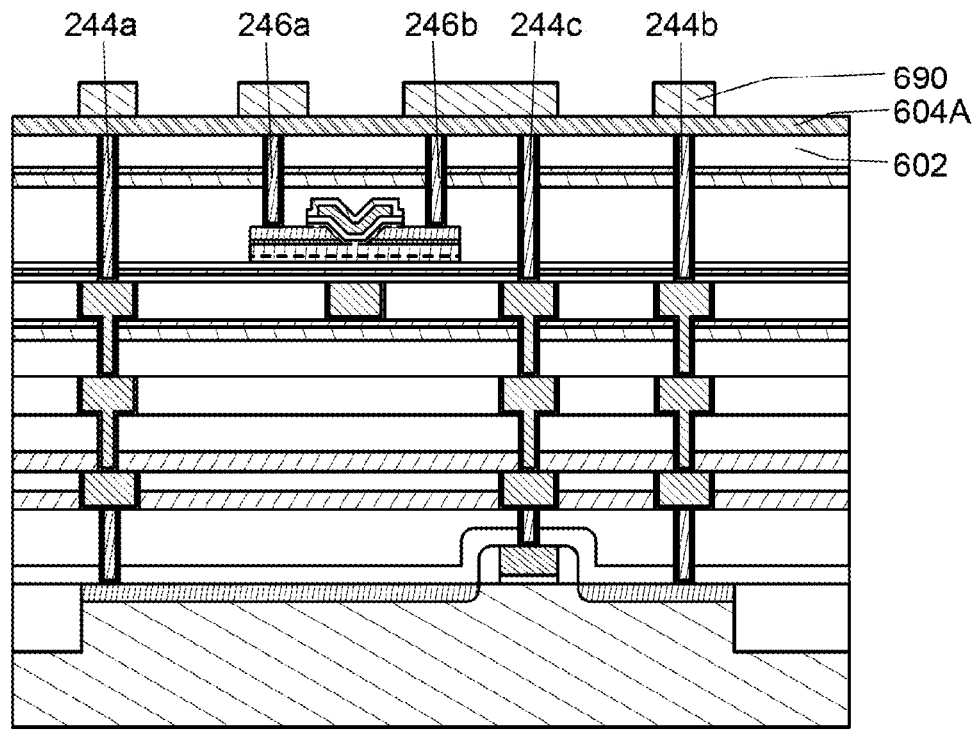
FIGS. 33A and 33B illustrate an example of a method for manufacturing a semiconductor device.

Next, a conductive film 604A is formed over the insulator 602. The conductive film 604A can be formed using a material and a method similar to those used for forming the conductor 328. Then, a resist mask 690 is formed over the conductive film 604A (FIG. 33A).

Figure 33B:
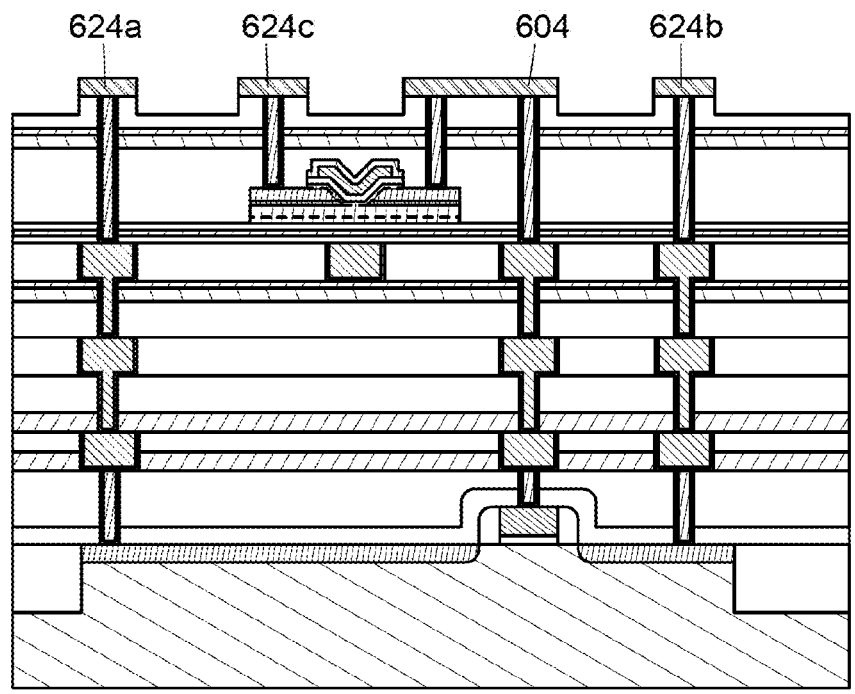

A conductor 624a, a conductor 624b, a conductor 624c, and the conductor 604 are formed by etching the conductive film 604A. Over-etching is performed as this etching treatment, whereby part of the insulator 602 can be removed at the same time (FIG. 33B). The depth of the removed portion of the insulator 602 needs to be larger than the thickness of the insulator 612 that is formed later. Formation of the conductor 604 with over-etching enables etching without an etching residue.

By switching the types of etching gases during the etching treatment, part of the insulator 602 can be removed efficiently.

As an alternative example, after the conductor 604 is formed, the resist mask 690 may be removed and part of the insulator 602 may be removed using the conductor 604 as a hard mask.

After the conductor 604 is formed, a surface of the conductor 604 may be subjected to cleaning treatment. By the cleaning treatment, an etching residue or the like can be removed.

Figure 25A:
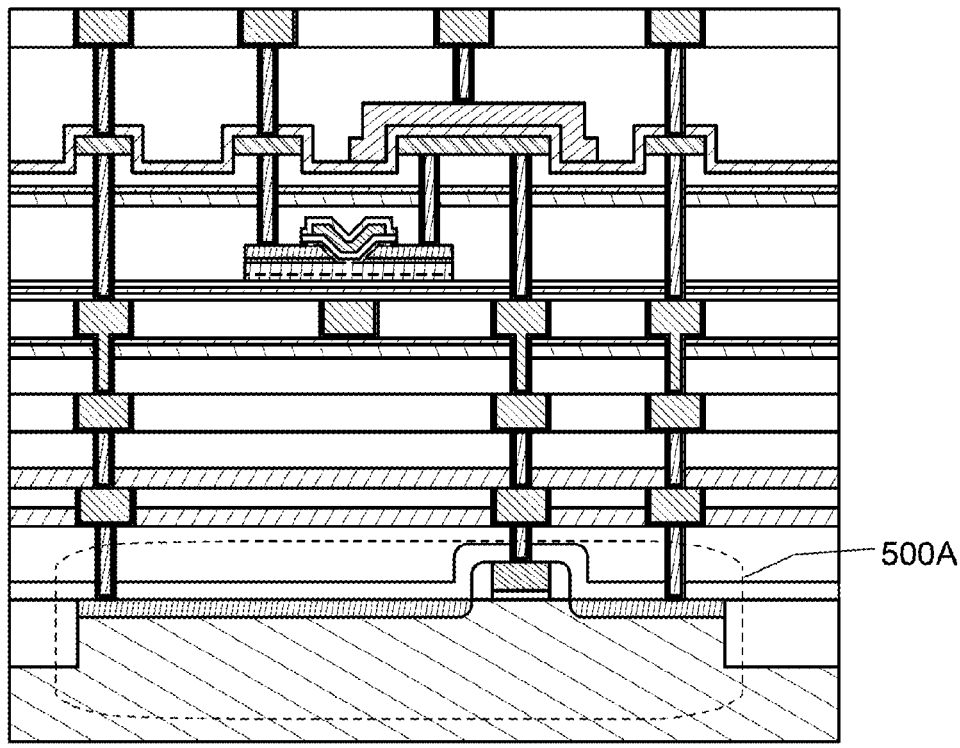
FIGS. 25A and 25B each illustrate an example of a schematic cross-sectional diagram.
Figure 25B:
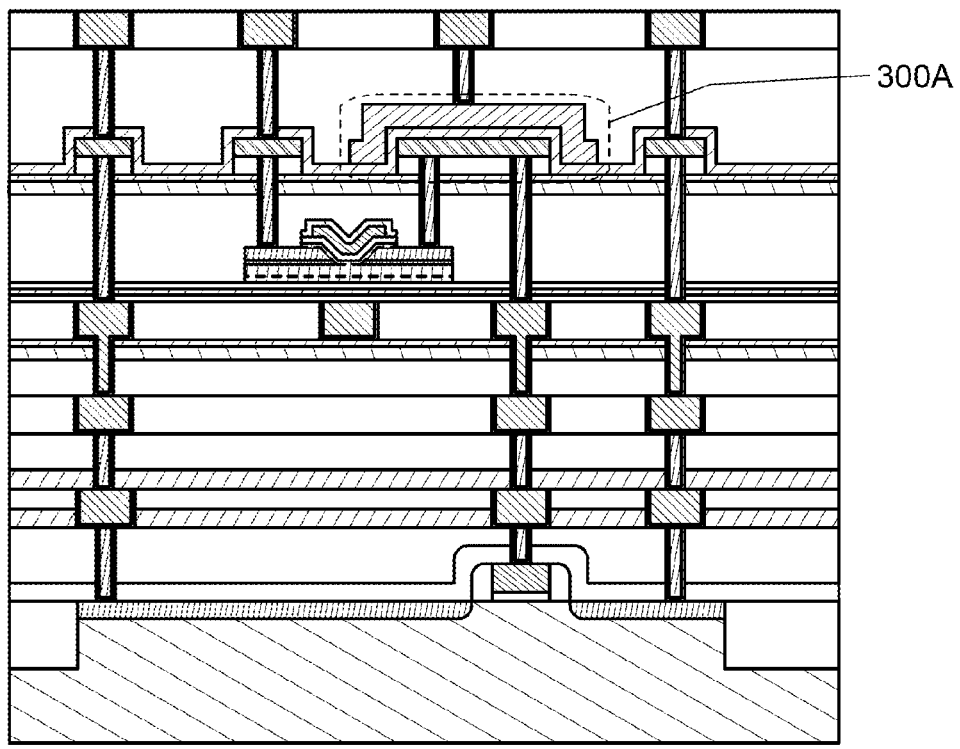

When the insulator 602 and the insulator 284 are films of different types, the insulator 284 may serve as an etching stopper film. In this case, the insulator 602 is formed in regions overlapped by the conductor 624 or the conductor 604 as illustrated in FIG. 25B.

Figure 34A:
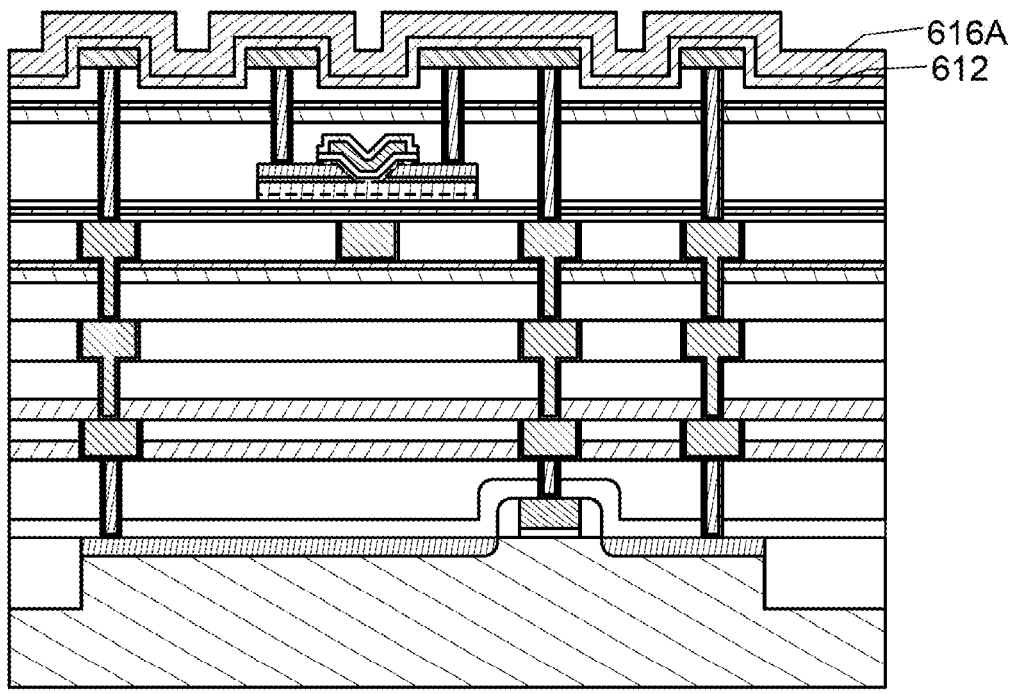
FIGS. 34A and 34B illustrate an example of a method for manufacturing a semiconductor device.

Then, the insulator 612 that covers the side surface and the top surface of the conductor 604 is formed (FIG. 34A). The insulator 612 has a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, the insulator 612 preferably has a stacked-layer structure of a high-k material (e.g., aluminum oxide) and a material with high dielectric strength (e.g., silicon oxynitride). Such a structure enables the capacitor 300 to have sufficient capacitance due to the high-k material and increased dielectric strength due to the material with high dielectric strength. Thus, the capacitor 300 can be prevented from being damaged by electrostatic discharge, which leads to improvement in the reliability of the capacitor 300.

Then, a conductive film 616A is formed over the insulator 612 (FIG. 34A). The conductive film 616A can be formed using a material and a method similar to those used for forming the conductor 604. Subsequently, a resist mask is formed over the conductive film 616A, and an unnecessary portion of the conductive film 616A is removed by etching. After that, the resist mask is removed, whereby the conductor 616 is formed.

Figure 34B:
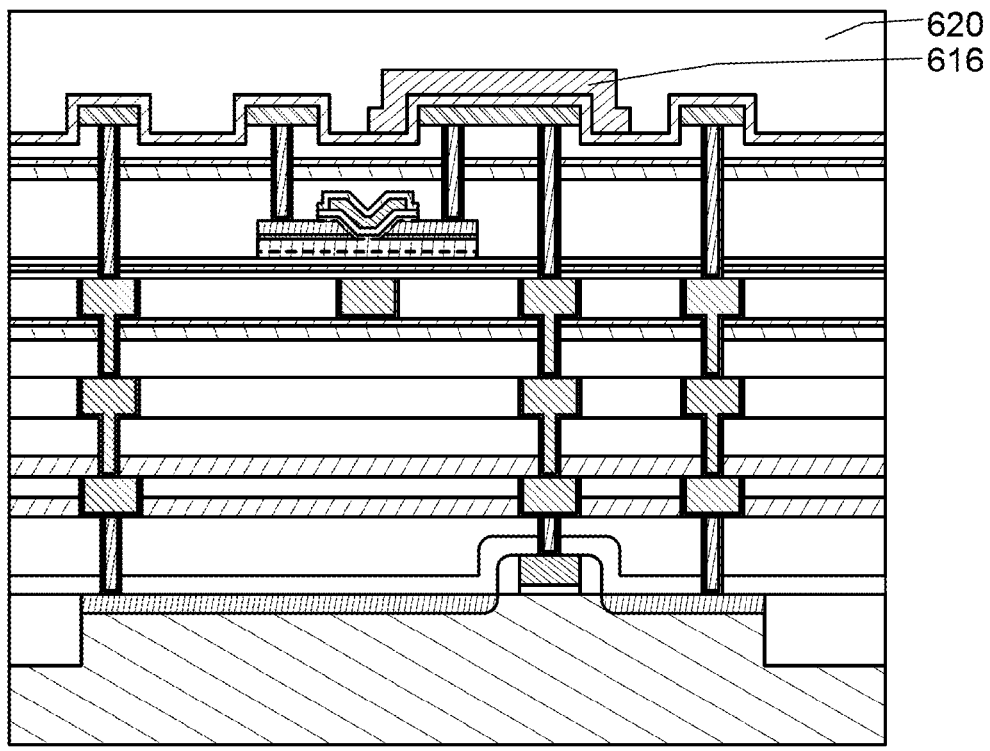

Then, the insulator 620 covering the capacitor 300 is formed (FIG. 34B). An insulator to be the insulator 620 can be formed using a material and a method similar to those used for forming the insulator 602 and the like.

Next, openings that reach the conductor 624a, the conductor 624b, the conductor 624c, the conductor 604, and the like are formed in the insulator 620.

Then, a conductive film is formed to fill the openings, and planarization treatment is performed on the conductive film to expose a top surface of the insulator 620. Thus, a conductor 626a, a conductor 626b, a conductor 626c, and a conductor 626d are formed. Note that the conductive film can be formed using a material and a method similar to those used for forming the conductor 244.

Subsequently, a conductive film to be the conductor 626 is formed. The conductive film can be formed by a sputtering method, a CVD method (including a thermal CVD method, an MOCVD method, and a PECVD method), an MBE method, an ALD method, a PLD method, or others. In particular, the conductive film is formed preferably by a CVD method, more preferably a PECVD method because coverage can be further improved. A thermal CVD method, an MOCVD method, or an ALD method is preferably used to reduce plasma damage.

The conductive film to be the conductor 626 can be formed using, for example, a metal selected from aluminum, chromium, copper, tantalum, titanium, molybdenum, and tungsten; an alloy containing any of these metals as a component; or an alloy containing any of these metals in combination. Moreover, one or both of manganese and zirconium may be used. A semiconductor typified by polycrystalline silicon doped with an impurity element (e.g., phosphorus) or a silicide such as nickel silicide may be used. For example, the conductive film can have any of the following structures: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order. Alternatively, an alloy film or a nitride film that contains aluminum and one or more elements selected from titanium, tantalum, tungsten, molybdenum, chromium, neodymium, and scandium may be used.

Next, a resist mask is formed over the conductive film to be the conductor 626 by a method similar to that described above, and an unnecessary portion of the conductive film is removed by etching. Then, the resist mask is removed, whereby the conductor 626a, the conductor 626b, the conductor 626c, and the conductor 626d are formed.

Figure 35:
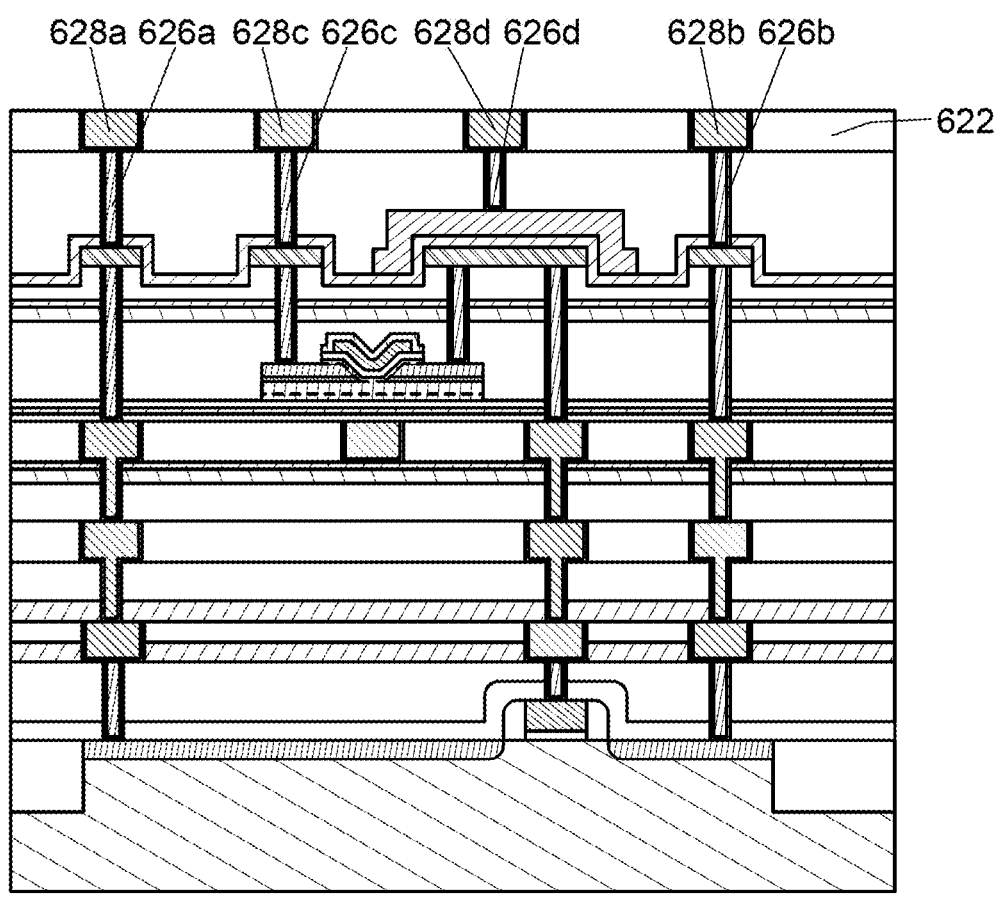
FIG. 35 illustrates an example of a method for manufacturing a semiconductor device.

Then, the insulator 622 is formed over the insulator 620 (FIG. 35). The insulator 622 can be formed using a material and a method similar to those used for forming the insulator 602 and the like.

Next, openings that reach the conductor 626a, the conductor 626b, the conductor 626c, and the conductor 626d are formed in the insulator 622.

Then, a conductive film is formed to fill the openings, and planarization treatment is performed on the conductive film to expose a top surface of the insulator 622; thus, a conductor 628a, a conductor 628b, a conductor 628c, and a conductor 628d are formed. Note that the conductive film can be formed using a material and a method similar to those used for forming the conductor 244.

Through the above steps, the semiconductor device in one embodiment of the present invention can be manufactured.

At least part of this embodiment can be implemented in combination with any of the other embodiments described in this specification as appropriate.

(Embodiment 4)

In this embodiment, application examples of the semiconductor device described in the foregoing embodiment to a display panel, an application example of a display module, and application examples of the display module to an electronic device will be described with reference to FIGS. 36A and 36B, FIG. 37, and FIGS. 38A to 38E.

<Examples of Mounting Semiconductor Device on Display Panel>

Application examples of a semiconductor device functioning as a source driver IC to a display panel will be described with reference to FIGS. 36A and 36B.

Figure 36A:
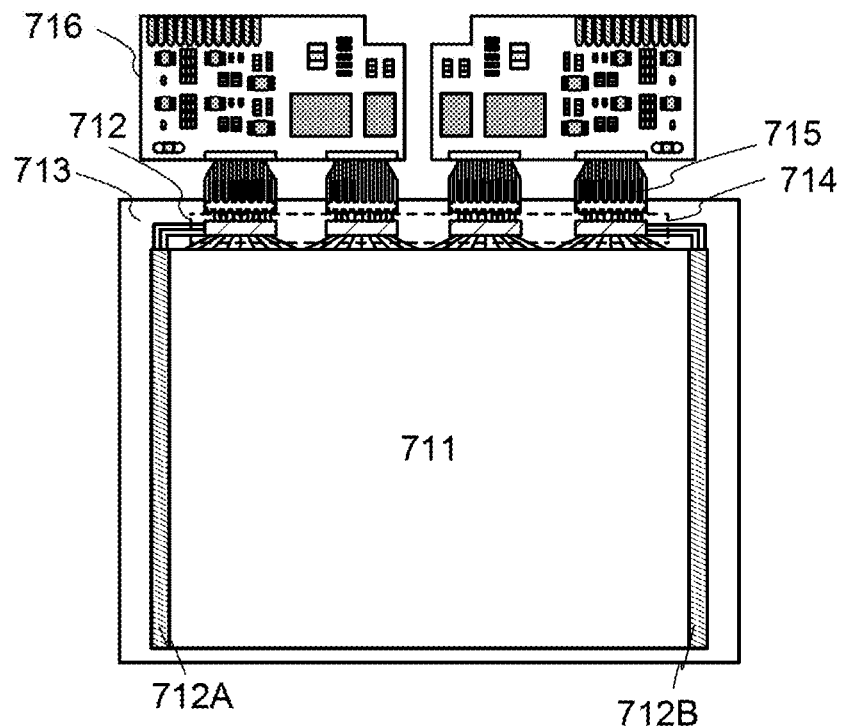
FIGS. 36A and 36B each illustrate an example of a display panel.

In the example of FIG. 36A, a source driver 712 and gate drivers 712A and 712B are provided around a display portion 711 of a display panel, and a source driver IC 714 including a semiconductor device is mounted on a substrate 713 as the source driver 712.

The source driver IC 714 is mounted on the substrate 713 using an anisotropic conductive adhesive and an anisotropic conductive film.

The source driver IC 714 is connected to an external circuit board 716 via an FPC 715.

Figure 36B:
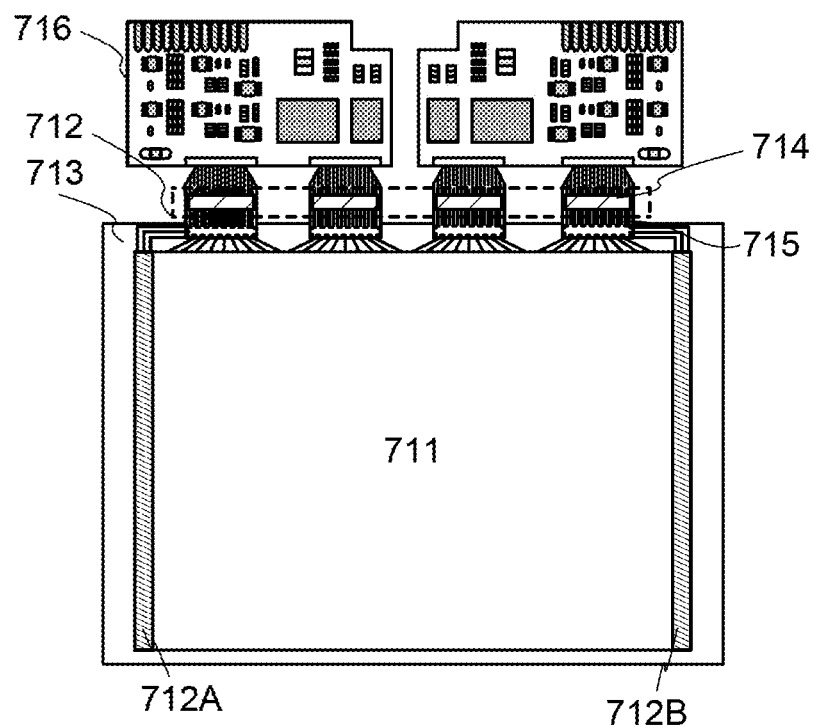

In the example of FIG. 36B, the source driver 712 and the gate drivers 712A and 712B are provided around the display portion 711, and the source driver IC 714 is mounted on the FPC 715 as the source driver 712.

Mounting the source driver IC 714 on the FPC 715 allows a larger display portion 711 to be provided over the substrate 713, resulting in a narrower frame.

<Application Example of Display Module>

Next, an application example of a display module using the display panel illustrated in FIG. 36A or FIG. 36B will be described with reference to FIG. 37.

Figure 37:
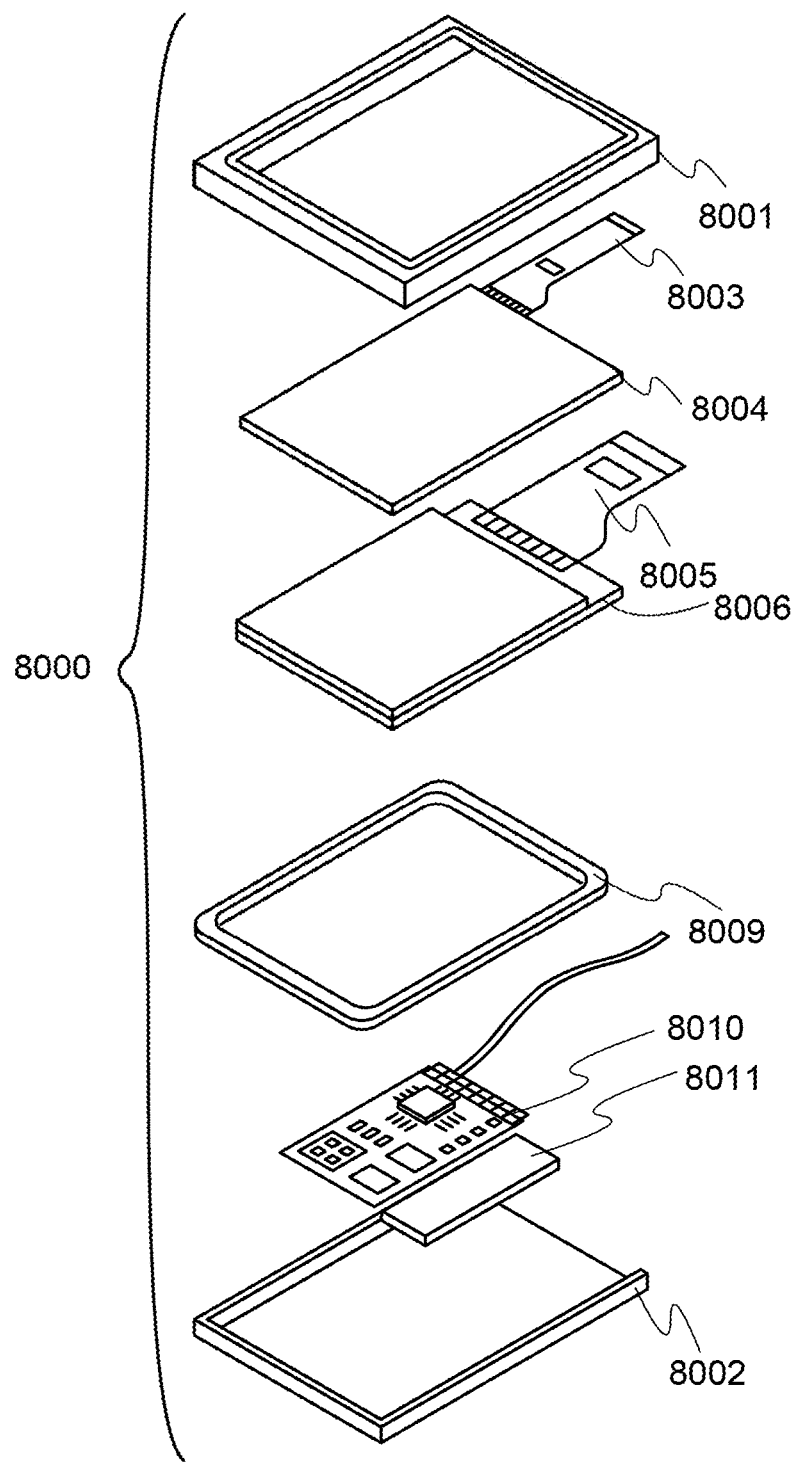
FIG. 37 illustrates an example of a display module.

In a display module 8000 in FIG. 37, a touch panel 8004 connected to an FPC 8003, a display panel 8006 connected to an FPC 8005, a frame 8009, a printed circuit board 8010, and a battery 8011 are provided between an upper cover 8001 and a lower cover 8002. Note that the battery 8011, the touch panel 8004, and the like are not provided in some cases.

The display panel illustrated in FIG. 36A or FIG. 36B can be used as the display panel 8006 in FIG. 37.

The shape and/or size of the upper cover 8001 and the lower cover 8002 can be changed as appropriate in accordance with the size of the touch panel 8004 and the display panel 8006.

The touch panel 8004 can be a resistive touch panel or a capacitive touch panel and can overlap the display panel 8006. A counter substrate (sealing substrate) of the display panel 8006 can have a touch panel function. Alternatively, a photosensor may be provided in each pixel of the display panel 8006 so that an optical touch panel is obtained. Further alternatively, an electrode for a touch sensor may be provided in each pixel of the display panel 8006 so that a capacitive touch panel is obtained. In such cases, the touch panel 8004 can be omitted.

The frame 8009 protects the display panel 8006 and functions as an electromagnetic shield for blocking electromagnetic waves generated by the operation of the printed circuit board 8010. The frame 8009 may also function as a radiator plate.

The printed circuit board 8010 is provided with a power supply circuit and a signal processing circuit for outputting a video signal and a clock signal. As a power source for supplying power to the power supply circuit, an external commercial power source or a separate power source using the battery 8011 may be used. The battery 8011 can be omitted in the case of using a commercial power source.

The display module 8000 may be additionally provided with a polarizing plate, a retardation plate, a prism sheet, or the like.

<Application Examples of Display Module to Electronic Device>

Next, an electronic device using the above display module for a display panel will be described. Examples of the electronic device include a computer, a portable information appliance (including a mobile phone, a portable game machine, and an audio reproducing device), electronic paper, a television device (also referred to as television or television receiver), and a digital video camera.

Figure 38A:
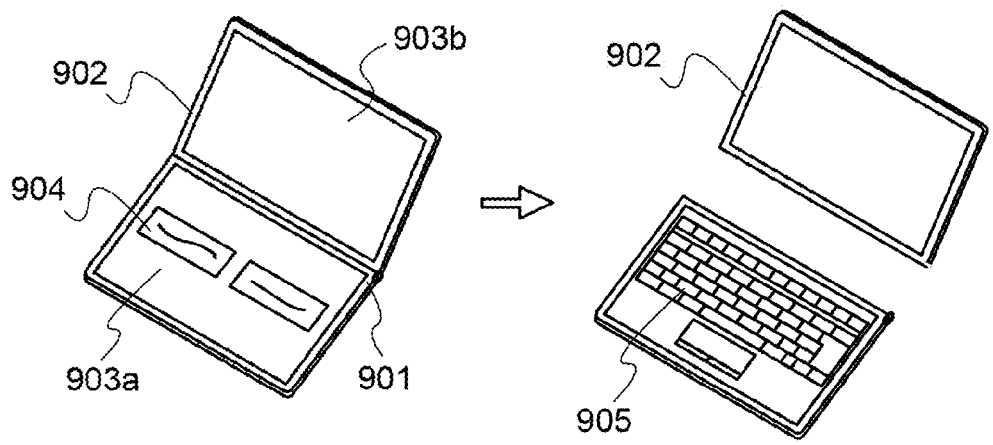
FIGS. 38A to 38E each illustrate an example of an electronic device.

FIG. 38A illustrates a portable information appliance that includes a housing 901, a housing 902, a first display portion 903a, a second display portion 903b, and the like. At least one of the housings 901 and 902 is provided with the display module including the semiconductor device of the foregoing embodiment. It is thus possible to obtain a portable information appliance with a smaller circuit area.

The first display portion 903a is a panel having a touch input function, and for example, as illustrated in the left of FIG. 38A, which of "touch input" and "keyboard input" is performed can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 38A. Thus, letters can be input quickly by keyboard input as in a conventional information appliance, for example.

One of the first display portion 903a and the second display portion 903b can be detached from the portable information appliance as shown in the right of FIG. 38A. Providing the second display portion 903b with a touch input function makes the information appliance convenient because a weight to carry around can be further reduced and the information appliance can operate with one hand while the other hand supports the housing 902.

The portable information appliance in FIG. 38A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. An external connection terminal (e.g., an earphone terminal or a USB terminal), a recording medium insertion portion, and the like may be provided on the back surface or the side surface of the housing.

The portable information appliance illustrated in FIG. 38A may transmit and receive data wirelessly. Through wireless communication, desired book data or the like can be purchased and downloaded from an electronic book server.

Furthermore, the housing 902 in FIG. 38A may be equipped with an antenna, a microphone function, and/or a wireless communication function so that the information appliance can be used as a mobile phone.

Figure 38B:
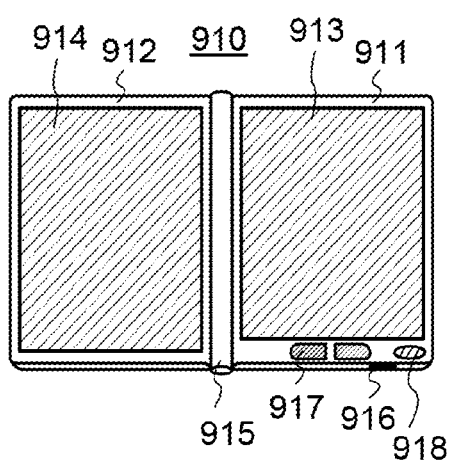

FIG. 38B illustrates an e-book reader 910 including electronic paper. The e-book reader 910 includes two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The display module including the semiconductor device of the foregoing embodiment is provided in at least one of the housings 911 and 912. It is thus possible to obtain an e-book reader with a smaller circuit area.

Figure 38C:
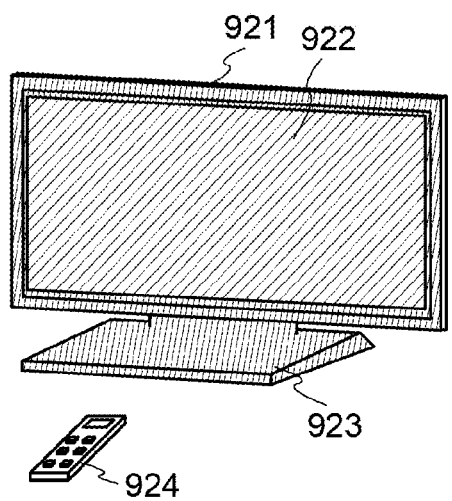

FIG. 38C illustrates a television device including a housing 921, a display portion 922, a stand 923, and the like. The television device can be controlled by a switch of the housing 921 and/or a remote controller 924. The display module including the semiconductor device of the foregoing embodiment is mounted on the housing 921 and the remote controller 924. Consequently, it is possible to obtain a television device with a smaller circuit area.

Figure 38D:
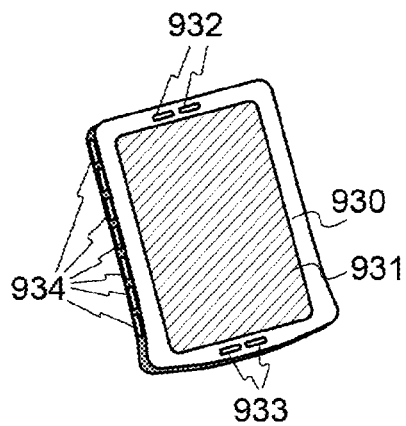

FIG. 38D illustrates a smartphone in which a main body 930 is provided with a display portion 931, a speaker 932, a microphone 933, an operation button 934, and the like. The display module including the semiconductor device of the foregoing embodiment is provided in the main body 930. It is thus possible to obtain a smartphone with a smaller circuit area.

Figure 38E:
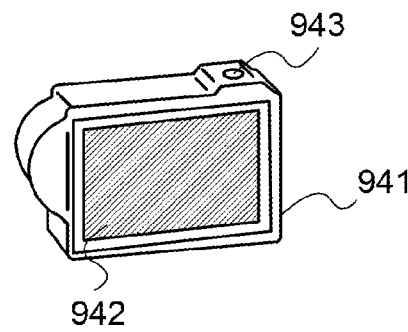

FIG. 38E illustrates a digital camera including a main body 941, a display portion 942, an operation switch 943, and the like. The display module including the semiconductor device of the foregoing embodiment is provided in the main body 941. Thus, it is possible to obtain a digital camera with a smaller circuit area.

As described above, the display module including the semiconductor device of the foregoing embodiment is provided in the electronic device shown in this embodiment. It is thus possible to obtain an electronic device with a smaller circuit area.

(Supplementary Notes on Description in this Specification and the Like)

The following are notes on the description of Embodiments 1 to 4 and the structures in Embodiments 1 to 4.

<Notes on One Embodiment of the Present Invention Described in Embodiments>

One embodiment of the present invention can be constituted by appropriately combining the structure described in an embodiment with any of the structures described in the other embodiments. In the case where a plurality of structure examples are described in one embodiment, any of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with a text in the specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

<Notes on Description for Drawings>

In this specification and the like, terms for explaining arrangement, such as "over" and "under," are used for convenience to indicate a positional relation between components with reference to drawings. The positional relation between components is changed as appropriate in accordance with a direction in which the components are described. Therefore, the terms for explaining arrangement are not limited to those used in the specification and can be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can also mean the case where another component is provided between the insulating layer A and the electrode B.

In a block diagram in this specification and the like, components are functionally classified and shown by blocks that are independent of each other. However, in an actual circuit and the like, such components are sometimes hard to classify functionally, and there is a case where one circuit is associated with a plurality of functions or a case where a plurality of circuits are associated with one function. Therefore, the segmentation of blocks in a block diagram is not limited by any of the components described in the specification and can be differently determined as appropriate depending on the situation.

In the drawings, the size, the layer thickness, or the region is determined arbitrarily for description convenience; therefore, embodiments of the present invention are not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

<Notes on Expressions that can be Rephrased>

In this specification and the like, the terms "one of a source and a drain" (or first electrode or first terminal) and "the other of the source and the drain" (or second electrode or second terminal) are used to describe the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground voltage, for example, "voltage" can be replaced with "potential." A ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, in some cases, the term "conductive film" can be used instead of "conductive layer," and the term "insulating film" can be used instead of "insulating layer."

This specification and the like show a 1T-1C circuit configuration where one pixel has one transistor and one capacitor and a 2T-1C circuit configuration where one pixel has two transistors and one capacitor; however, one embodiment of the present invention is not limited to these. It is possible to employ a circuit configuration where one pixel has three or more transistors and two or more capacitors. Moreover, a variety of circuit configurations can be obtained by formation of an additional wiring.

<Notes on Term Definitions>

The following are definitions of the terms mentioned in the above embodiments.

<<Switch>>

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the "on state" of the transistor refers to a state in which a source and a drain of the transistor are regarded as being electrically short-circuited. The "off state" of the transistor refers to a state in which the source and the drain of the transistor are regarded as being electrically disconnected. In the case where a transistor operates just as a switch, there is no particular limitation on the polarity (conductivity type) of the transistor.

An example of a mechanical switch is a switch formed using a microelectromechanical system (MEMS) technology, such as a digital micromirror device (DMD). Such a switch includes an electrode that can be moved mechanically, and its conduction and non-conduction is controlled with movement of the electrode.

<<Pixel>>

In this specification and the like, one pixel refers to one element whose brightness can be controlled, for example. Therefore, for example, one pixel corresponds to one color element by which brightness is expressed. Accordingly, in a color display device using color elements of red (R), green (G), and blue (B), the smallest unit of an image is formed of three pixels of an R pixel, a G pixel, and a B pixel.

Note that the number of colors for color elements is not limited to three, and more colors may be used. For example, RGBW (W: white) can be employed, or yellow, cyan, or magenta can be added to RGB.

<<Display Element>>

In this specification and the like, a display element includes a display medium whose contrast, luminance, reflectivity, transmittance, or the like is changed by electrical or magnetic effect. Examples of a display element include an electroluminescent (EL) element, an LED chip (e.g., a white LED chip, a red LED chip, a green LED chip, and a blue LED chip), a transistor (a transistor that emits light depending on current), an electron emitter, a display element using a carbon nanotube, a liquid crystal element, electronic ink, an electrowetting element, an electrophoretic element, a plasma display panel (PDP), a display element using microelectromechanical systems (MEMS) (e.g., a grating light valve (GLV), a digital micromirror device (DMD), a digital micro shutter (DMS), Mirasol (registered trademark), an interferometric modulator display (IMOD) element, a MEMS shutter display element, an optical-interference-type MEMS display element, and a piezoelectric ceramic display), and a display element using a quantum dot. An example of a display device including EL elements is an EL display. Examples of a display device including electron emitters are a field emission display (FED) and an SED-type flat panel display (SED: surface-conduction electron-emitter display). Examples of a display device including liquid crystal elements include liquid crystal displays (e.g., a transmissive liquid crystal display, a transflective liquid crystal display, a reflective liquid crystal display, a direct-view liquid crystal display, and a projection liquid crystal display). An example of a display device including electronic ink, electronic liquid powder (registered trademark), or electrophoretic elements is electronic paper. An example of a display device containing quantum dots in each pixel is a quantum dot display. Note that quantum dots may be provided not as display elements but as part of a backlight. The use of quantum dots enables display with high color purity. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes; thus, power consumption can be further reduced. In the case of using an LED chip, graphene or graphite may be provided under an electrode or a nitride semiconductor of the LED chip. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED chip can be formed. Note that an AlN layer may be provided between graphene or graphite and the n-type GaN semiconductor layer including crystals. The GaN semiconductor layers included in the LED chip may be formed by MOCVD. Note that when graphene is provided, the GaN semiconductor layers included in the LED chip can also be formed by a sputtering method. In a display element using MEMS, a drying agent may be provided in a space where the display element is sealed (e.g., a space between an element substrate where the display element is placed and a counter substrate opposite to the element substrate). Providing a drying agent can prevent MEMS and the like from becoming difficult to move and/or deteriorating easily because of moisture or the like.

<<Connection>>

In this specification and the like, when it is described that "A and B are connected to each other," the case where A and B are electrically connected to each other is included in addition to the case where A and B are directly connected to each other. Here, the expression "A and B are electrically connected" means that electric signals can be transmitted and received between A and B when an object having any electric action exists between A and B.

This application is based on Japanese Patent Application serial No. 2016-014992 filed with Japan Patent Office on Jan. 29, 2016, the entire contents of which are hereby incorporated by reference.

What is claimed is:

1. A semiconductor device comprising:
   a digital-analog converter in a first layer comprising a first transistor; and
   a frame memory in a second layer comprising:
      a sample-and-hold circuit comprising a second transistor;
      a correction circuit comprising a third transistor; and
      a source follower circuit comprising a fourth transistor,
   wherein the sample-and-hold circuit is configured to retain an analog voltage output from the digital-analog converter,
   wherein the correction circuit is configured to correct the analog voltage retained in the sample-and-hold circuit,
   wherein the source follower circuit is configured to output the analog voltage,
   wherein the first transistor comprises silicon in a channel formation region,
   wherein each of the second transistor, the third transistor, and the forth transistor comprises an oxide semiconductor in a channel formation region,
   wherein one of a source and a drain of the second transistor and one of a source and a drain of a third transistor are electrically connected to the first transistor through a first wiring, and
   wherein the first wiring is embedded in an opening of an insulating layer.

2. A display panel comprising a display device and the semiconductor device according to claim 1.

3. An electronic device comprising a control unit and the display panel according to claim 2.

4. The semiconductor device according to claim 1, wherein the second transistor, the third transistor, and the fourth transistor are positioned over the first transistor with the insulating layer therebetween.

5. The semiconductor device according to claim 1, wherein the oxide semiconductor layer comprises indium.

6. The semiconductor device according to claim 1, wherein each of the second transistor, the third transistor, and the fourth transistor comprises a backgate.

7. The semiconductor device according to claim 1, wherein the sample-and-hold circuit further comprises a capacitor, wherein one electrode of the capacitor is electrically connected to the other of the source and the drain of the second transistor, and wherein the other electrode of the capacitor is electrically connected to the other of the source and the drain of the third transistor.

8. A semiconductor device comprising:

a digital-analog converter in a first layer comprising a first transistor;

a frame memory in a second layer comprising:
  a sample-and-hold circuit comprising a second transistor;
  a correction circuit comprising a third transistor; and
  a source follower circuit comprising a fourth transistor; and a buffer circuit comprising a fifth transistor, wherein the sample-and-hold circuit is configured to retain an analog voltage output from the digital-analog converter, wherein the correction circuit is configured to correct the analog voltage retained in the sample-and-hold circuit, wherein the source follower circuit is configured to output the analog voltage to the buffer circuit, wherein each of the first transistor and the fifth transistor comprises silicon in a channel formation region, wherein each of the second transistor, the third transistor, and the fourth transistor comprises an oxide semiconductor in a channel formation region, wherein one of a source and a drain of the second transistor and one of a source and a drain of the third transistor are electrically connected to the first transistor through a first wiring, wherein the other of the source and the drain of the third transistor and one of a source and a drain of the fourth transistor are electrically connected to the fifth transistor through a second wiring, and wherein each of the first wiring and the second wiring is embedded in an opening of an insulating layer.

9. A display panel comprising a display device and the semiconductor device according to claim 8.

10. An electronic device comprising a control unit and the display panel according to claim 9.

11. The semiconductor device according to claim 8, wherein the second transistor, the third transistor, and the fourth transistor are positioned over the first transistor and the fifth transistor with the insulating layer therebetween.

12. The semiconductor device according to claim 8, wherein the oxide semiconductor layer comprises indium.

13. The semiconductor device according to claim 8, wherein each of the second transistor, the third transistor, and the fourth transistor comprises a backgate.

14. The semiconductor device according to claim 8, wherein the sample-and-hold circuit further comprises a capacitor, wherein one electrode of the capacitor is electrically connected to the other of the source and the drain of the second transistor, and wherein the other electrode of the capacitor is electrically connected to the other of the source and the drain of the third transistor.

* * * * *